(12) United States Patent
Bhinge

(10) Patent No.: US 8,490,046 B2
(45) Date of Patent: Jul. 16, 2013

(54) MERGING LINE AND CONDITION COVERAGE DATA

(75) Inventor: Amol V. Bhinge, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/593,006

(22) Filed: Aug. 23, 2012

(65) Prior Publication Data

US 2012/0317534 A1    Dec. 13, 2012

Related U.S. Application Data

(63) Continuation-in-part of application No. 12/909,562, filed on Oct. 21, 2010, now Pat. No. 8,255,861, which is a continuation-in-part of application No. 12/603,406, filed on Oct. 21, 2009, now Pat. No. 8,161,449, which is a continuation-in-part of application No. 12/167,958, filed on Jul. 3, 2008, now Pat. No. 7,900,183, which is a continuation-in-part of application No. 11/252,064, filed on Oct. 17, 2005, now Pat. No. 7,409,654.

(51) Int. Cl.
G06F 17/50    (2006.01)

(52) U.S. Cl.
USPC ............................ 716/136; 716/100; 716/106

(58) Field of Classification Search
USPC ......... 716/100, 106, 136; 703/16, 17; 714/33, 714/37, 48
See application file for complete search history.

(56) References Cited

U.S. PATENT DOCUMENTS

| 7,308,658 | B2 |   | 12/2007 | Wood et al. | 716/136 |
| 7,409,654 | B2 | * | 8/2008 | Wood et al. | 716/136 |
| 7,900,183 | B2 |   | 3/2011 | Bhinge | 716/136 |
| 8,161,449 | B2 | * | 4/2012 | Bhinge et al. | 716/136 |
| 8,255,861 | B2 | * | 8/2012 | Bhinge | 716/136 |

* cited by examiner

*Primary Examiner* — Sun Lin
(74) *Attorney, Agent, or Firm* — VanLeeuwen & VanLeeuwen; David Dolezal

(57) ABSTRACT

An approach is provided that receives a correlation data structure from a memory. The correlation data structure indicates a number of expected test event triggers that correspond to a test case that includes a number of test events. The test case is executed by a computer processor, the execution resulting in one or more resultant data structures stored in the memory. The resultant data structures indicate one or more actual test event triggers that occurred during the execution. A base key value is generated corresponding to each of the resultant data structures. A scalar array is searched for the base key values. In response to finding base key values, a counter corresponding to the base key values is incremented. However, if base key values are not found in the scalar array, then the base key values are added to the scalar array and the added entries are initialized.

20 Claims, 35 Drawing Sheets

Sample Correlation Files (e.g., Performance Verification) 3000

Sample Correlation File testcase_one 3010

| Event Name 3020 | Num. Times Hit 3030 |
|---|---|
| Core1.A | 10 |
| Core1.B | 5 |
| Core1.C | 7 |
| Core2.A | 0 |
| Core2.B | 0 |
| Core2.C | 4 |

Sample Correlation File testcase_two 3050

| Event Name 3060 | Num. Times Hit 3070 |
|---|---|
| Core1.A | 0 |
| Core1.B | 0 |
| Core1.C | 3 |
| Core2.A | 2 |
| Core2.B | 0 |
| Core2.C | 0 |

Sample Correlation Files from Autograded Testcase (e.g., Fig. 7) 3075

Sample Correlation File testcase_one 3080

| Event Name 3085 |
|---|
| D |
| E |

Sample Correlation File testcase_two 3090

| Event Name 3095 |
|---|
| A |
| B |
| C |

*FIG. 30*

MERGING LINE AND CONDITION COVERAGE DATA

CROSS-REFERENCE TO RELATED APPLICATION

The present application is a continuation-in-part of U.S. patent application Ser. No. 12/909,562, entitled "Efficient Replaying of Autograded Coverage Regressions and Performance Verification with Directed Testcases," filed Oct. 21, 2010, and issued as U.S. Pat. No. 8,255,861 on Aug. 28, 2012, which is incorporated herein by reference in its entirety. Application No. 12/909,562 is a continuation-in-part of U.S. patent application Ser. No. 12/603,406, entitled " Improving test pattern coverage through parallel discard, flow control, and quality metrics," filed Oct. 21, 2009, and issued as U.S. Pat. No. 8,161,449 on Apr. 17, 2012. Application No. 12/603, 406 is a continuation-in-part of U.S. patent application Ser. No. 12/167,958, entitled "Vendor independent method to merge coverage results for different designs," filed Jul. 3, 2008, and issued as U.S. Pat. No. 7,900,183 on Mar. 1, 2011. U.S. patent application Ser. No. 12/167,958 is a continuation-in-part of U.S. patent application Ser. No. 11/252,064, entitled "Method and Apparatus for Performing Test Pattern Autograding," filed Oct. 17, 2005, which issued as U.S. Pat. No. 7,409,654 on Aug. 8, 2008.

FIELD OF THE INVENTION

The present invention relates generally to the area of automated testing of semiconductor designs. More specifically, the present invention provides a method, computer program product, and apparatus for more efficiently ascertaining which testable events a given set of test patterns generates by merging coverage data.

RELATED ART

Modern electronics is dominated by the development of "very large-scale integrated circuitry" (VLSI). Advances in solid state technology and sub-micron semiconductor manufacturing processes have allowed smaller and smaller components to be fabricated in integrated circuits. This has allowed designs of unprecedented complexity to be fabricated relatively inexpensively. In the communications field, for example, this evolution has resulted in a gradual shift away from special-purpose analog circuitry to special-purpose digital circuitry to general-purpose stored-program processors executing special-purpose software.

While this trend in favor of general-purpose hardware controlled by software has, in many respects, simplified the design process for many complex systems or allowed the design process to become automated, the general-purpose nature of the underlying hardware makes the process of testing the hardware design more complex. General-purpose hardware, by its very nature, must be capable of handling an enormous number of different kinds of instructions and processing states. Moreover, the complexity of the hardware, in terms of the number of logic gates required, is immense, so that it usually impractical for a test engineer to devise test sequences manually (without computer assistance) to provoke desired behavior from the design under test. For this reason, it is common to employ randomly-generated sequences of inputs to the design (i.e., test patterns), then observe which events (out of a set of events to test the operation of) are triggered by which test pattern(s)—that is, which events are covered by the generated test patterns. Events may be as simple as an occurrence of a particular value on a particular signal line or bus, or they may be complex sequential or time-dependent conditions.

Collecting coverage information for a given set of tests can be very useful, primarily for two reasons. First, it allows a test engineer to know which events are not covered by existing test patterns so that additional test patterns can be generated to cover those events. In U.S. Pat. No. 6,859,770 (RAMSEY) Jan. 2, 2005 for example, coverage information is collected regarding a set of test cases for a VLSI logic circuit, and that coverage information is used by a genetic algorithm to generate new tests to cover events not covered by the current set of test patterns.

Second, coverage data can be used to minimize a given set of test patterns so as to eliminate those test patterns that are redundant. Some of the existing automatic systems/methods for performing this task are described in the following U.S. Patent Documents: U.S. Pat. No. 5,771,243 (LEE et al.) Jun. 23, 1998; U.S. Pat. No. 5,844,909 (WAKUI) Dec. 1, 1998; and U.S. Pat. No. 6,766,473 (NOZUYAMA) Jul. 20, 2004.

Vendors of semiconductor design tools typically provide software means of emulating a given design under test, so that a physical prototype need not actually be constructed initially. These vendor tools generally employ proprietary databases to store the coverage of the tests performed, and it is not uncommon for these databases to contain more information than the testing engineer may actually need. Hence, these databases may become rather large. Integrating test data from a number of such databases can be very difficult and, at best, highly inefficient. Also, because of the way these software tools are installed and licensed, it is often necessary for the emulation software, database, and post-processing software to reside on the same computer. Since a significant amount of post-processing is generally needed to determine the coverage of a given set of test sequences, relying on existing vendor tools can create a tremendous bottleneck in terms of both performance and storage requirements.

The problem of determining test sequence coverage is further complicated by the fact that there may exist multiple versions of a given design or multiple designs sharing common components. Test coverage results generated for one version of a design may be relevant to another version of the design, but manually comparing results generated by different versions of the design (or different designs) so as to be able to leverage previous results can be very difficult and labor intensive. Alternatively, discarding previous results and generating an entirely new set of random test patterns for each design may be overly time-consuming to be practical.

BRIEF DESCRIPTION OF THE DRAWINGS

The present invention may be better understood, and its numerous objects, features, and advantages made apparent to those skilled in the art by referencing the accompanying drawings, wherein:

FIG. 30 is a block diagram of sample correlation files used in conjunction with the processing shown in FIG. 29;

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
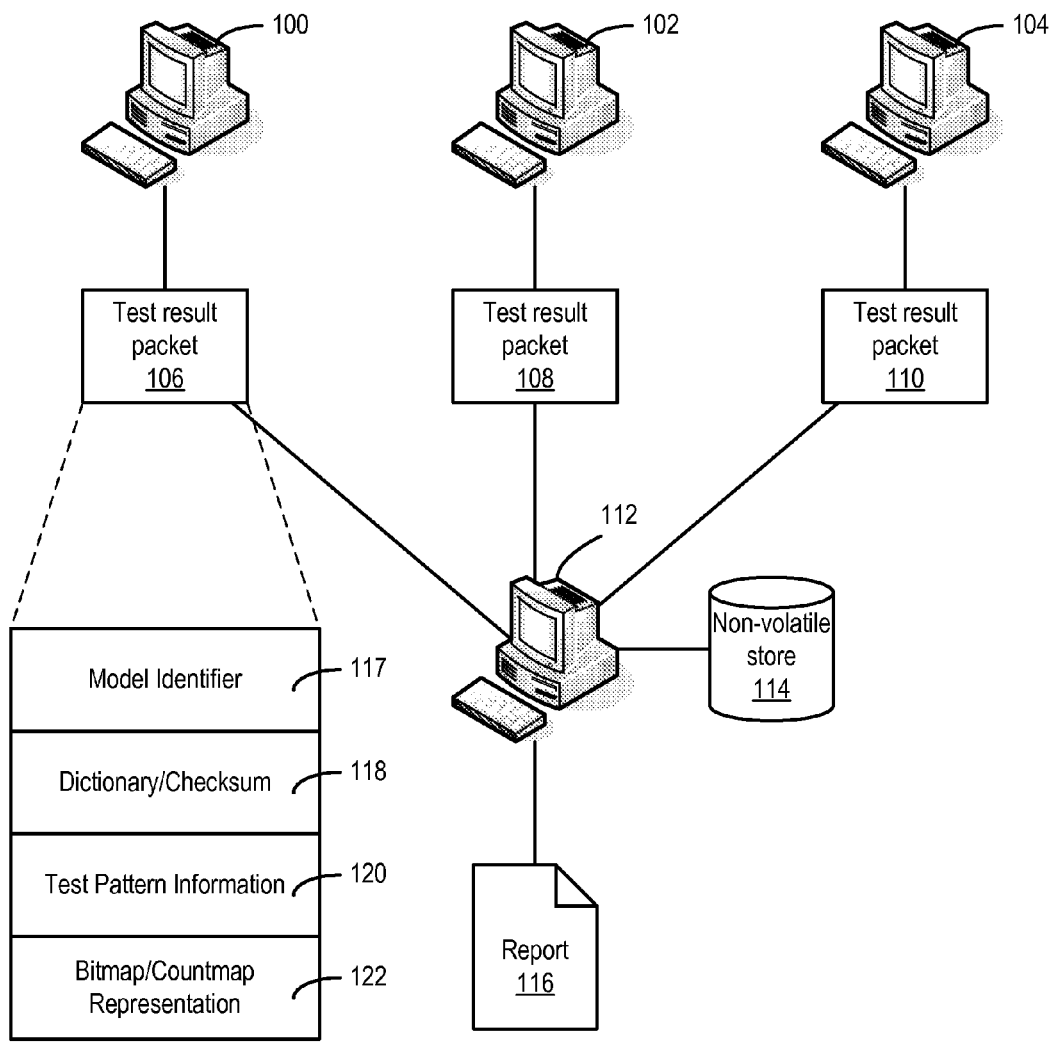
FIG. 1 is a diagram illustrating a distributed computing architecture utilized by a preferred embodiment of the present invention.

FIG. 1 is a diagram illustrating the distributed computing architecture utilized by a preferred embodiment of the present invention for obtaining test coverage information. One or more "frontend" computers (represented here by computers 100, 102, and 104) operate in parallel to generate random test patterns and apply them to the design under test (also referred to as the "model") using appropriate vendor or customer tools created for this purpose. The coverage results of applying each random test pattern are assembled into a packet (packets 106, 108, and 110), which are transmitted to a central "backend" computer 112.

As shown in FIG. 1, each packet includes a number of items of data. A unique model identifier 117 is used to construct a unique location in non-volatile store 114 for the capture of the combined results and report. Dictionary 118, an ordered collection of identifiers corresponding to the different events being monitored for, allows each event to be identified. For a given model, the same events (and hence the same dictionary) will apply to each test pattern. A particular model is uniquely defined by a model name, and another string that is unique by construction. This allows the model to map to a unique location in non-volatile storage. The dictionary can thus be tested for presence using this mapping to determine if a previous test case has been stored against this model. A dictionary is sent if no previous model can be found. More than one test case may be running and simultaneously finding that no test case has been found, and thus multiple dictionaries might be sent. But eventually a test case will be processed and the dictionary of that test case will be saved and the transmission of later test cases will send a checksum instead.

A test case might have a defect in its dictionary due to some miscalculation. If that is the case, the dictionary's checksum will not be correct. If the checksum is not correct, the test case will be rightly rejected for consideration before it is sent.

Another reason a test case might be rejected is that the count for the number of events for a particular test case is negative. If this is the case, then the test case will be rejected and the cumulative results will be reset so that that particular test case will not have changed the cumulative results, nor will the test case be made into a saved test case.

Figure 6:
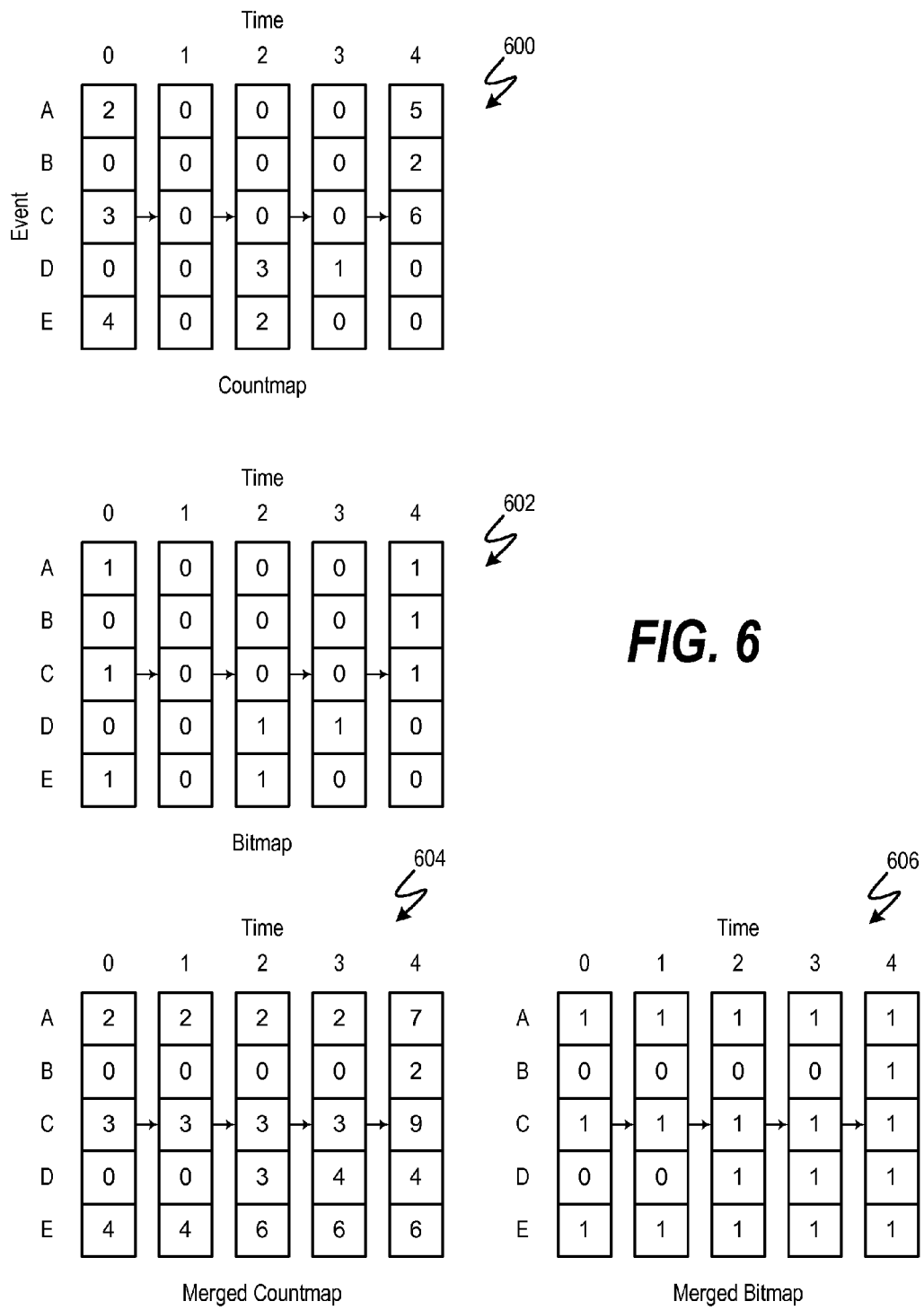
FIG. 6 is a diagram illustrating a bitmap, countmap, merged bitmap, and merged countmap generated by a preferred embodiment of the present invention.

Along with dictionary/checksum 118, a description of a test pattern 120 (including any initial state information needed to reproduce the same results as obtained with that test pattern) is provided. Finally, a "bitmap" and/or "countmap" representation 122 of the coverage results obtained with the test pattern is included. A countmap representation is an ordered list of numerical counts of how many times a given event was triggered by the test pattern associated with that packet. Countmap representation 122 is ordered in the same order as dictionary 118, so that the "nth" count in countmap representation 122 corresponds to the "nth" event listed in dictionary 118. An example sequence of countmap representations received over a particular time period by a backend computer is illustrated by countmap chart 600 in FIG. 6, where the columns of the chart represent individual countmap representations received in sequence and the rows correspond to events, with the ordering of the rows/events in each countmap representation corresponding to the ordering of events defined in the dictionary.

Similar to a countmap representation, a bitmap representation is an ordered list of bits, where the "nth" bit is set to "1" if and only if the "nth" event in the dictionary was triggered by the test pattern. A bitmap representation can therefore be stored more compactly than a countmap (by storing eight different bits in each byte, for example), but it can only store a Boolean representation of whether a given event was triggered by a test pattern, rather than a frequency tally, as in a countmap. A sequence of bitmap representations received over a particular time period by a backend computer is illustrated by bitmap chart 602 in FIG. 6. In a preferred embodiment, the user may choose which representations to generate and transmit to backend computer 112 depending on whether the user wishes to collect frequency data or not.

Backend computer 112 collects the packetized information, combines and analyzes the collected information, and stores its results in non-volatile store 114. These results may be assembled into a human-readable report 116 for use by a test engineer. FIGS. 3-7 describe various ways in which these results may be assembled and/or combined.

Figure 2:
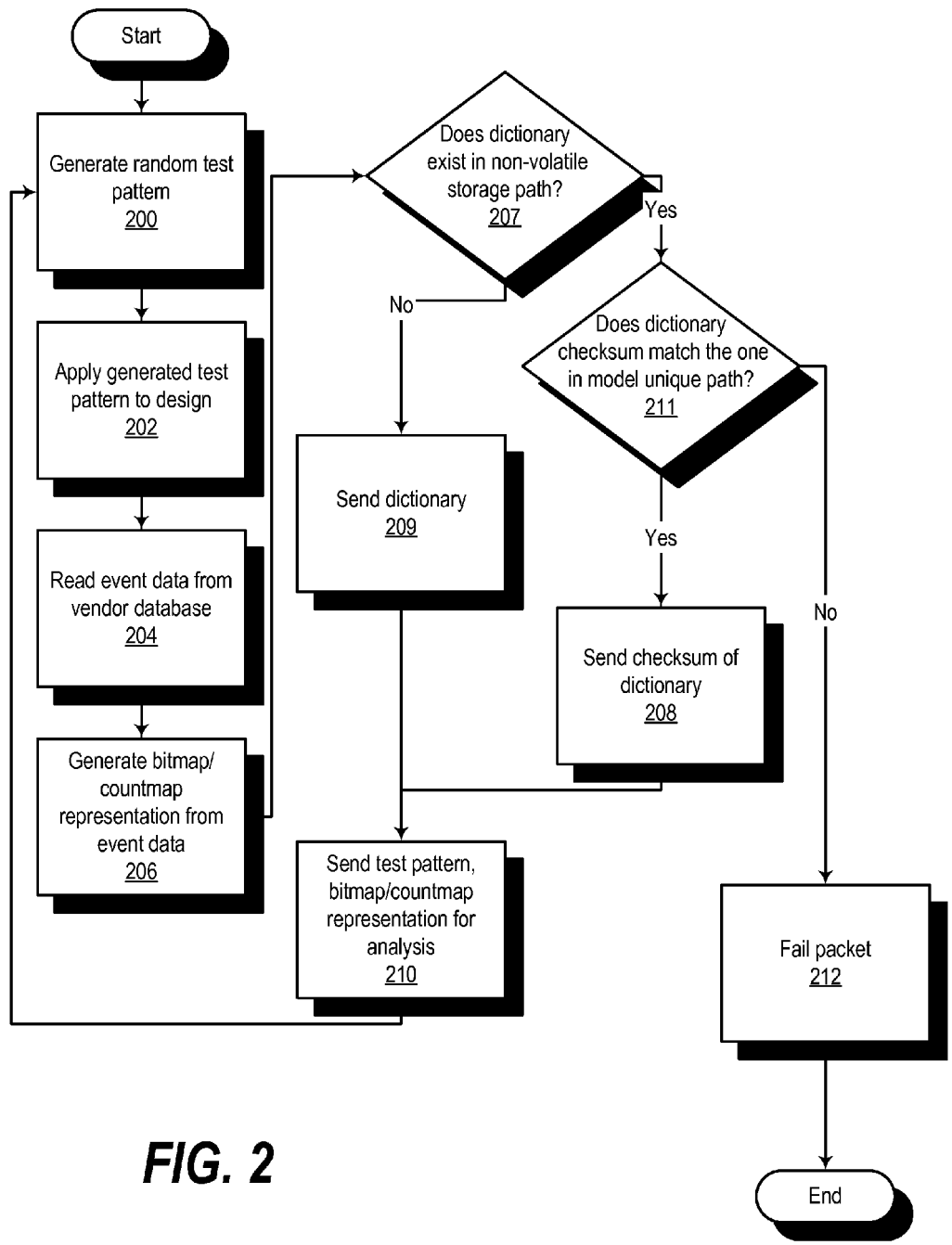
FIG. 2 is a flowchart representation of an overall process of generating test patterns and producing coverage information regarding those test patterns in accordance with a preferred embodiment of the present invention.

FIG. 2 is a flowchart representation of an overall process of generating test patterns and producing coverage information regarding those test patterns in accordance with a preferred embodiment of the present invention.

Test cases are generated from a regression and random test pattern generation. If the test cases are generated by regression, they will be run on all or part of set of tests that are already prepared. If the tests are generated as a random test pattern generation, then an almost unlimited set of tests can be generated to look for the events being accumulated.

The difference between regressions and random test cases is that the generation of a test case is only required for the randomly generated test pattern and an unlimited number of test cases may be generated, whereas the regression needs to run only a finite number of test cases. The means of determining if another test case will be run is dependent on whether the regression is complete, or the results are sufficient. Typically the entire regression may be run, as it has been autograded (had its test cases minimized) to just the test cases that find at least one new event that all the other saved test cases could not find. Random test cases are typically run until a new model is created or the cost of running the test cases does not equal the benefit of seaching for more events.

Turning now to the specific steps described in FIG. 2, a random test pattern (or sequence) is first generated (block 200). This randomly-generated test pattern is then applied to the design under test using appropriate vendor or customer tools for design emulation (block 202). The results of applying the test pattern to the design under test, which indicates the events that were triggered by that test pattern, is then read from the vendor tools' database(s) or customer tools' database(s) (block 204). From those results, bitmap and/or countmap representation(s) of those results are generated (block 206).

Unique model identifier 117 (FIG. 1) is used to construct the location (pathname) of the dictionary, whether or not it exists already. This location is tested for existence (block 207). If it does not exist (i.e., this is the first time to generate/send a test pattern) (block 207:No), then the dictionary is sent to the backend computer (block 209). If the dictionary exists in its corresponding path in non-volatile store 114 (block 207:Yes), however, then a checksum of the dictionary (e.g., in the form of an MD5 or SHA1 hash value) is computed and compared the checksum in the non-volatile storage path (block 211). If the checksums match (block 211:Yes), the checksum of the dictionary is sent to the backend computer (block 208). If not (block 211:No), then packet generation fails (block 212) and the process aborts.

Once either the dictionary or its checksum has been transmitted to the backend computer, the test pattern (and whatever other state information is needed to recreate the results) and the bitmap or countmap representation(s) are then sent to the backend for analysis (block 210) before the process cycles back to block 200 to generate another test pattern. This process continues until a sufficient number of random or regression-generated test patterns have been created.

From a series of countmaps (countmap chart 600) or bitmaps (bitmap chart 602), a merged countmap (merged countmap chart 604) or merged bitmap (merged bitmap chart 606), respectively, may be generated by backend computer 112. Merged countmaps 604 are derived from countmaps 600 by computing a cumulative vector sum of countmaps 600 as they are received. Thus, the merged countmap value at each point in time is the vector sum of all countmaps received up to that point in time. Hence, in FIG. 6, the third column (t=2) of merged countmap chart 604 is the vector sum of the first three columns (t=0 through t=2) of countmap chart 600.

Merged bitmaps (merged bitmap chart 606) combine values cumulatively as in merged countmaps (merged countmap chart 604), except that Boolean values (more specifically, bits) are stored, rather than count values. A merged bitmap is the cumulative bitwise-OR of all bitmaps received up to that point in time. Hence, in FIG. 6, the third column (t=2) of merged bitmap chart 606 is the bitwise-OR of the first three columns (t=0 through t=2) of bitmap chart 602.

Merged bitmap and merged countmap information is useful because it allows one to determine which events were triggered or not triggered by the entire set of test patterns so far generated. This makes it possible for test patterns to be continuously generated until a desired number of events are covered. If the randomly-generated patterns thus obtained fail to cover all events it is desired to cover, the merged countmap or bitmap information can be reported to a test engineer (e.g., report 116 in FIG. 1) so that test patterns covering those events can be manually created. Merged countmap information can additionally provide a test engineer with information about how frequently certain events occur.

Figure 3:
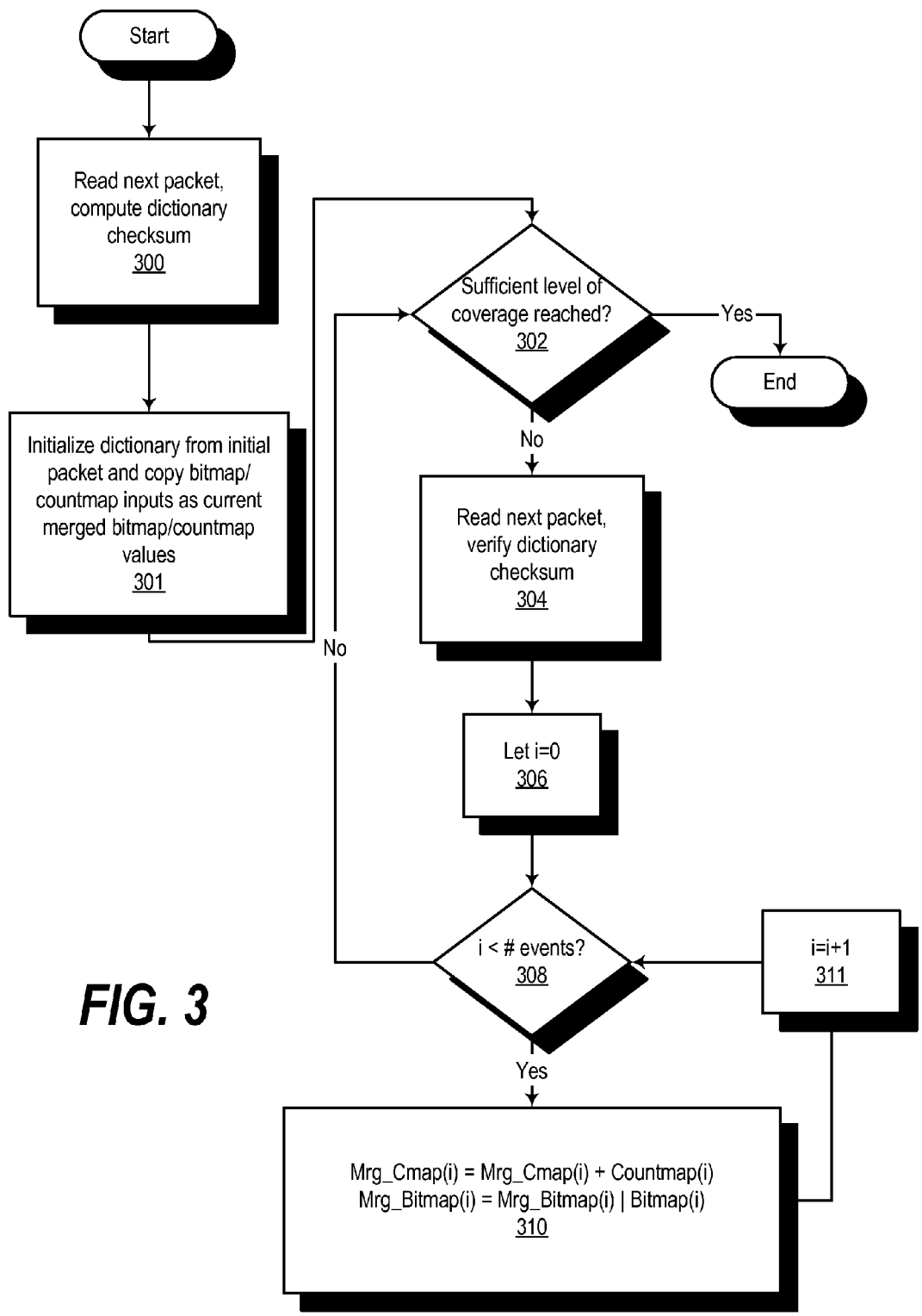
FIG. 3 is a flowchart representation of a process of generating merged countmap and/or merged bitmap data structures in accordance with a preferred embodiment of the present invention.

FIG. 3 is a flowchart representation of a process of generating merged countmap and/or merged bitmap data structures in accordance with a preferred embodiment of the present invention. FIG. 3 begins with the reception of the first packet, for which a checksum is computed (block 300). Next, the backend's representation of the dictionary, merged countmap, and/or merged bitmap are copied from the dictionary, countmap, and bitmap of the first-received packet, respectively (block 301). Next, a determination is made as to whether a sufficient level of coverage has been reached (block 302)—in other words, it is determined whether a desired percentage of the possible events have been covered. This can easily be determined by computing the "norm" of the bitmap, which is defined as the number of one bits present in the bitmap (equivalently, the number of non-zero entries in the countmap). The norm can be divided by the total number of bits in the bitmap (equivalently, the number of entries in the countmap) to construct a coverage percentage. In a preferred embodiment, sufficient coverage has been reached when the coverage percentage reaches a predetermined threshold percentage.

If a sufficient coverage level has not yet been reached (block 302:No), the next packet from a frontend computer is read and its dictionary checksum is verified to ensure a match with an existing dictionary in non-volatile storage (block 304). Then, a loop counter variable "i" is initialized to "0" (block 306). Variable "i" is used to construct a counted ("for") loop over the set of events in the dictionary: if "i" is less than the number of events in the dictionary (block 308:Yes), then the loop body is executed to generate values for the merged countmap and merged bitmap (block 310). Specifically, for the current row (i), referring to the "ith" event (starting from i=0), the value of the merged countmap at that row (i.e., Mrg_CMap(i)) will be the sum of the corresponding value from the currently received countmap and the current value of Mrg_CMap at that location (i.e., Countmap(i)+Mrg_CMap (i)). The value of "i" is then incremented (block 311) and the loop continues (block 308). If "i" is not less than the number of events (block 308:No), the process returns to block 302 to determine if a sufficient level of coverage has been reached (block 302). If a sufficient level of coverage has been reached (block 302:Yes), then the process of FIG. 3 terminates.

The bitmaps or countmaps received by the backend computer may also be used to perform "autograding" of the test coverage results. "Autograding" is a method of minimizing the number of test patterns needed to cover all of the events (or at least all of the events covered by existing test patterns). This problem of minimizing the number of test sequences needed to obtain coverage of all coverable events is an instance of the "MINIMUM COVER" problem in Computer Science, which is known to be NP-Complete (see M. R. GAREY & D. S. JOHNSON, *Computers and Intractability: A Guide to the Theory of NP-Completeness*, New York: W.H. Freeman & Co., 1979, p. 222.) In a nutshell, this means that there is no known way to construct an algorithm that is guaranteed to produce an optimal solution to the problem in polynomial time. Nonetheless, problems such as MINIMUM COVER can often be solved in practice, if one is willing to accept a solution that may not be the absolute optimal solution. This approach is generally referred to as using an "approximation algorithm."

A preferred embodiment of the present invention applies such an approximation algorithm to the problem of minimizing the number of test sequences needed to obtain complete coverage. Thus, by "minimize," it is meant only that the number of test sequences is reduced, since the solutions so obtained may not be the absolute optimal solution. For practical purposes, however, the solutions obtained by the algorithm employed in a preferred embodiment of the present invention will be more than adequate. This approximation algorithm runs in time O(mn), where "m" is the original number of test sequences and "n" is the number of triggerable events.

Figure 7:
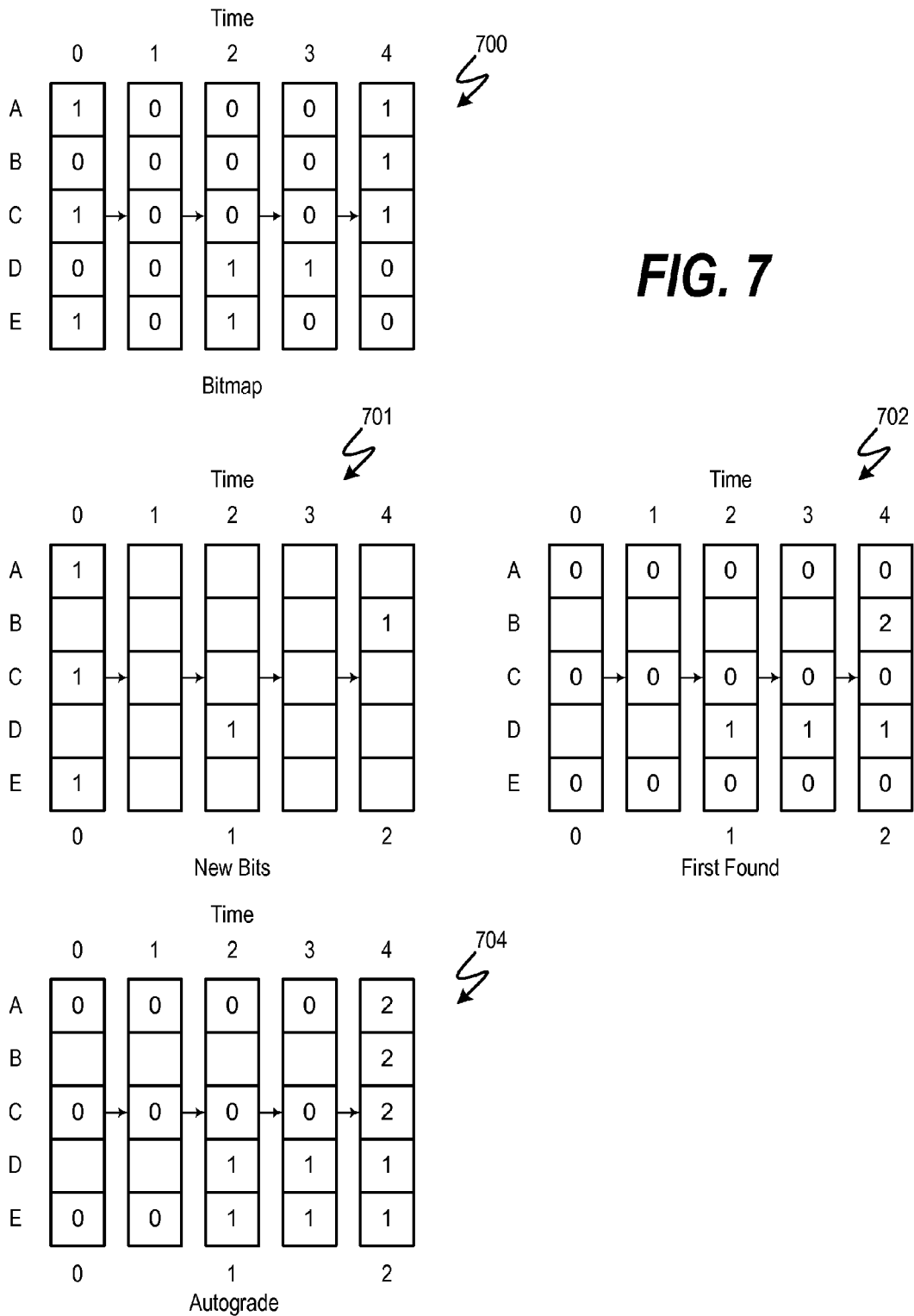
FIG. 7 is a diagram illustrating data structures generated in a process of autograding a set of test sequences in accordance with a preferred embodiment of the present invention

FIG. 7 illustrates the various data structures employed in autograding a set of test sequences in accordance with a preferred embodiment of the present invention. From each of a series of bitmap or countmap test pattern results (bitmap chart 700 in FIG. 7), "new bits" and "first found" vectors (corresponding columns in new bits chart 701 and first found chart 702, respectively) are generated. The entries in new bits vectors (chart 701) are bits that represent events that were first triggered by the test pattern corresponding to a particular column (as received in sequence). Those entries that are empty in chart 701 (and charts 702 and 704, as well) are undefined (e.g., "undef" in the Perl programming language). For example, in FIG. 7, new bits chart 702 shows that event D is first triggered by the test pattern received at time 2, since there is a "1" entry in row D, column 2.

The first found vectors (chart 702) contain analogous entries to the new bits vectors (chart 701), except that instead of marking each newly covered event with a bit, the entries in each first found vector correspond to a renaming of the test sequences that triggered events not already triggered by previous test sequences. Thus, in first found chart 702, the test patterns received at times t=0, t=2, and t=4 are renamed saved test case numbers 0, 1, and 2, respectively, under this scheme. The purpose of the renaming is to keep the index of the saved test case number to a number less than or equal to the number of events overall, thus 2 raised to the power of 32 test cases still fit in one unsigned integer, even if the actual number of test cases processed far exceeds that, and similarly, if a 16 bit number is being used to store the index because the number of test cases is less than 2 raised to the 16, the index will still fit, even if 2 to the 20 testcases are actually processed to find those events. It is expected that only a relatively small percentage of test cases will yield new events, so this renaming is useful to keep the data structures small.

Thus, in the example provided in FIG. 7, the entries for events A, C, and E at time t=0 are marked with "0, " the entry for event D at time t=2 is marked with a "1, " and so on. First found vectors (chart 702) can thus be used to reduce the number of test patterns needed by eliminating those test patterns that do not yield new events—i.e., those test patterns for which there are no entries in its new bits vector (such as with the test cases 1 and 3 in FIG. 7).

The autograde vector (chart 704) represents the results of applying "autograding" to further minimize the number of test patterns required. Under the autograding procedure employed by a preferred embodiment of the present invention, each time a test pattern that yields new events is discovered, that test pattern is recorded in the autograde vector (chart 704) not only as the test pattern that yielded those new events (as in first found vectors 702), but also as the designated triggering test pattern for all other events triggered by that test pattern.

Thus, in FIG. 7, the autograde vector (chart 704), at time t=0, records events A, C, and E as being triggered by test pattern 0, but then at t=2 labels both events D and E as being triggered by test pattern 2 (which has been renamed test sequence 1 in the first found vector (chart 702)). Likewise, at time t=4, events A, B, and C are labeled as being triggered by test pattern 4 (renamed test sequence 2), since A, B, and C are all triggered by that test pattern.

The end result of this autograding is a further reduction in the number of test patterns required over those identified by the first found vectors (chart 702). As shown at t=4 in chart 704, the entire set of covered events may be triggered using only test patterns 2 and 4 (renamed test sequences 1 and 2, respectively). Hence, only these two test patterns need be retained for subsequent use.

The autograde vector (chart 704) and the first found vectors (chart 702) are useful not only for reducing the number of test sequences that must be utilized to obtain full event coverage, but they are helpful analytical tools in their own right. For example, a test engineer wishing to devise a test sequence that triggers an as-yet non-covered event can look to the autograde vector (chart 704) and first found vectors 702 to see which test sequences triggered related events and to determine what aspects of those test sequences, as compared to other test sequences that did not trigger those events, appear to cause those events to be triggered. From this information, a test engineer can modify existing test sequences or derive new test sequences that trigger other non-covered events related to those events already covered.

Figure 4:
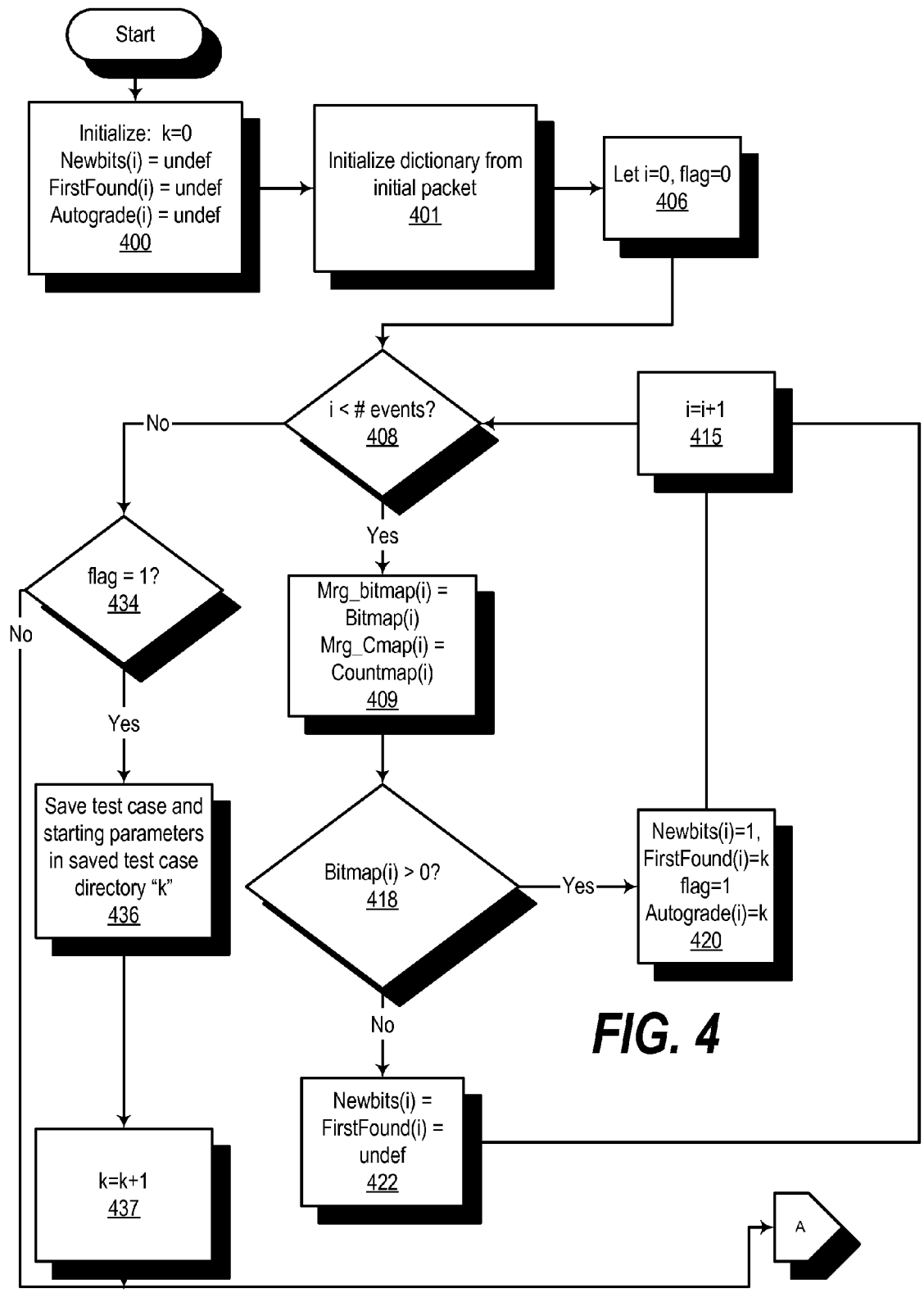
FIGS. 4 and 5 together provide a flowchart representation of a process of performing autograding on a set of test sequences to obtain a minimized set of a covering test sequences in accordance with a preferred embodiment of the present invention.
Figure 5:
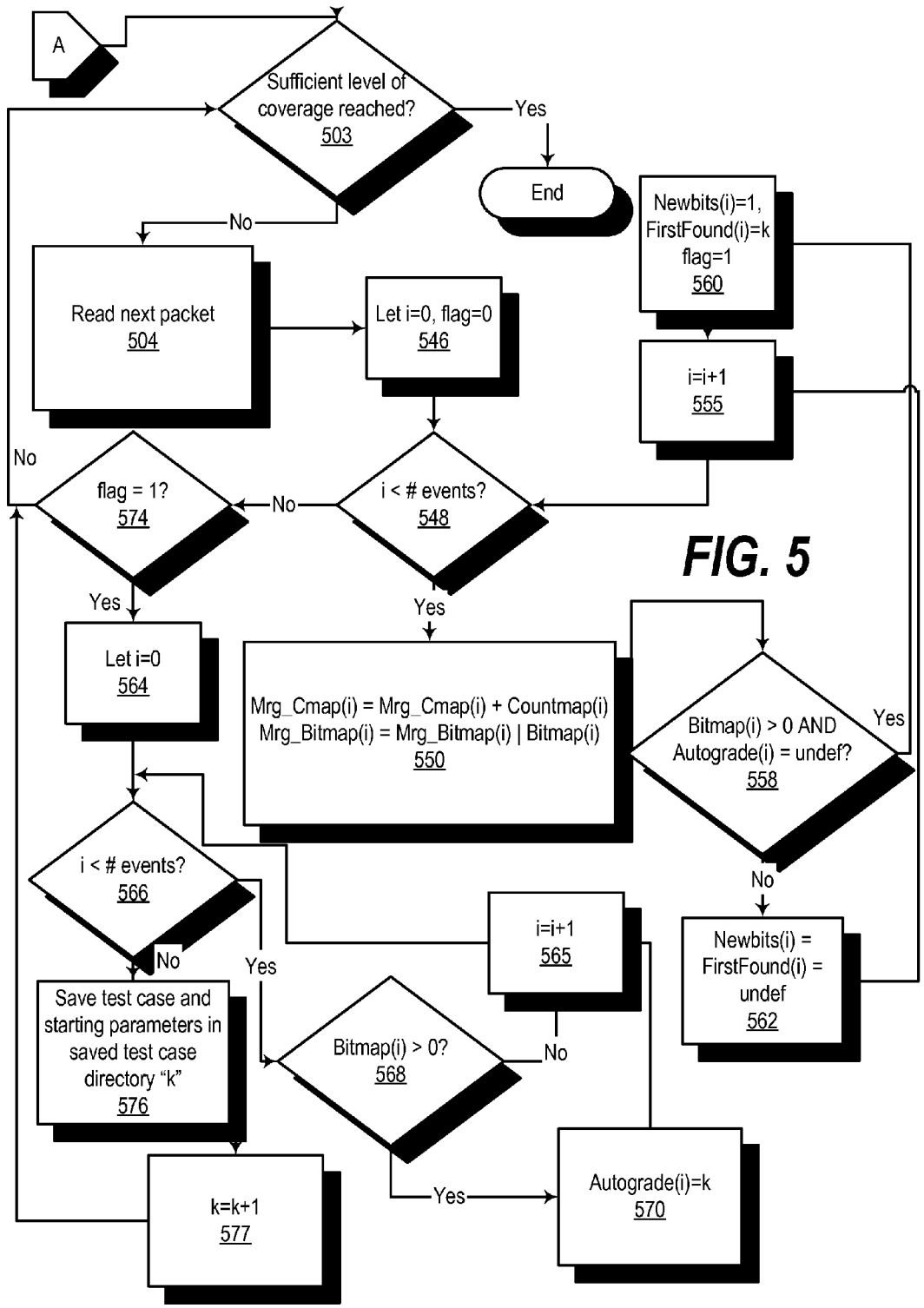

FIGS. 4 and 5 are together a flowchart representation of a process of performing autograding on bitmap representations (or alternatively on countmap representations) of coverage data along with generating a merged bitmap and/or merged countmap in accordance with a preferred embodiment of the present invention. First, a relabeling counter "k" is initialized to zero and the "Newbits," "FirstFound," and "Autograde" data structures are set to a value of "undefined" (block 400). As a convention in FIGS. 4 and 5, the value "undef" is used to denote "undefined" as is the case in the Perl programming language. Then, the backend's representation of the dictionary is copied from the dictionary contained in the first-received packet (block 401). Next, a loop counter variable "i" is initialized to zero and a Boolean flag, "flag," is set to false (or zero, in languages such as C and Perl, which encode Booleans as integers) (block 406).

At block 408 a "for" loop is defined. If "i" is less than the total number of events in the dictionary (block 408:Yes), then the values of Bitmap(i) and Countmap(i) are copied into merged bitmap entry Mrg_bitmap(i) and merged bitmap entry Mrg_Cmap(i), respectively (block 409). A determination is made as to whether the current bitmap (i.e., that received from the most recently received packet) yields the "ith" event for the first time (block 418). Specifically, if Bitmap(i) >0 (meaning that event "i" is triggered by the current test pattern) (block 418:Yes), Newbits(i) is set to 1, FirstFound(i) is set to the value of "k" (with "k" being the next name to be used in renaming the test sequences), "flag" is set to 1 (true) to indicate that the current test sequence yields new events (new bits), and Autograde(i) is set to the value of "k" (block 420). If event "i" was not triggered by the current test pattern (block 418:No), Newbits(i) and FirstFound(i) are set to undef (block 422). This loop continues its "new bits" determination by incrementing "i" (block 415) and retesting the loop condition at block 408.

Following the termination of this first loop (block 408:No), "flag" is then tested for truth (block 434). If "flag" reads true (block 434:Yes), then starting parameters and whatever test pattern information needed to recreate the same results is then recorded (for subsequent use) (block 436). Preferably, this test pattern and state information will be stored in some kind of indexed arrangement, such as in a file that is located in a directory that has a name based on the label ("k") of the current test pattern. For example, a test pattern labeled "104" could be stored in a hierarchical directory "00/00/01/04" (creating a multi-level directory structure based on groups of digits, in this way, enhances the efficiency of locating a given test pattern). After the test pattern information is stored, "k" is incremented (block 437). The maximum number of the digits in k can be computed from the decimal representation of the number of digits in the size of the dictionary. Since the dictionary is fixed by the first testcase, this maximal number of digits can be determined at the time of the first testcase being processed.

Following block 437, or if "flag" was false at block 434, execution proceeds to block 503, where a determination is made as to whether a sufficient level of coverage has been reached (as discussed above in connection with the calculation of "norm" and "coverage percentage"). If a sufficient coverage level has not yet been reached (block 503:No), the next packet from a frontend computer is read (block 504). Next, a loop counter variable "i" is initialized to zero and a Boolean flag, "flag," is set to false/zero(block 546).

At block 548 a for loop is defined. If "i" is less than the total number of events in the dictionary (block 408:Yes), then the loop body is executed to generate values for the merged countmap and merged bitmap (block 550). Specifically, for the current row (i), referring to the "ith" event (starting from i=0), the value of the merged countmap at that row (i.e., Mrg CMap(i)) will be the sum of the corresponding value from the currently received countmap and the current value of Mrg_C-Map at that location (i.e., Countmap(i)+Mrg_CMap(i)). Next, a determination is made as to whether the current bitmap (i.e., that received from the most recently received packet) yields the "ith" event for the first time (block 558). Specifically, if Bitmap(i) >0 (meaning that event "i" is triggered by the current test pattern) and Autograde(i)=undef, meaning that no previously considered test sequence has triggered that event (block 558:Yes), then Newbits(i) is set to 1 and FirstFound(i) is set to the value of "k" (with "k" being the next name to be used in renaming the test sequences from their original sequence number "j" to a saved test case number "k") and "flag" is set to 1 (true) to indicate that the current test sequence yields new events (new bits) (block 560). If not (block 558:No), Newbits(i) and FirstFound(i) are set to undef (block 562). This loop continues by incrementing "i" (block 555) and retesting the loop condition at block 548.

Following the termination of this first loop (block 548:No), "flag" is then tested for truth (block 574). If "flag" reads true (block 574:Yes), setup for a second loop is made at block 564 by re-initializing the loop counter "i" to zero. The second loop is started at block 566 to modify the Autograde vector. If "i" is less than the number of events (block 576:Yes), the loop body is executed and a determination is made as to whether to record the current test sequence at the current location in the Autograde data structure (block 568). Specifically, if Bitmap (i) >0 (meaning that the current test pattern triggered event "i") (block 568:Yes), then Autograde(i) is set to the value of "k" (block 570). If not (block 568:No), then the value of Autograde for the current row remains the same. The loop counter variable "i" is then incremented (block 565) and the loop condition retested at block 566.

Following the termination of this second loop, the saved testcase number is set to the value "k" to denote that test sequence "j," which corresponds to "time" in diagram 701 in FIG. 7, has been renamed "k" as in the example provided FIG. 7, and state information and test pattern information needed to recreate the same results is then recorded (for subsequent use) (block 576). Then "k" is incremented (block 577).

Following block 577 or if "flag" was false (block 574:No), the process returns to block 503 to determine if a sufficient level of coverage has been reached. If a sufficient level of coverage has been reached (block 503:Yes), then the process of FIGS. 4-5 terminates.

As mentioned above, in some instances, test coverage results achieved with respect to one design/model may be of value to another design/model. For example, an engineer may originally write one hundred coverage events, build a model with those events and collect coverage using the methods described above. Then, the engineer might add several more events and build another model including these new events. Because the two models represent the same overall design (for a circuit, machine, computer program, etc.), it would be useful to be able view coverage results for these two models together without actually combining the models themselves and generating all new test patterns to replace those generated for the first model.

There are other scenarios where the ability to merge coverage results from different models would be beneficial. For example, an engineer may realize that some of the coverage events in a model are impossible and then build a new model where these impossible events commented out. In that case, it would be beneficial to merge the coverage results for a new model with the original set of results obtained using the original model.

In some cases, the actual underlying designs being tested by different models may differ, but nonetheless be related enough so that testcases developed for one design will trigger the same events on another design. An example of this would be single-core and multi-core versions of a microprocessor. If testcases are separately generated for each design, it would be beneficial to be able to combine the coverage results to see if the combined set of testcases would completely cover all desired events, since each separately generated testcase set may by itself only cover a subset of the desired events.

Yet another practical application for combining test coverage results is in a verification environment where verification is performed on a unit-level as well as a global level. Unit verification models can have all coverage events coded by unit verification engineers. Each of these models may contain thousands of events. At the chip level, a model with only a few selected events from every unit is normally used. However, it would be useful to report merged coverage results for the unit-level models and chip-level model so as to report the overall coverage for the chip.

Figure 8:
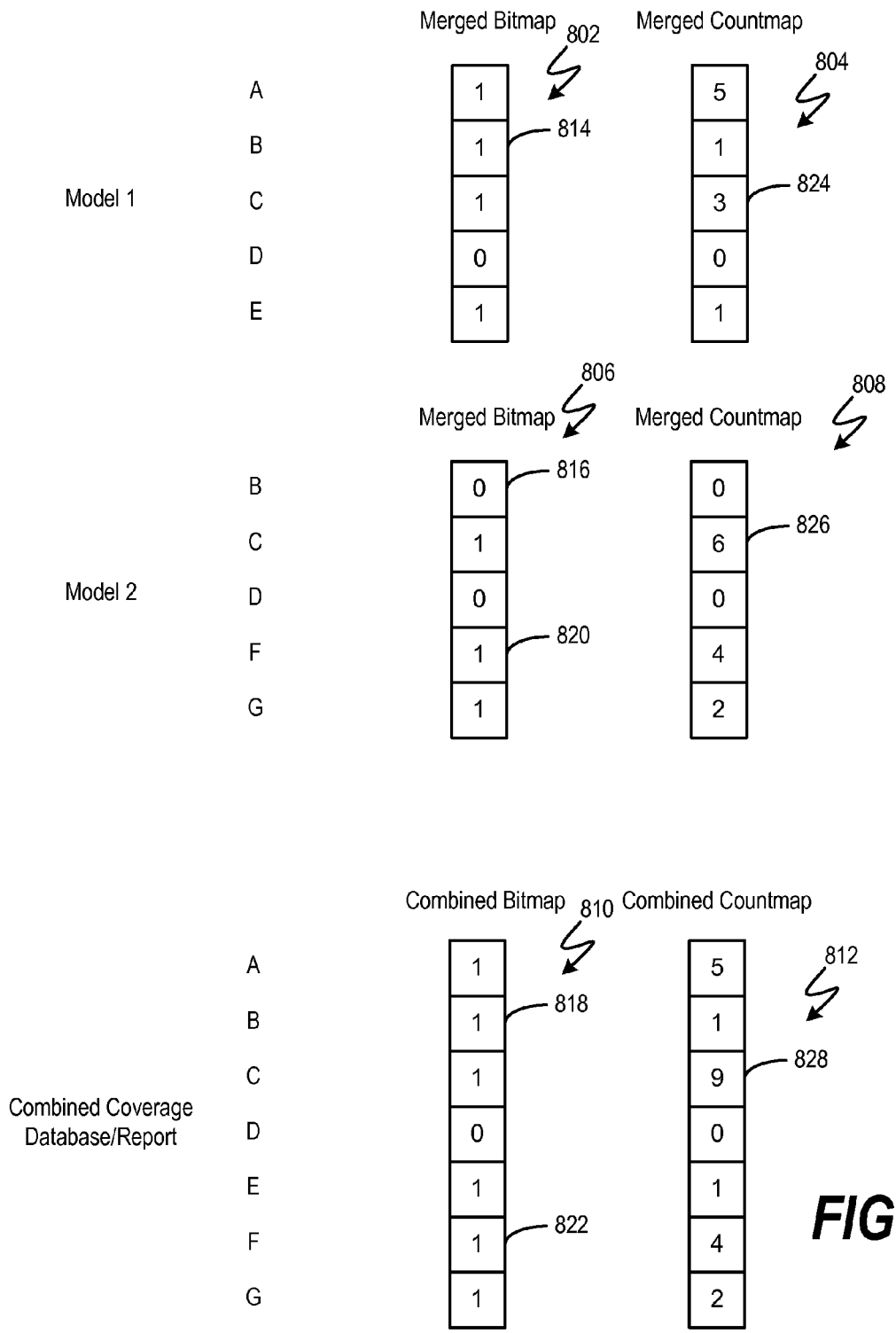
FIG. 8 is a diagram illustrating data structures generated in a process of producing a combined test coverage report across a plurality of designs in accordance with a preferred embodiment of the present invention.

This combined coverage reporting is achieved in a preferred embodiment of the present invention by combining of the bitmap and countmap coverage in the manner shown in FIG. 8. In FIG. 8, merged bitmap and merged countmap data structures are shown for two different models. Merged bitmap 802 and merged countmap 804 correspond to a first model ("Model 1"), while merged bitmap 806 and merged countmap 808 correspond to a second model ("Model 2"). For Model 1, test coverage results for events "A," "B," "C," "D," and "E" have been collected, while for Model 2, test coverage results for events "B," "C," "D," "F," and "G" have been collected.

From these two sets of results, a combined report containing merged bitmap 810 and merged countmap 812 is generated. Merged bitmap 810 and merged countmap 812 contain coverage information for the events pertaining to both models (i.e., the set-wise union of events from the two models). Merged bitmap 810 is obtained by performing a logical-or of results from bitmaps 802 and 806 pertaining to the same events. For example, since value 814 in bitmap 802 and value 816 in bitmap 806 both correspond to the same event (event "B"), the combined report bitmap entry 818 in bitmap 810 reads "1, " which is the logical-or of the value 814 and 816. Events that do not pertain to a particular model are considered to have a bitmap value of zero for this purpose "0. " Hence, bitmap value 822 in bitmap 810 (corresponding to event "F") is the logical-or of value 820 (from bitmap 806) and an implied value of "0" from bitmap 802, since event "F" does not pertain to "Model 1." Similarly, merged countmap 812 is generated by adding corresponding countmap values for events. Thus, countmap value 828 (corresponding to event "C") in bitmap 812 (value of 9) is the sum of values 824 and 826 (3 and 6, respectively).

Figure 9:
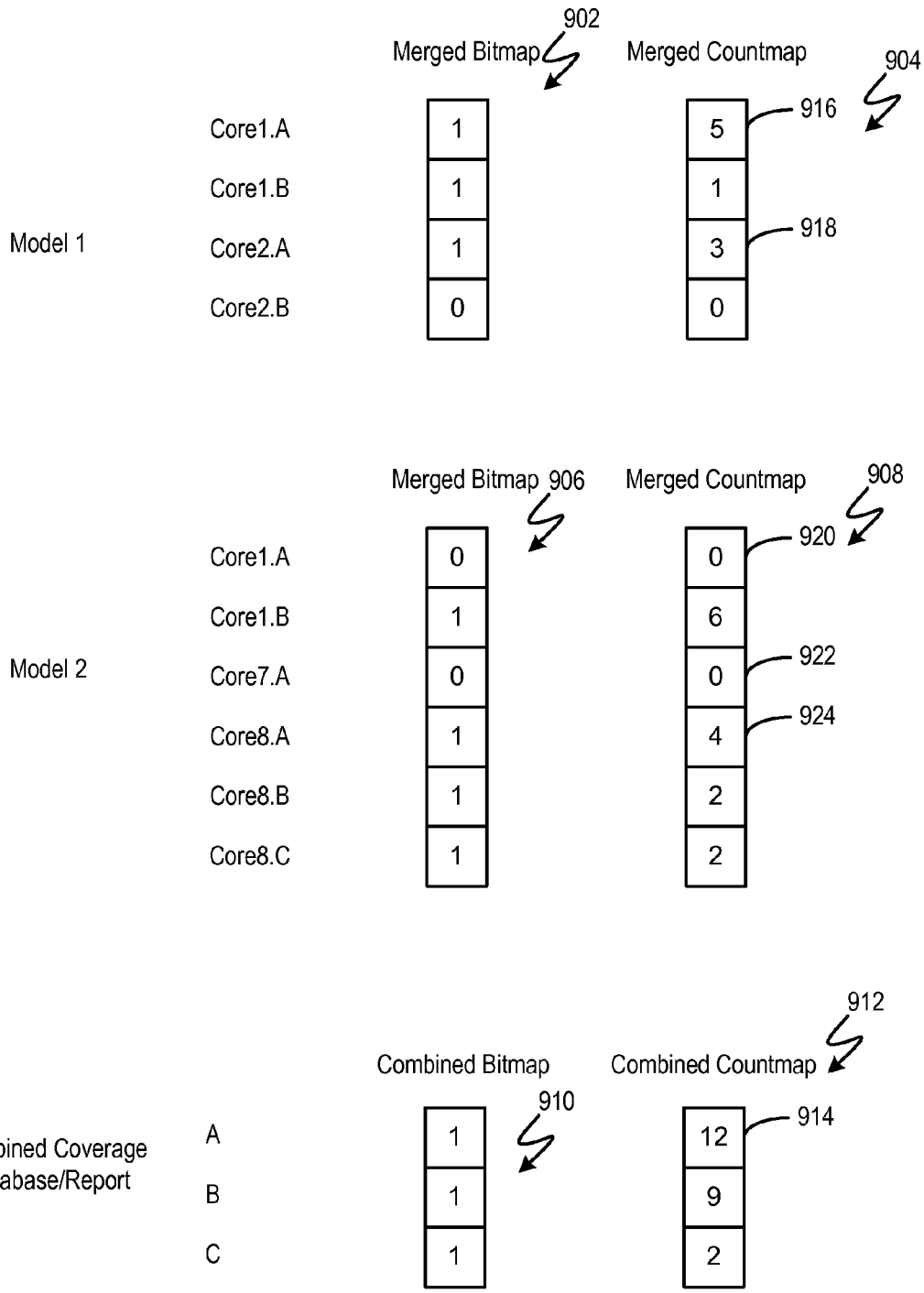
FIG. 9 is a diagram illustrating data structures generated in a process of producing a combined test coverage report across a plurality of designs having multiple instances of particular components in accordance with a preferred embodiment of the present invention.

An additional refinement of the method describe in FIG. 8 is illustrated in FIG. 9. As suggested above, a given design may contain multiple instances of a given component. For example, a multi-core processor contains multiple instances of a single processor core. In such cases, triggering an event on one of the instances may be sufficient to verify the design of all of the instances. Thus, a further consolidation of results between component instances may be beneficial.

In FIG. 9, bitmap 902 and countmap 904 correspond to "Model 1," a dual-core processor in which events "A" and "B" are detectable in both cores. Thus, in the dictionary of events corresponding to "Model 1," there are actually four events, "Core1.A," "Core1.B," "Core2.A," and "Core2.B," each of which corresponds to a particular type of event occurring in one of the two cores—thus, each event name contains a hierarchical instance component and a base-name component. Similarly, bitmap 906 and countmap 908 correspond to "Model 2," a multi-core processor in which events "A," "B," and "C" are detectable in a subset of the cores. Combined coverage information is generated in the form of bitmap 910 and countmap 912, which contain entries corresponding only to the base event types, "A," "B," and "C." Bitmap 910 and countmap 912 are formed by performing the logical-or operation or addition operation, respectively, over all bitmap/countmap entries for a given base event type. For example, value 914 in countmap 912 (value of 12) is the sum of values 916, 918, 920, 922, and 924 (each of which corresponds to the same base event type "A," albeit in different models and different subcomponents (in this case, processor cores) in those models. Bitmap 910 is generated similarly, except that the logical-or operation is used to combine bitmap entries, rather than addition, as was used for combining countmap entries.

The combined reporting information obtained through the processes described in FIGS. 8 and 9 can be used to generate a plain-text report for subsequent engineering use, as with the results obtainable in the single-model case.

In a preferred embodiment of the present invention, additional options for defining the manner in which test coverage results are combined may be specified. In FIG. 8, for instance, the combined coverage results included entries for each event in the set-wise union of events across the plurality of models (i.e., since the set of events associated with Model 1 was {A, B, C, D, E} and the set of events associated with Model 2 was {B, C, D, F, G}, the combined coverage database contained entries for the union of these two sets, namely, {A, B, C, D, E, F, G}). In a preferred embodiment of the present invention, the combined coverage results may alternatively be assembled over the set-wise intersection of events instead (i.e., where the combined coverage database contains entries for only those events that pertain to all of the models from which coverage results were combined). Alternatively, one of the models may be designated as a "base model" and the combined coverage results assembled so that only events that pertain to the base model have entries in the combined coverage database. This last option may be especially useful in a case where there exists a "global model" or "chip-level model" that shares a number of events with individual unit-level models, since it allows coverage results from unit-model testcases that happen to refer to events also pertaining to the global model to be combined with the global model coverage results without having to report coverage results for all unit-level events.

Figure 10:
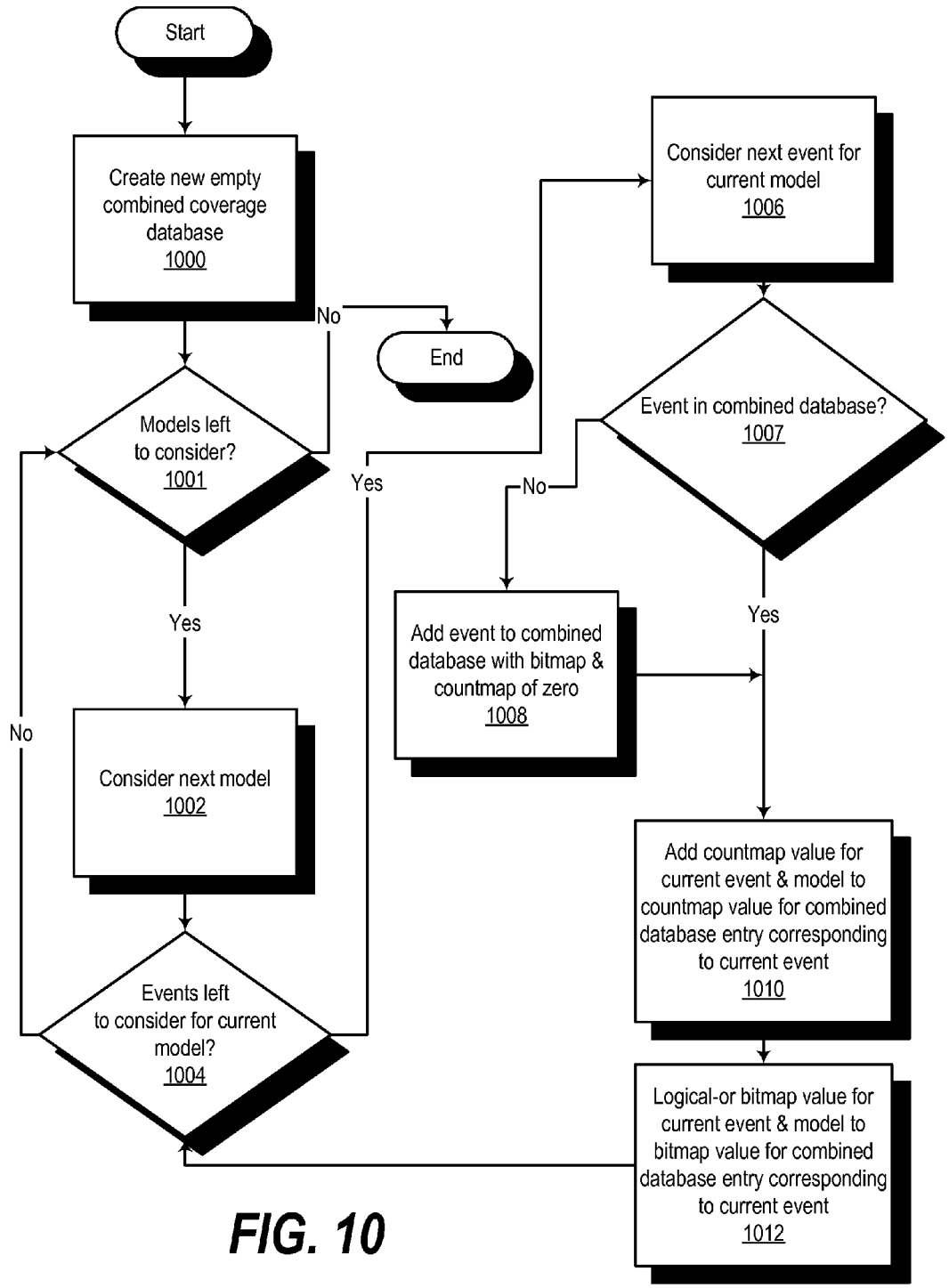
FIG. 10 is a flowchart representation of process of producing a combined test coverage report across a plurality of designs in accordance with a preferred embodiment of the present invention

FIG. 10 is a flowchart representation of a process of merging test coverage information in accordance with a preferred embodiment of the present invention. The process begins with the creation of a new empty test coverage database to refer to the combined test coverage information from multiple models, the empty coverage database containing an event dictionary, bitmap, and countmap data structures as in FIGS. 8 and 9 (block 1000). If there are models whose test coverage results have yet to be merged into the combined report (block 1001:Yes), execution proceeds to block 1002, where the next model is selected for consideration. If there are events for the current model left to be examined (block 1004:Yes), the next such event is selected for consideration (block 1006). If this event does not have a corresponding entry in the combined coverage information database (block 1007:No), then such an entry is generated with bitmap and countmap values set to zero (block 1008) before continuing on to block 1010.

Next, the countmap value for the current model and event under consideration is added to the countmap value in the corresponding database entry for the particular event in the combined coverage information database (block 1010). Similarly, the bitmap information for the current model and event is logical-or'ed to the bitmap value for the corresponding database entry for the particular event in the combined coverage information database (block 1012). Processing then returns to block 1004 to determine if additional events have not been examined for the current model. If not (block 1004: No), the inner loop formed by block 1004 terminates, and processing returns to block 1001 to determine if additional models have yet to be examined. If not (block 1001:No), the process of FIG. 10 terminates, with the combined coverage results being contained in the new combined coverage database (originally generated at block 1000).

Figure 11:
FIG. 11 is a diagram illustrating data structured generated in a process of combining testcase autograde results across a plurality of designs in accordance with a preferred embodiment of the present invention.

As demonstrated in FIG. 11, test coverage autograde results can be combined in a similar fashion to enable a combined set of testcases to be organized covering all as-of-yet-detectable events. In the example illustrated in FIG. 11, autograde vector 1110 represents autograde results obtained for a first model ("Model 1"). Autograde vector 1102 represents autograde results obtained for a second model ("Model 2"). Recall that the results contained in autograde vectors 1100 and 1102 represent a minimized set of testcases that, when applied to the design under test, trigger each of the events represented in the vector. Since, in FIG. 11, there are two models, the identifiers of the testcases are written in a hierarchical form to distinguish testcases corresponding to Model 1 (which are written "1.1," "1.2," etc.) from testcases corresponding to Model 2 (which are written "2.1," "2.2," etc.).

Autograde results from autograde vector 1100 and 1102 are merged into a combined autograde vector 1104 by sequentially incorporating testcases from vector 1100 and vector 1102 so that all events are covered. In this example, the results from autograde vector 1100 (which demonstrate coverage of events A-E) are first incorporated wholesale into autograde vector 1104. Thus, according to this example, testcases 1.1, 1.2, 1.3, and 1.7 are added to autograde vector 1104 in the entries corresponding to events D, E, A, B, and C. Autograde vector 1102 is then examined, but only testcases corresponding to events not covered by the testcases in autograde vector 1100 are added to autograde vector 1104. Thus, since only events F and G were not covered in autograde vector 1100, only the testcases from autograde vector 1102 for events F and G (testcases 2.5 and 2.8, respectively) are copied into combined autograde vector 1104. One skilled in the art will recognize that this process may be repeated for any number of models by copying, at each pass, only those testcases that trigger events not triggered by a testcase generated for a previous model. Also, as was demonstrated in FIG. 9 with respect to the bitmap and countmap data structures, autograde results can be combined over equivalence classes of events (e.g., a testcase that triggers "Event A" in "Core 1" of "Model 1" may be considered to trigger "Event A" generally, so that it is not necessary to include an additional testcase that, for instance, triggers "Event A" in "Core 7" of "Model 2" in the combined autograde vector).

Figure 12:
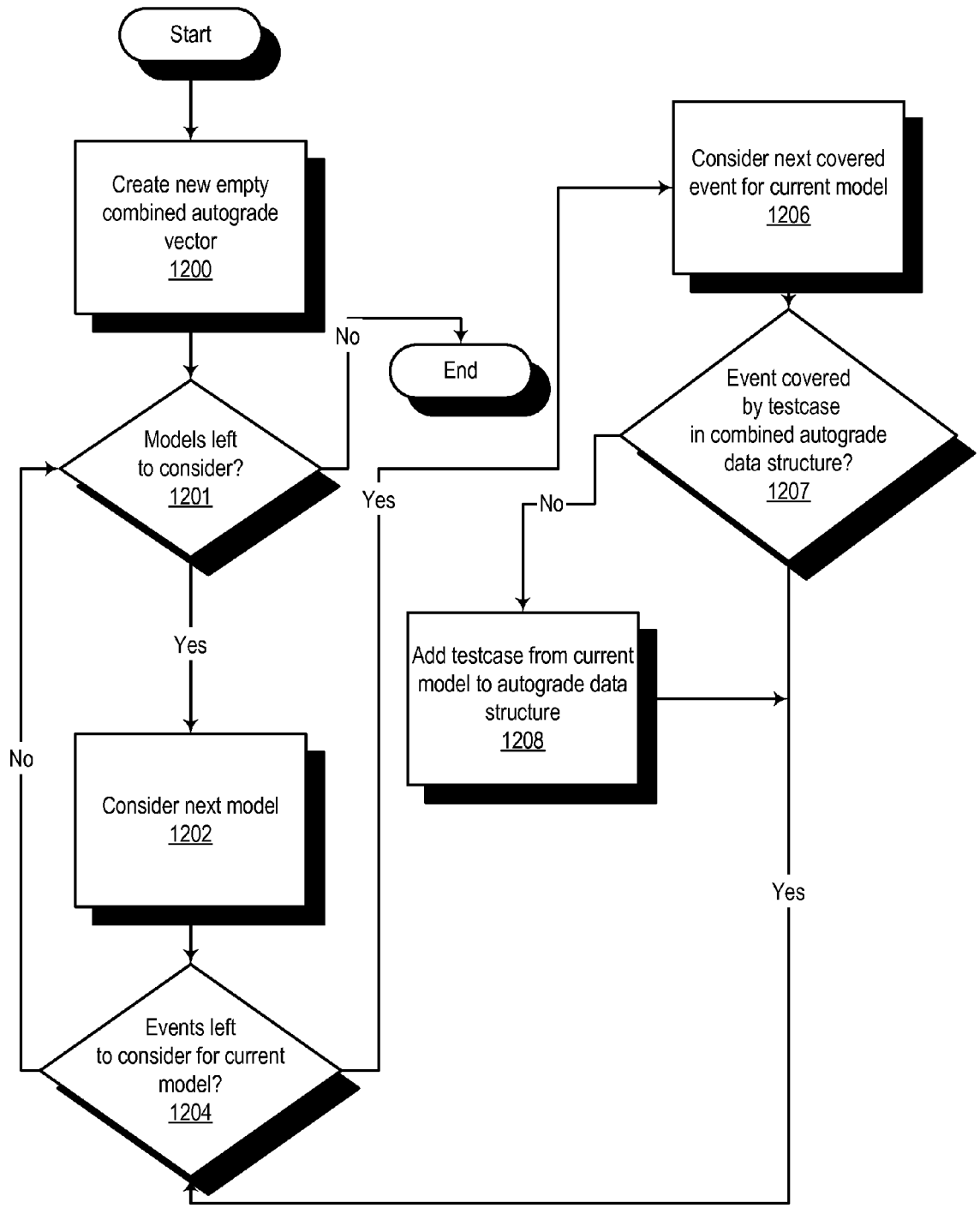
FIG. 12 is a flowchart representation of a process of combining testcase autograde results across a plurality of designs in accordance with a preferred embodiment of the present invention.

The process illustrated in FIG. 11 is depicted in flowchart form in FIG. 12. The process begins with the creation of a new empty combined autograde vector to refer to the combined autograde results from multiple models (block 1200). If there are models whose autograde results have yet to be merged into the combined vector (block 1201:Yes), execution proceeds to block 1202, where the next model is selected for consideration. If there are events for the current model left to be examined (block 1204:Yes), the next covered event (i.e., event covered by a testcase) is selected for consideration (block 1206). If this event does not have a corresponding testcase in the combined autograde vector (block 1207:No), then the testcase for the current model and event is added to the combined autograde vector as the corresponding testcase for the current event (block 1208).

Processing then returns to block 1204 to determine if additional events have not been examined for the current model. If not (block 1204:No), the inner loop formed by block 1204 terminates, and processing returns to block 1201 to determine if additional models have yet to be examined. If not (block 1201:No), the process of FIG. 12 terminates, with the combined coverage results being contained in the new combined coverage database (originally generated at block 1200).

Figure 13:
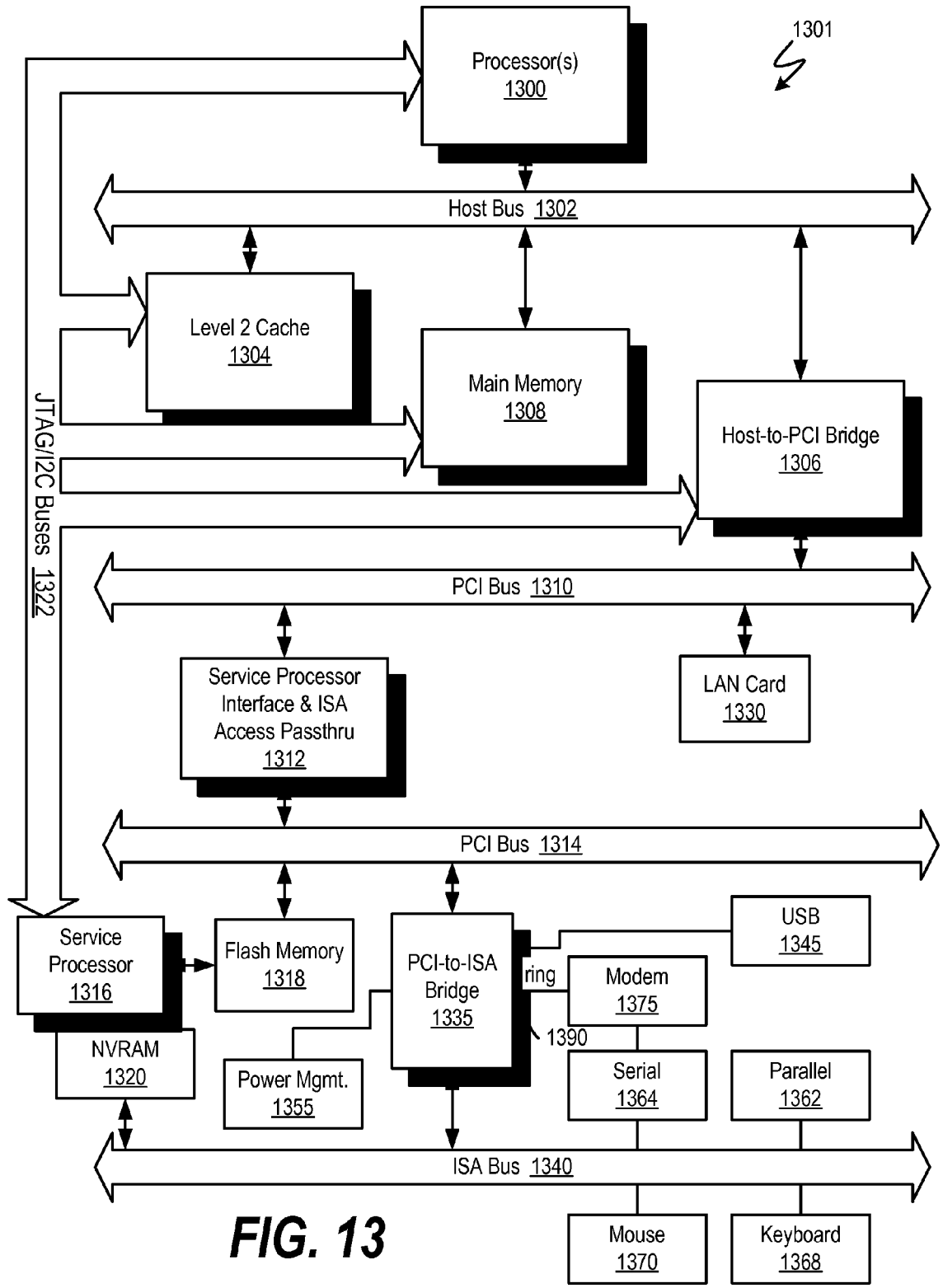
FIG. 13 is a block diagram of a data processing system in which a preferred embodiment of the present invention may be implemented.

FIG. 13 illustrates information handling system 1301 which is a simplified example of a computer system capable of performing the computing operations of the host computer described herein with respect to a preferred embodiment of the present invention. Computer system 1301 includes processor 1300 which is coupled to host bus 1302. A level two (L2) cache memory 1304 is also coupled to host bus 1302. Host-to-PCI bridge 1306 is coupled to main memory 1308, includes cache memory and main memory control functions, and provides bus control to handle transfers among PCI bus 1310, processor 1300, L2 cache 1304, main memory 1308, and host bus 1302. Main memory 1308 is coupled to Host-to-PCI bridge 1306 as well as host bus 1302. Devices used solely by host processor(s) 1300, such as LAN card 1330, are coupled to PCI bus 1310. Service Processor Interface and ISA Access Pass-through 1312 provide an interface between PCI bus 1310 and PCI bus 1314. In this manner, PCI bus 1314 is insulated from PCI bus 1310. Devices, such as flash memory 1318, are coupled to PCI bus 1314. In one implementation, flash memory 1318 includes BIOS code that incorporates the necessary processor executable code for a variety of low-level system functions and system boot functions.

PCI bus 1314 provides an interface for a variety of devices that are shared by host processor(s) 1300 and Service Processor 1316 including, for example, flash memory 1318. PCI-to-ISA bridge 1335 provides bus control to handle transfers between PCI bus 1314 and ISA bus 1340, universal serial bus (USB) functionality 1345, power management functionality 1355, and can include other functional elements not shown, such as a real-time clock (RTC), DMA control, interrupt support, and system management bus support. Nonvolatile RAM 1320 is attached to ISA Bus 1340. Service Processor 1316 includes JTAG and I2C buses 1322 for communication with processor(s) 1300 during initialization steps. JTAG/I2C buses 1322 are also coupled to L2 cache 1304, Host-to-PCI bridge 1306, and main memory 1308 providing a communications path between the processor, the Service Processor, the L2 cache, the Host-to-PCI bridge, and the main memory. Service Processor 1316 also has access to system power resources for powering down information handling device 1301.

Peripheral devices and input/output (I/O) devices can be attached to various interfaces (e.g., parallel interface 1362, serial interface 1364, keyboard interface 1368, and mouse interface 1370 coupled to ISA bus 1340. Alternatively, many I/O devices can be accommodated by a super I/O controller (not shown) attached to ISA bus 1340.

In order to attach computer system 1301 to another computer system to copy files over a network, LAN card 1330 is coupled to PCI bus 1310. Similarly, to connect computer system 1301 to an ISP to connect to the Internet using a telephone line connection, modem 1375 is connected to serial port 1364 and PCI-to-ISA Bridge 1335.

While the computer system described in FIG. 13 is capable of executing the processes described herein, this computer system is simply one example of a computer system. Those skilled in the art will appreciate that many other computer system designs are capable of performing the processes described herein.

Figure 14:
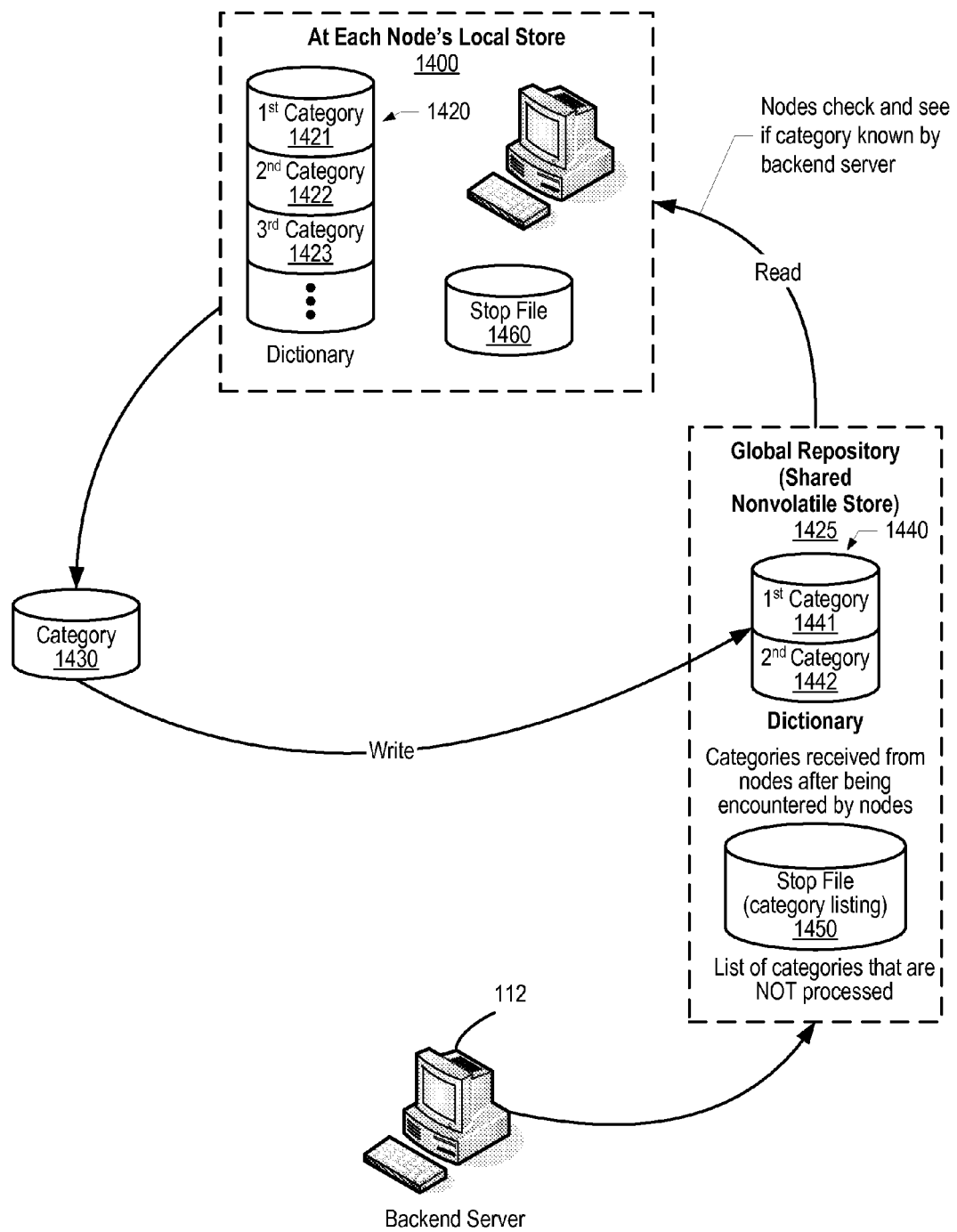
FIG. 14 is a network diagram showing nodes and the backend server communicating with each other to update category information and identifying categories not to process.

FIG. 14 is a computer network diagram showing nodes and the backend server communicating with each other to update category information and identifying categories not to process. The nodes and the backend server communicate using a computer network. In one embodiment, many nodes are used to run various test cases. Each node has local store 1400, such as a nonvolatile storage device, accessible from the node. Dictionary 1420 is stored at each node's local store. The same dictionary is used by each node. The dictionary includes one or more categories (e.g., categories 1421, 1422, and 1423) that detail various types of functions that are being tested in the test cases (e.g., lines, toggle, expression, functional, etc.). In one embodiment, each category has a separate dictionary. Every first time a category is encountered by a node, the first node to encounter the category sends the dictionary for that category (1430) to backend server 112. Backend server 112 is a type of coordinating computer system. Nodes store copies of the categories received from nodes in global repository 1425, which is a shared nonvolatile storage area accessible by both the backend server and the nodes. When the category is first discovered, the discovering node locks the shared store and publishes the dictionary, checksum, and size, then unlocks the shared store. This prevents more than one node from writing the dictionary. Automated Response, if set, causes the automatic generation and maintenance of Stop File 1450. Stop file 1450 is a category listing that identifies one or more categories that are not being requested by the coordinating computer systems. If not set, a user creates and maintain the file manually. Nodes repeatedly check to see if a category that they are processing is already known to the backend server by checking dictionary 1440 stored in global repository 1425. In the example shown, two categories have been sent to the backend server (categories 1441 and 1442) and included in the set of dictionary files 1440 stored in global repository 1425. Dictionary 1440 is checked by the nodes to see if a category being processed by the node has been published (e.g., is the category included in dictionary 1440 stored in global repository 1425?). If the category has not been published, then the dictionary is published to the global repository.

Figure 15:
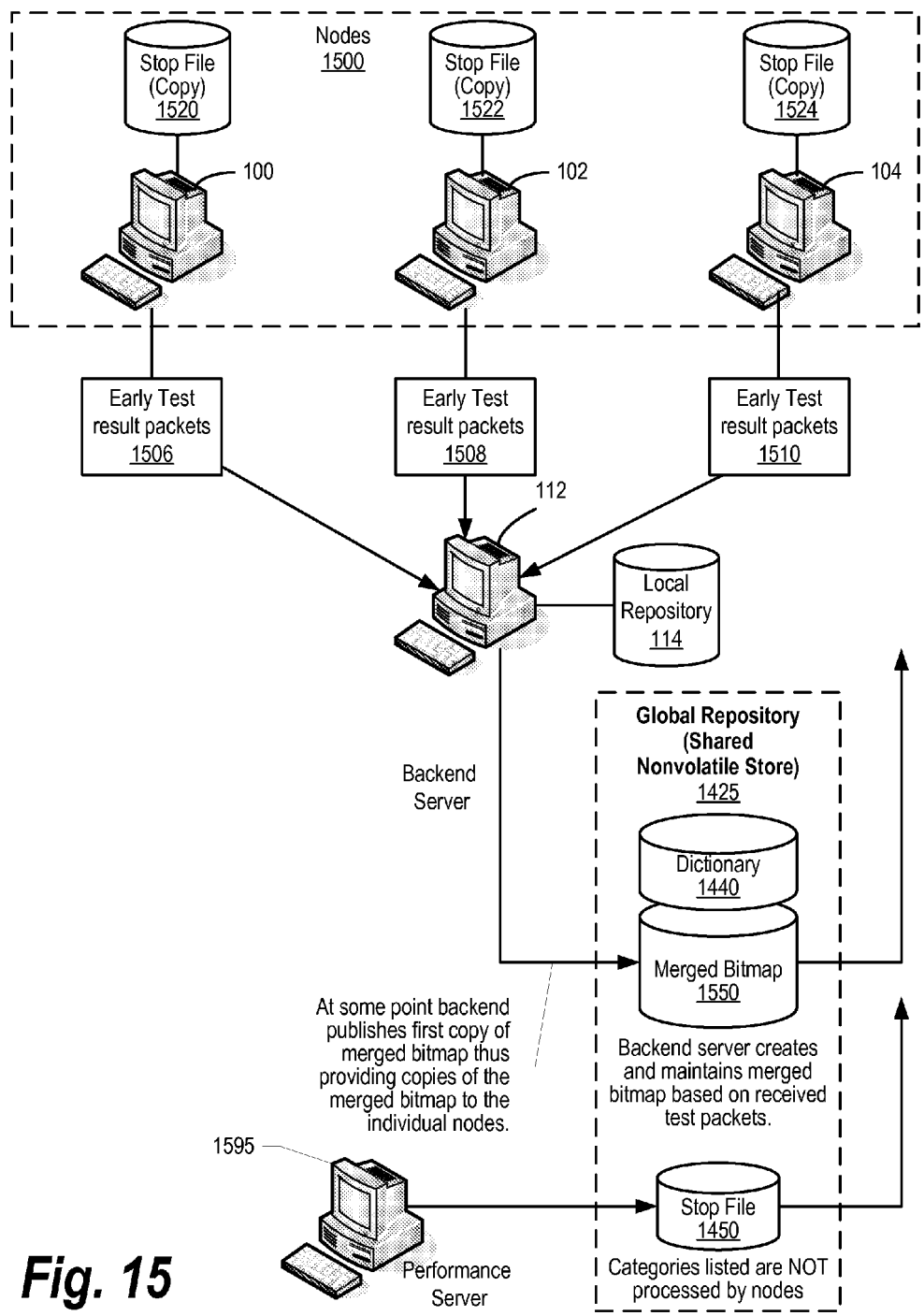
FIG. 15 is a network diagram showing nodes sending early test result packets back to the backend server for processing.

FIG. 15 is a computer network diagram showing nodes sending early test result packets back to the backend server for processing. Nodes 1500 shows three individual node computer systems (100, 102, and 104) that each have the same copy of a stop file initially (stop files 1520, 1522, and 1524, respectively) that indicate those categories that are not being processed. A user may choose to include categories in the stop file before testing commences in order to avoid testing certain categories. In addition, as described in further detail herein, the stop file may be periodically updated, such as when testing saturation has been reached for a particular category. If a category is listed in the stop file, then the nodes will not process test cases of the listed category. As testing commences, early test packet results are generated by nodes 100, 102, and 104 and sent to the backend server as (early) test packet results 1506, 1508, and 1510, respectively. Early test packet results are similar to later test packet results, however these early test packet results were generated before backend server 112 created and published merged bitmap 1550. When backend server 112 receives test result packets, it generates merged bitmap 1550. In one embodiment, backend server 112 maintains a master copy of the merged bitmap (e.g., on local repository 114) and periodically publishes the merged bitmap as described in FIG. 19 onto global repository 1425. In addition, performance server 1595 maintains stop file 1450 and publishes this file to global repository 1425 when the stop file is changed (e.g., when categories are added to the stop file). Performance server 1595 is a coordinating computer system along with backend server 112.

Figure 16:
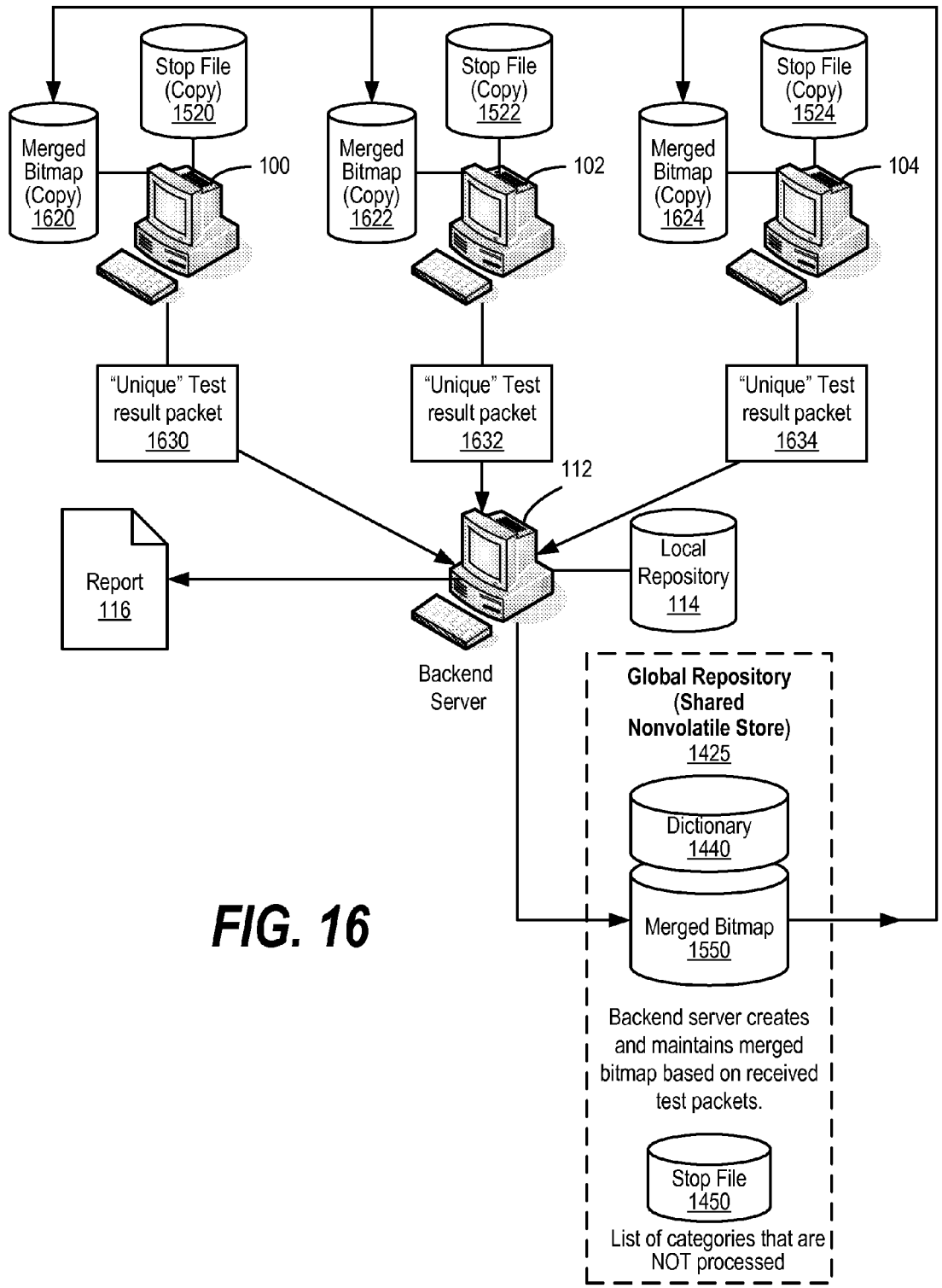
FIG. 16 is a network diagram showing a merged bitmap being communicated from the backend server to the nodes after processing of the early test result packets.

FIG. 16 is a network diagram showing a merged bitmap being communicated from the backend server to the nodes after processing of the early test result packets. Here, merged bitmap 1550 is communicated to nodes (nodes 100, 102, and 104) and the nodes retain, on their respective local stores, a copy of the merged bitmap data structure (merged bitmap copies 1620, 1622, and 1624, respectively). Now, as described in further detail herein, the nodes can use the merged bitmap file to ascertain whether a test result packet that the node generated is "unique" or has already been encountered by any of the nodes during a previously executed test case. In this manner, nodes 100, 102, and 104 return unique test result packets 1630, 1632, and 1634, respectively, to backend server 112 and are able to discard non-unique, or redundant, test packets by refraining from sending these redundant test packets to backend server 112.

Figure 17:
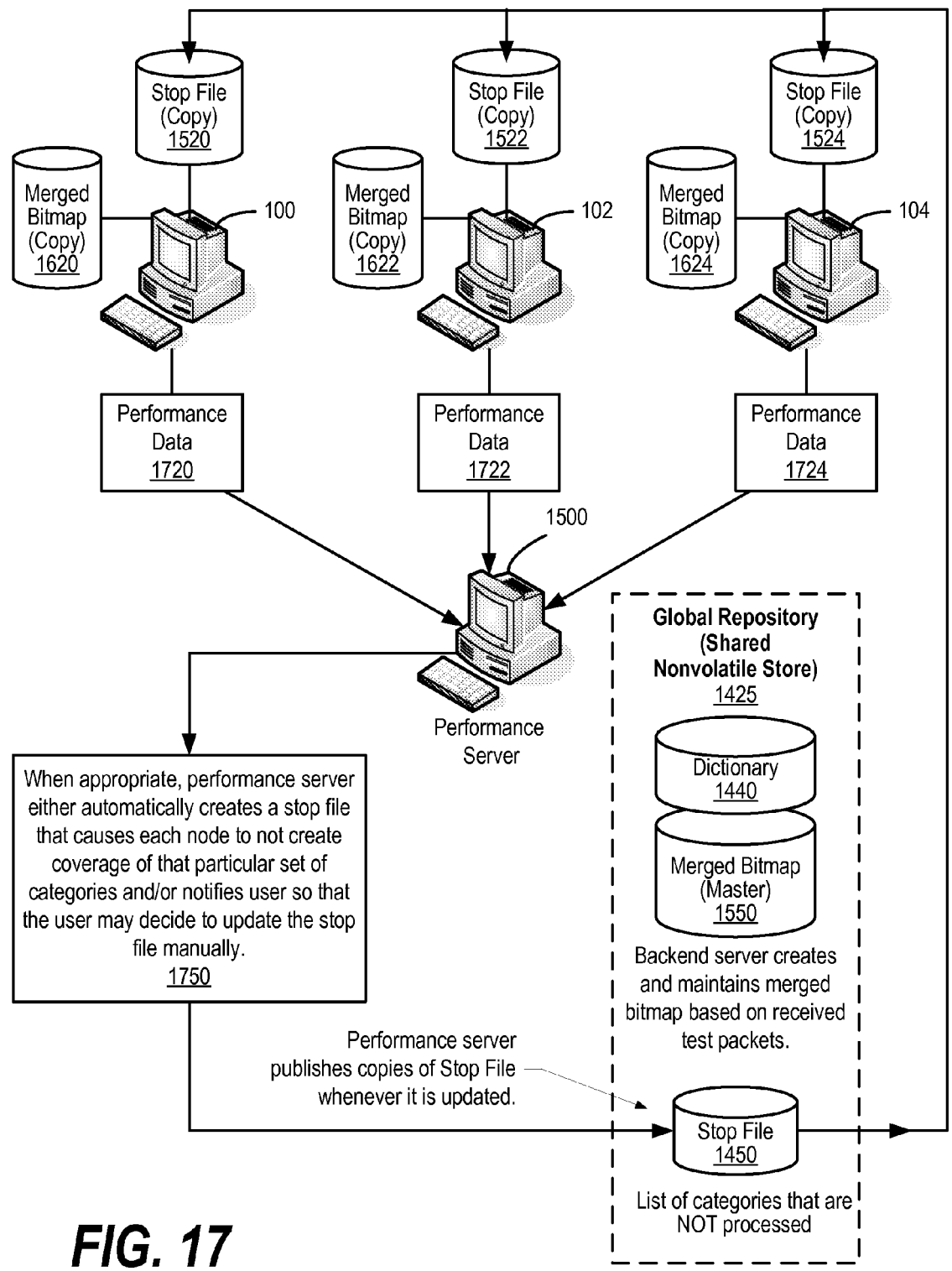
FIG. 17 is a network diagram showing performance data being communicated from the nodes to a performance server and used to create a stop file that identifies categories not to process.

FIG. 17 is a network diagram showing performance data being communicated from the nodes to a performance server and used to create a stop file that identifies categories not to process. As described in further detail herein, nodes 100, 102, and 104 send performance data 1720, 1722, and 1724 to performance server 1595 for processing. In one embodiment, performance server 1595 is a different server separate and apart from backend server 112. In another embodiment, the same computer system can be used to perform both the backend server functions and performance server functions as described herein. When appropriate, at step 1750, performance server 1595 either automatically creates stop file 1450 that causes each node to not create coverage of that particular set of categories and/or notifies a user so that the user may decide to update the stop file manually. The stop file is published to global repository 1425 where it is read by the nodes so that the nodes can identify those categories that are not being processed. One point at which it may be appropriate to include a category in the stop file is when saturation has been reached for testing of the particular category. Saturation is discussed in further detail herein.

Figure 18:
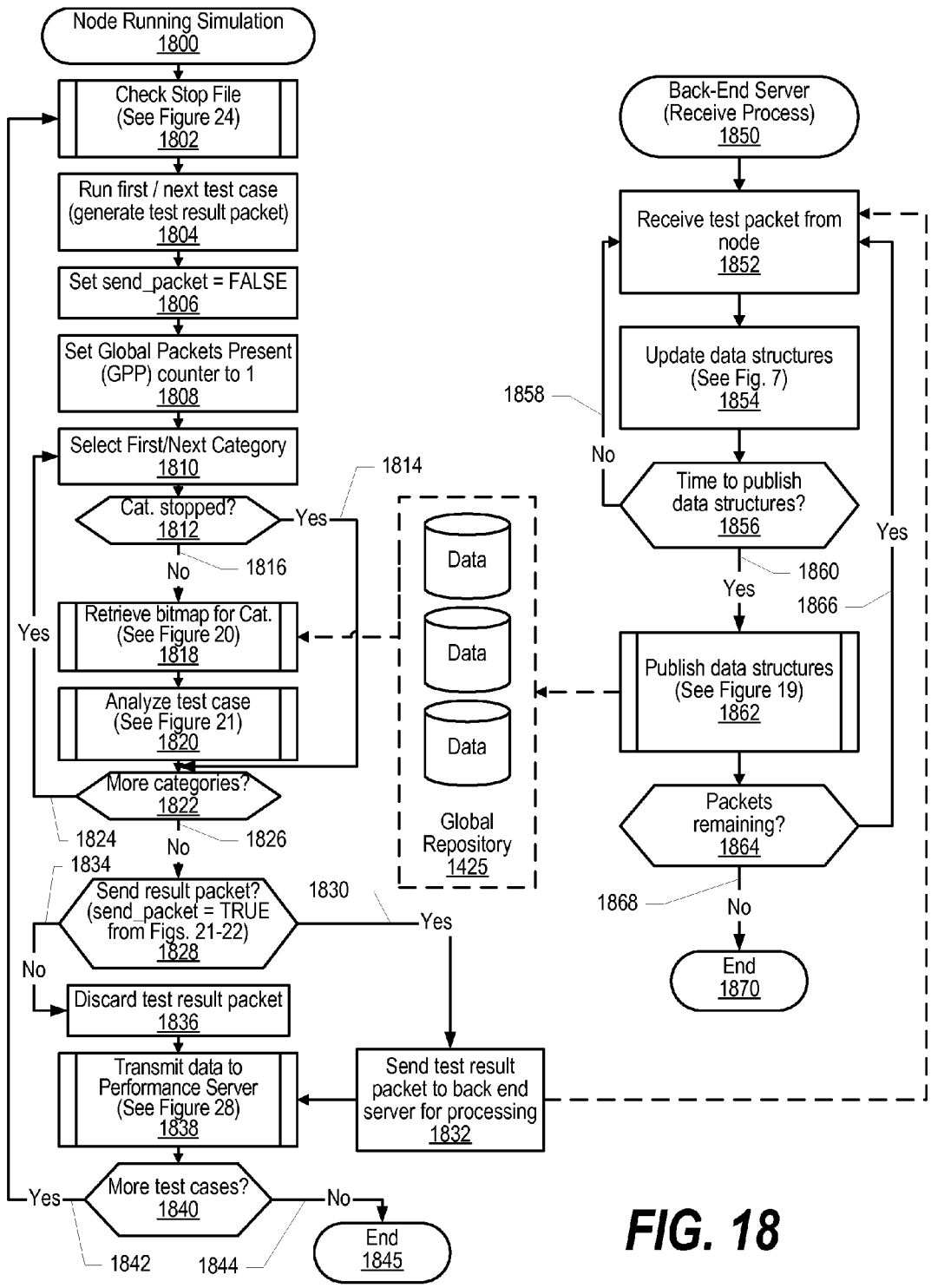
FIG. 18 is a flowchart showing the backend server publishing data structures used by nodes running simulation as well as a high level of the simulation being performed by the nodes.

FIG. 18 is a flowchart showing the backend server publishing data structures used by nodes running simulation as well as a high level abstract view of the simulation being performed by the nodes. Processing performed by each node commences at 1800 whereupon the node checks the stop file in order to retrieve the latest copy of the stop file that is available (predefined process 1802, see FIG. 24 and corresponding text for details regarding checking the stop file). At step 1804, the node runs the first test case assigned to the node. At step 1806, the node sets the send_packet flag to FALSE indicating that the packet is not going to be transmitted to the backend server unless, during further processing, the flag is reset to TRUE. At step 1808, the global packets present counter is set to one (1). At step 1810, the first category is selected from the test result packet that was generated at step 1804. A determination is made as to whether the selected category is included in the stop file (decision 1812). If the selected category is included in the stop file, then decision 1812 disregards the selected category and jumps forward ("yes" branch 1814) to step 1822 see if there are any more categories to process. This looping continues until a category is selected that is not listed in the stop file, whereupon decision 1812 branches to "no" branch 1816 in order to process the category. At predefined process 1818, the merged bitmap corresponding to the selected category that was not listed in the stop file is retrieved from global repository 1425 (see FIG. 20 and corresponding text for details regarding the retrieval of the merged bitmap for the selected category). The test case is analyzed at predefined process 1820 (see FIG. 21 and corresponding text for details regarding test case analysis). A determination is made as to whether there are more categories to process (decision 1822). If there are more categories to process, decision 1822 branches to "yes" branch 1824 which loops back to select the next category at step 1810 and process it as described above. This looping continues until all categories have been processed, at which point decision 1822 branches to "no" branch 1826. A determination is made as to whether to send the test result packet to the backend server (decision 1828). This decision is based upon whether the send_packet flag (initialized to FALSE at step 1806) has been set to TRUE by the processing shown in FIGS. 21 and 22. If the Send_packet flag has been set to TRUE, then decision 1828 branches to "yes" branch 1830 whereupon, at step 1832, the test result packet is sent to the backend server. On the other hand, if the send_packet flag is still FALSE, then decision 1828 branches to "no" branch 1834 whereupon, at step 1836, the test result packet is discarded and not sent to the backend server. At predefined process 1838, data is transmitted to the performance server (see FIG. 28 and corresponding text for details regarding the transmission of data from the nodes to the performance server). A determination is made as to whether there are more test cases for the node to process (decision 1840). If there are more test cases to process, then decision 1840 branches to "yes" branch 1842 which loops back to step 1802 to check the stop file and then onto step 1804 to run the next test case assigned to the node. This looping continues until there are no more test cases for the node to process, at which point decision 1840 branches to "no" branch 1844 and node processing ends at 1845. Backend server processing is shown commencing at 1850 whereupon, at step 1852, the backend server receives a test packet from one of the nodes. At step 1854, the backend server updates the data structures shown in FIG. 7, including the merged bitmap data structure. As previously described, the backend server creates the merged bitmap data structure by merging test pattern coverage results received from all of the nodes that are running test cases. A determination is made by the backend server as to whether it is time to publish the data structures such as the merged bitmap (decision 1856). In one embodiment, the backend server is set to publish the data structures based on a time interval, such as every five minutes. If it is not yet time to publish the data structures (the merged bitmap), then decision 1856 branches to "no" branch 1858 which loops back to receive the next test packet from one of the nodes and update the data structures accordingly. This looping continues until it is time to publish the data structures, at which point decision 1856 branches to "yes" branch 1860 whereupon the data structures (the merged bitmap) are published to global repository 1425 at predefined process 1862 (see FIG. 19 and corresponding text for details regarding the publication of the data structures to the global repository). A determination is made as to whether there are more packets to process that have been received from the nodes (decision 1864). If there are more packets to process, then decision 1864 branches to "yes" branch 1866 which loops back to receive the next test packet from one of the nodes and process it as described above. This looping continues until there are no more packets received from the nodes, at which point decision 1864 branches to "no" branch 1868 and backend server processing ends at 1870.

Figure 19:
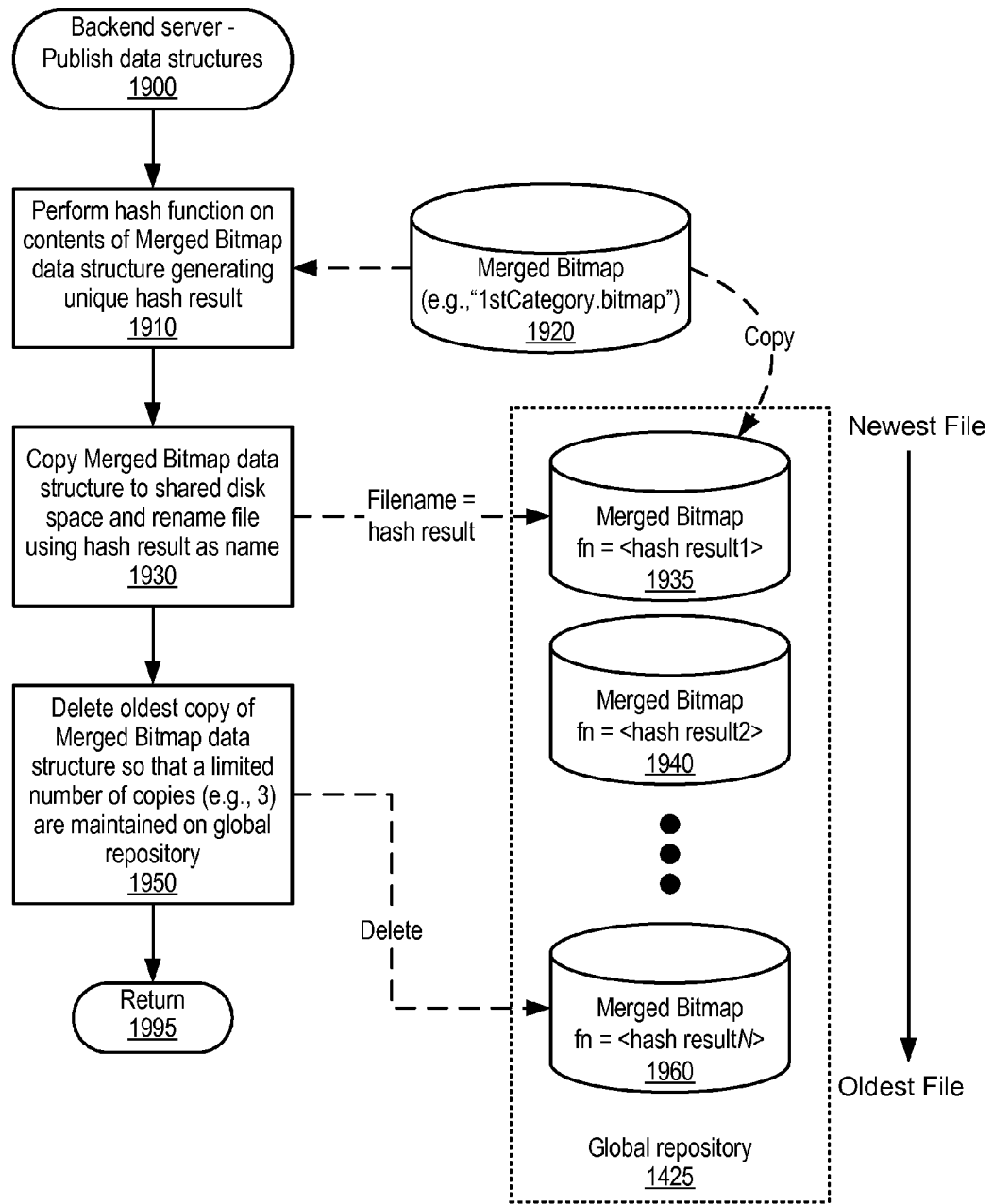
FIG. 19 is a flowchart showing the backend server publishing the data structures to a global repository accessible by the nodes.

FIG. 19 is a flowchart showing the backend server publishing the data structures to a global repository accessible by the nodes. Backend server processing is shown commencing at 1900 whereupon, at step 1910, a hash function is used on the contents of the merged bitmap data structure resulting in a unique hash result. As noted, in one embodiment, merged bitmap 1920 is organized and named based on the category to which it corresponds. For example, the master merged bitmap maintained by the server may have a line.bitmap that is the merged bitmap for the line category, a toggle.bitmap that is the merged bitmap for the toggle category, and so on. At step 1930, the master copy of the merged bitmap for a particular category is copied to global repository 1425 and named using the hash result from step 1910 as the name resulting in merged bitmap copy 1935 being stored in global repository with a filename that is equal to the hash result from step 1910. In this manner, multiple copies of the merged bitmap can be stored in the global repository, each with a filename that equals the hash result for the respective file. A previously saved version of the merged bitmap, such as merged bitmap 1940, can therefore be saved in the same area (e.g., directory) of global repository 1425 with a different hash result corresponding to this previously saved version of the merged bitmap used as the filename. At step 1950, the oldest copy of the merged bitmap, 1960, is deleted from global repository 1425 so that a limited number of copies (e.g., 3 copies) of the merged bitmap are maintained in the global repository. Processing then returns to the calling routine (see FIG. 18) at 1995.

Figure 20:
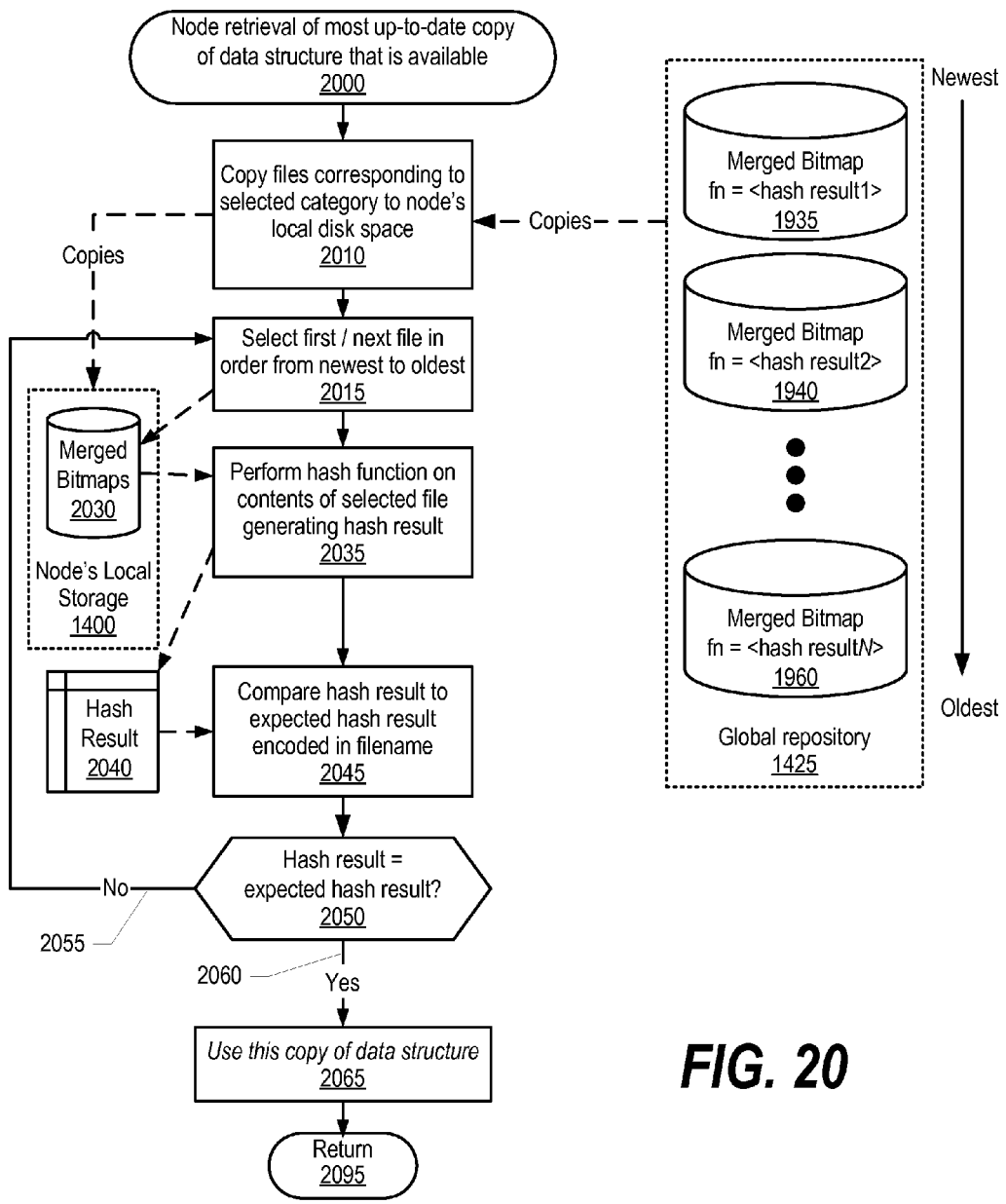
FIG. 20 is a flowchart showing the steps used by the nodes to retrieve the most up-to-date copy of the data structures that are available.

FIG. 20 is a flowchart showing the steps used by the nodes to retrieve the most up-to-date copy of the data structures that are available. Here, a node is retrieving the merged bitmap files stored by the backend server as shown in FIG. 19. Node retrieval processing commences at 2000 whereupon, at step 2010, the node copies the files corresponding to the selected category from an area (e.g., from a directory such as "\line") in global repository 1425. These files are stored in the node's local storage 1400, such as a nonvolatile storage device accessible from the node as merged bitmaps 2030 with the same hash result filenames as found in global repository 1425. At step 2015, the first (newest) file is selected from the group of merged bitmaps. At step 2035, the same hash function that was used by the backend server when storing the merged bitmaps is used on the contents of the file generating hash result 2040. At step 2045, hash result 2040 is compared to the hash result encoded in the merged bitmap filename. A determination is made as to whether hash result 2040 is the same as (equal to) the hash result encoded in the merged bitmap filename (decision 2050). If hash result 2040 is not the same as the hash result encoded in the filename, then decision 2050 branches to "no" branch 2055 which loops back to select the next newest merged bitmap file, perform the hash function on the newly selected file, and compare the hash result to the expected hash result. This looping is performed until hash result 2040 matches the expected hash result encoded in the merged bitmap's filename, at which point decision 2050 branches to "yes" branch 2060 whereupon this merged bitmap file is the one used by the node. Processing then returns to the calling routine (see FIG. 18) at 2095.

Figure 21:
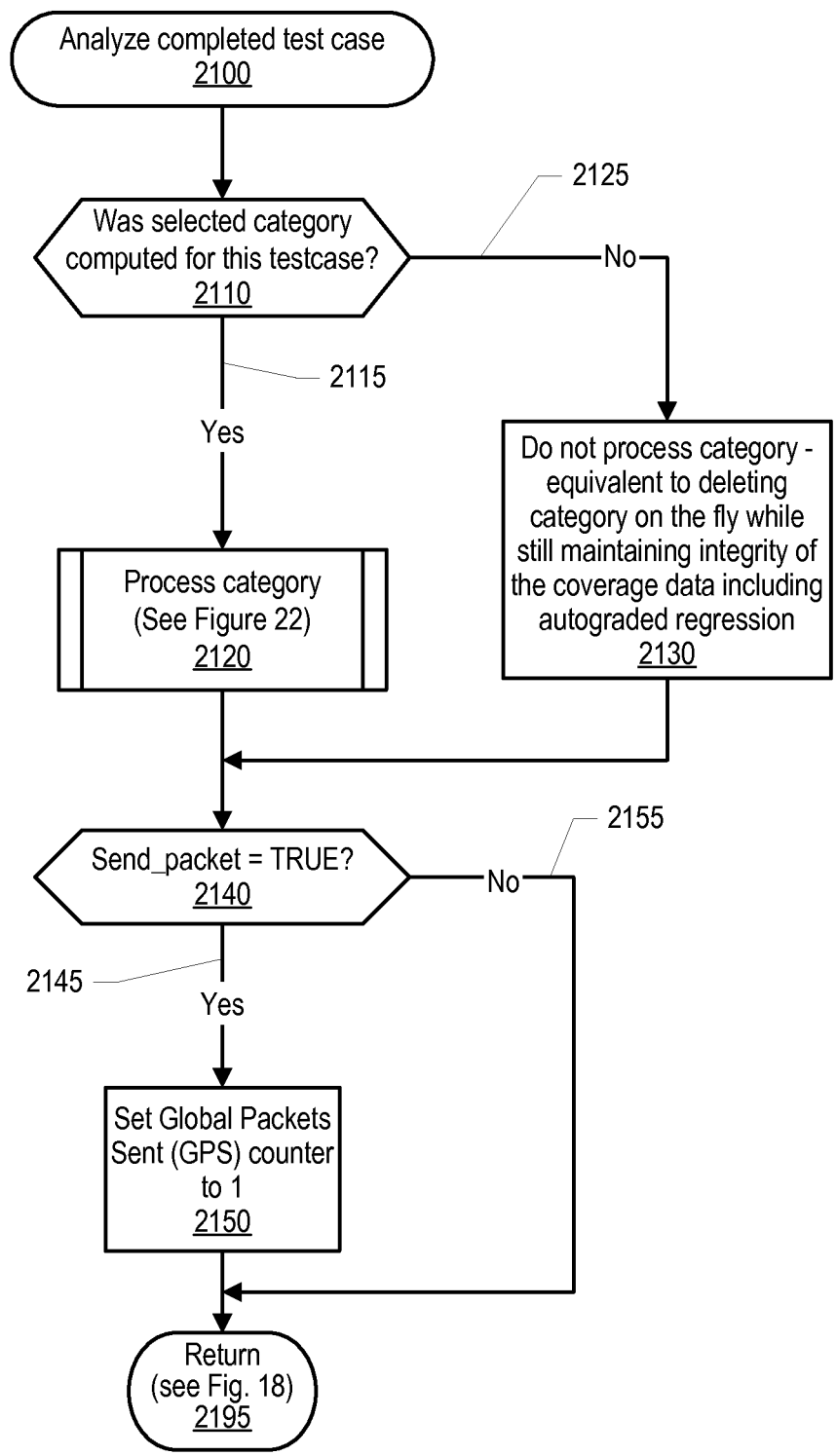
FIG. 21 is a flowchart showing the steps taken by a node to analyze a test case.

FIG. 21 is a flowchart showing the steps taken by a node to analyze a test case. This processing is performed by the nodes and is called from predefined process 1820 in FIG. 18. Returning to FIG. 21, node processing to analyze a completed test case commences at 2100 whereupon a determination is made as to whether the category currently selected (see FIG. 18) was computed with this test case (decision 2110). If the selected category was computed with this test case, then decision 2110 branches to "yes" branch 2115 whereupon, at predefined process 2120, the category is processed (see FIG. 22 and corresponding text for details regarding how the node processes the category). On the other hand, if the selected category was not computed with this test case, then decision 2110 branches to "no" branch 2125 whereupon, at step 2130, the category is not processed which is equivalent to deleting category on the fly while still maintaining integrity of the coverage data including autograded regression. A determination is made as to whether the send_packet flag has been set to TRUE (decision 2140). If the send_packet flag has been set to TRUE, then decision 2140 branches to "yes" branch 2145 whereupon, at step 2150, the global packets sent counter is set to one (1). On the other hand, if the send_packet flag is FALSE, then decision 2140 branches to "no" branch 2155 bypassing step 2150. Processing then returns to the calling routine (see FIG. 18) at 2195.

Figure 22:
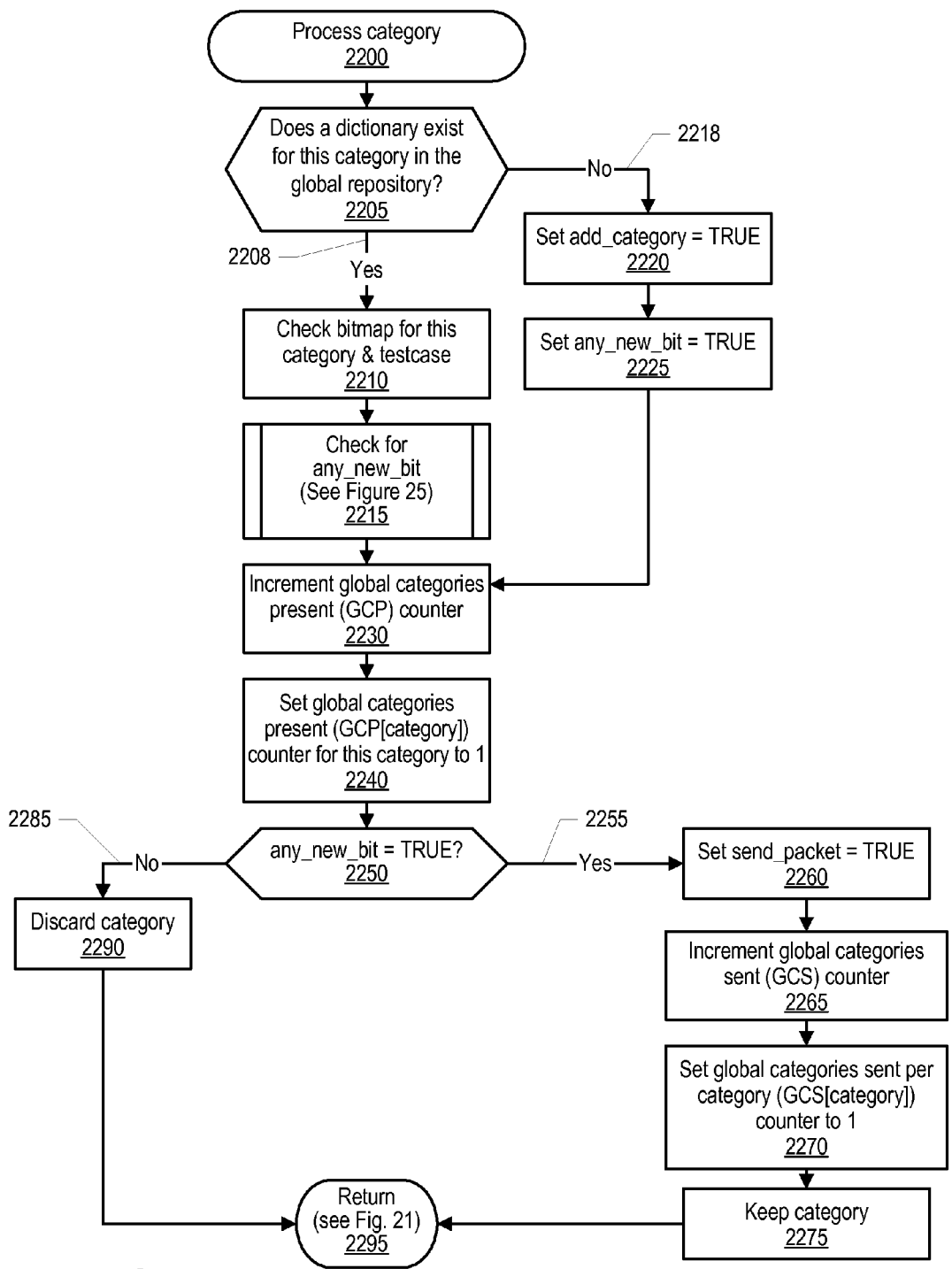
FIG. 22 is a flowchart showing the steps taken by a node to process a category.

FIG. 22 is a flowchart showing the steps taken by a node to process a category. This routine is called from predefined process 2120 shown in FIG. 21. Returning to FIG. 22, node processing of a category commences at 2200 whereupon the node determines whether a dictionary currently exists in the global repository for this category (decision 2205). If the dictionary already exists for this category in the global repository, then decision 2205 branches to "yes" branch 2208 whereupon, at step 2210, the bitmap is checked for this category and this testcase. At predefined process 2215, a check is made for any_new_bit (see FIG. 25 and corresponding text for details regarding the check that the node makes for any new bit). Returning to decision 2205, if the dictionary for this category does not currently exist in the global repository, then decision 2205 branches to "no" branch 2218 whereupon, at step 2220, the add_category flag is set to TRUE and the any_new_bit flag is also set to TRUE. At step 2230, the global categories present (GPP) counter is incremented. At step 2240, the global categories present counter for this category is set to one (1). A determination is made as to whether the any_new_bit flag has been set to TRUE (decision 2250). If the any_new_bit flag has been set to true, then decision 2250 branches to "yes" branch 2255 whereupon, at step 2260, the send_packet flag is set to TRUE, at step 2265 the global categories sent (GCS) counter is incremented, at step 2270 the global categories sent for this category counter is set to one (1), and at step 2275 the category is kept. Processing then returns to the calling routine (see FIG. 21) at 2295. Returning to decision 2250, if the any_new_bit flag is FALSE, then decision 2250 branches to "no" branch 2285 whereupon, at step 2290, the category is discarded and processing then returns to the calling routine (see FIG. 21) at 2295.

Figure 23:
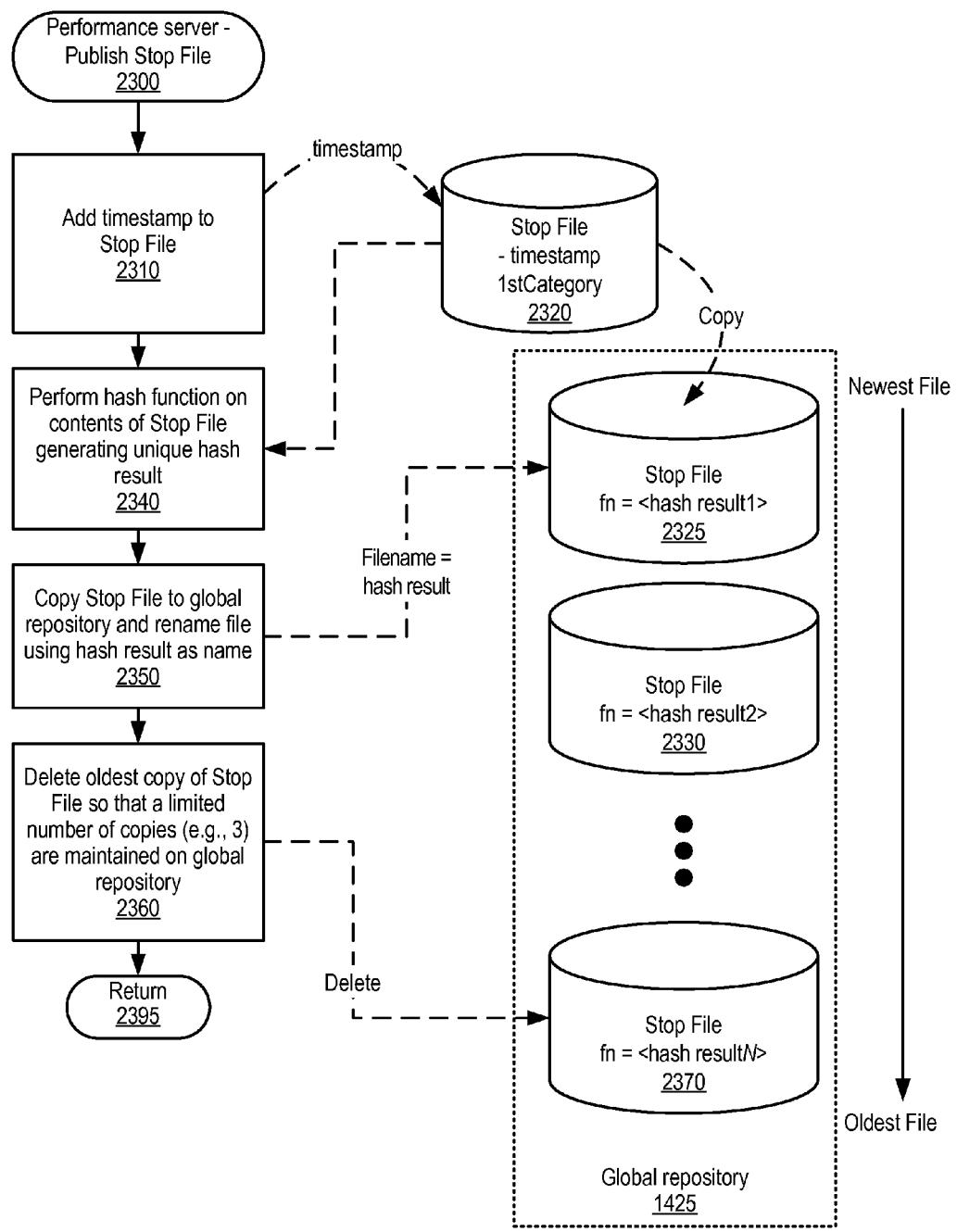
FIG. 23 is a flowchart showing the steps taken by the performance server to publish the stop file onto the global repository accessible by the nodes.

FIG. 23 is a flowchart showing the steps taken by the performance server to publish the stop file onto the global repository accessible by the nodes. This routine is called by the performance server at predefined process 2770 shown in FIG. 27. Processing by the performance server commences at 2300 whereupon at step 2310 the current timestamp is added to stop file 2320. As shown, stop file 2320 includes the timestamp and a list of categories that, if present in the stop file, are to be skipped by the nodes when processing test results. At step 2340, a hash function is performed on the contents of the stop file resulting in a unique hash result. At step 2350, the performance server's copy of stop file 2320 is copied to global repository 1425 and the hash result is included in the filename of the copy of the stop file stored in the global repository (stop file copy 2325). Similar to the backend server's handling of merged bitmap files shown in FIG. 19, the performance server maintains more than one copy of the stop file on global repository 1425 (stop files 2325, 2330, and 2370). At step 2360, the oldest copy of the stop file being maintained in global repository 1425 is deleted so that a limited number of copies (e.g., 3) of the stop file are maintained in global repository 1425. Processing then returns to the calling routine (see FIG. 27) at 1495.

Figure 24:
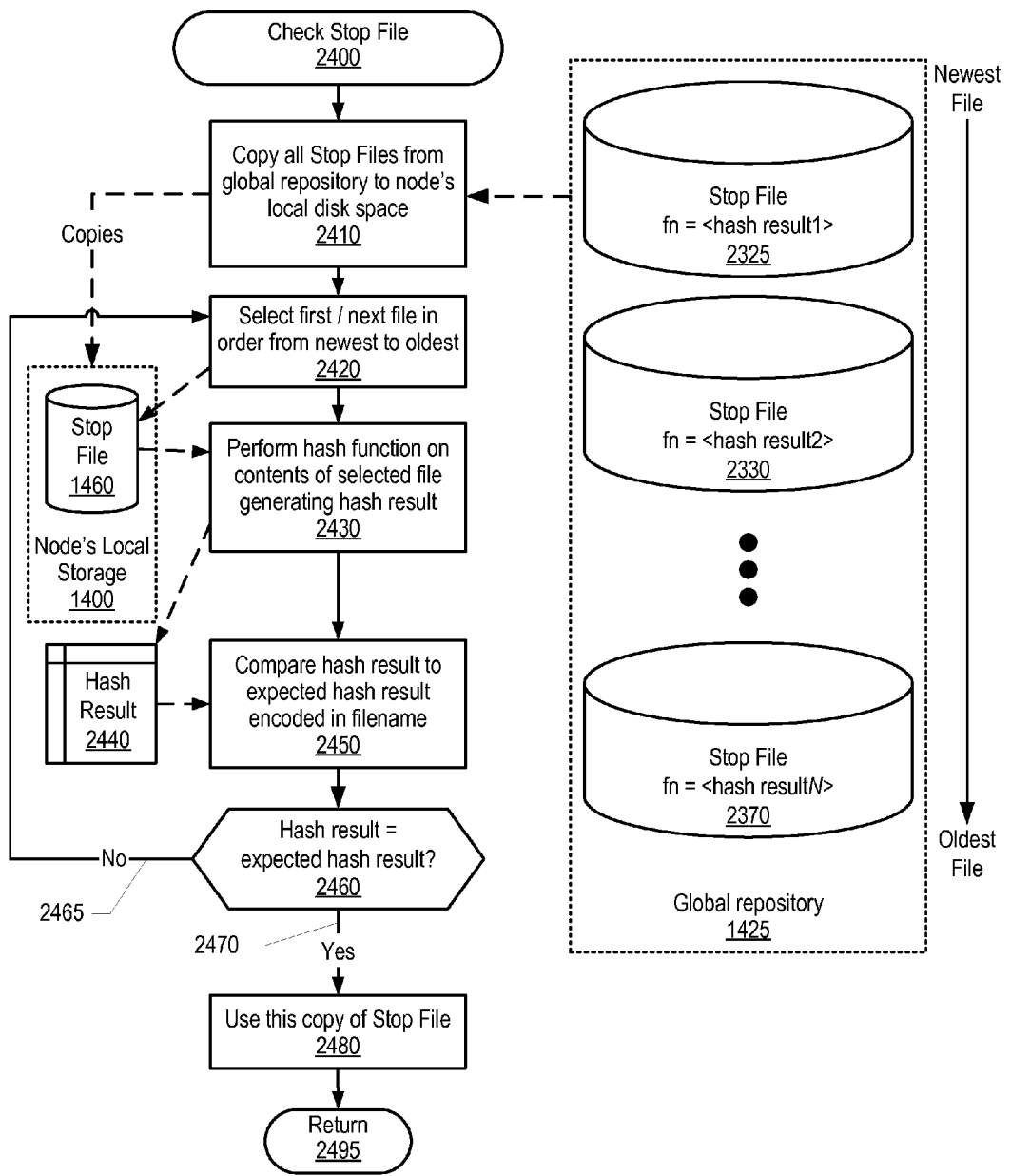
FIG. 24 is a flowchart showing the steps taken by the nodes to check the stop files found on the global repository.

FIG. 24 is a flowchart showing the steps taken by the nodes to check the stop files found on the global repository. This routine is called by predefined process 1802 shown in FIG. 18. Processing by the nodes in FIG. 24 commences at 2400 whereupon, at step 2410, all of the copies of the stop files are copied from global repository 1425 to the node's local storage 1400. At step 2420, the newest copy of the stop file is selected from local storage 1400. At step 2430, the same hash function that was used by the performance server is used by the node on the contents of the selected copy of the stop file resulting in hash result 2440. At step 2450, hash result 2440 is compared to the expected hash result encoded in the selected stop file's filename. A determination is made as to whether hash value 2440 matches (is equal to) the expected hash value (decision 2460). If hash result 2440 is not the same as the expected hash result, then decision 2460 branches to "no" branch 2465 which loops back to select the next newest stop file from global repository 1425 and perform the hash function and comparison as described above. This looping continues until the hash result of one of the selected stop files matches the expected hash result encoded in the stop file's filename. At this point, decision 2460 branches to "yes" branch 2470 whereupon, at step 2480, the selected copy of the stop file is used by the node. Processing then returns to the calling routine (see FIG. 18) at 2495.

Figure 25:
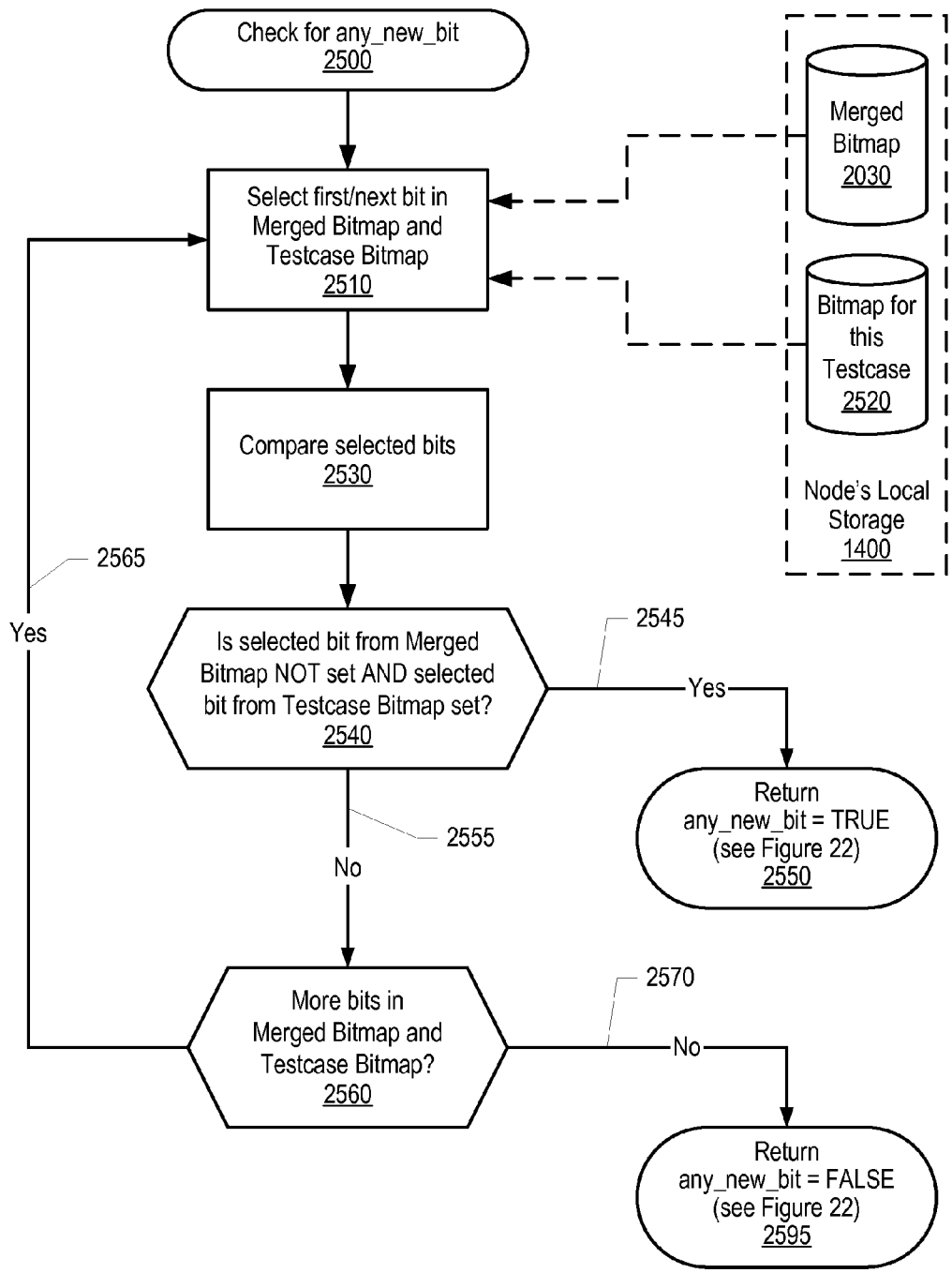
FIG. 25 is a flowchart showing the steps taken by the nodes to check for any new bit in a comparison between the merged bitmap data structure and the bitmap for a test case that the node has completed.

FIG. 25 is a flowchart showing the steps taken by the nodes to check for any new bit in a comparison between the merged bitmap data structure and the bitmap for a test case that the node has completed. This processing, performed by the nodes, is called from predefined process 2215 shown in FIG. 22. FIG. 25 processing commences at 2500 whereupon, at step 2510 the first bit in merged bitmap 2030 is selected along with the first bit in testcase bitmap 2520. Testcase bitmap 2520 resulted from the node's execution of a testcase. At step 2530, the selected bits are compared. A determination is made as to whether the selected bit from the merged bitmap is NOT SET (e.g., equal to 0) AND the selected bit from the testcase bitmap is SET (e.g., equal to 1). If this is the case (bit from merged bitmap NOT SET AND bit from testcase bitmap SET), then decision 2540 branches to "yes" branch 2545 whereupon processing returns to the calling routine (see FIG. 22) at 2550 with the any_new_bit flag set to TRUE. On the other hand, if this is not the case, then decision 2540 branches to "no" branch 2555 whereupon a determination is made as to whether there are more bits in the merged bitmap data structure and the testcase bitmap data structure (decision 2560). If there are more bits to process, then decision 2560 branches to "yes" branch 2565 which loops back to select and process the next pair of bits. This looping continues until either the condition of decision 2540 is TRUE for a set of bits so that decision 2540 branches to "yes" branch 2545 and returns at 2550 as described above, or until all of the bits have been processed, at which point decision 2560 branches to "no" branch 2570 and processing returns to the calling routine (see FIG. 22) at 2595 with the any_new_bit flag set to FALSE.

Figure 26:
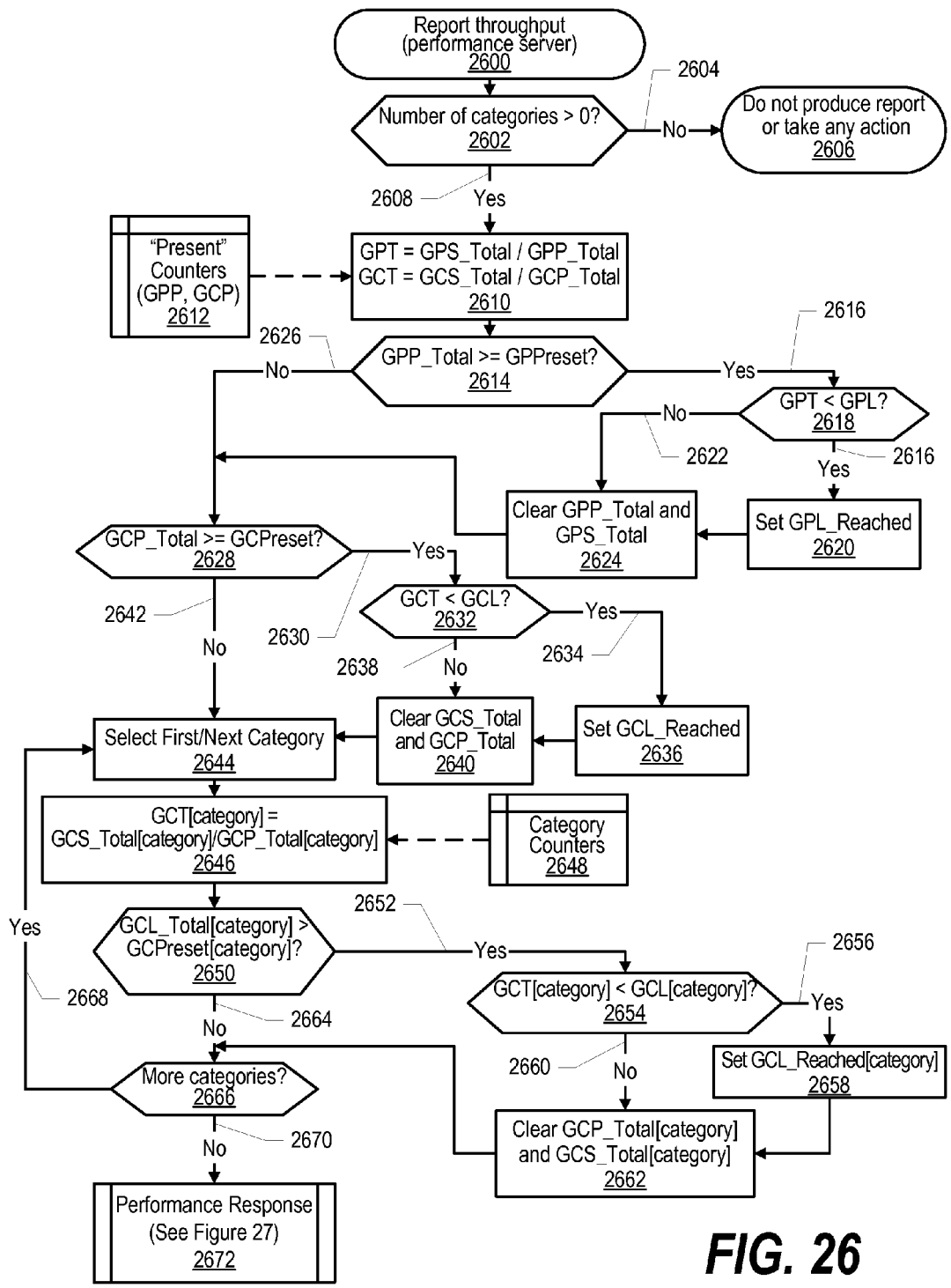
FIG. 26 is a flowchart showing steps taken by the performance server to report throughput.

FIG. 26 is a flowchart showing steps taken by the performance server to report throughput. Performance server processing commences at 2600 whereupon a determination is made as to whether the number of categories is greater than zero (0) (decision 2602). If the number of categories is not greater than zero (e.g., is equal to zero), then decision 2602 branches to "no" branch 2604 whereupon performance processing ends at 2606 without producing any report or taking any action. On the other hand, if the number of categories is greater than zero, then decision 2602 branches to "yes" branch 2608 whereupon, at step 2610, the "present" counters are read (global packets present (GPP) and global categories present (GCP)) and the global packet throughput (GPT) is calculated as the global packets sent total (GPS_Total) divided by the global packets present total (GPP_Total). In addition, the global category throughput (GCT) is calculated as the global categories sent total (GCS_Total) divided by the global categories present total (GCP_Total). A determination is made as to whether the global packets present total (GPP_Total) is greater than or equal to the threshold value called global packets present reset (GPPreset) (decision 2614). If GPP_Total is greater than or equal to the reset value GPPreset, then decision 2614 branches to "yes" branch 2616 whereupon a determination is made as to whether the global packets throughput (GPT) calculated in step 2610 is less than the global packet limit (GPL) value (decision 2618). If the GPT is less than the GPL, then decision 2618 branches to "yes" branch 2616 whereupon, at step 2620, a flag is set indicated that the global packets limit has been reached (GPL_Reached). Returning to decision 2618, if GPT is not less than GPL, then decision 2618 branches to "no" branch 2622 bypassing step 2620. At step 2624, the global packets present total (GPP_Total) and the global packets sent total (GPS_Total) values are cleared (set to zero). Returning to decision 2614, if GPP_Total is not greater than or equal to the reset value GPPreset, then decision 2614 branches to "no" branch 2626 bypassing steps 2618 through 2624. A determination is made as to whether global categories present total (GCP_Total) is greater than or equal to the reset value GCPreset (decision 2628). If GCP_Total is greater than or equal to the reset value GCPreset, then decision 2628 branches to "yes" branch 2630 whereupon a determination is made as to whether the global category throughput (GCT) value calculated in step 2610 is less than the global category limit (GCL) (decision 2632). If GCT is less than GCL, then decision 2632 branches to "yes" branch 2634 whereupon, at step 2636, a flag (GCL_Reached) is set indicating that the global categories limit has been reached. On the other hand, if GCT is not less than GCL, then decision 2632 branches to "no" branch 2638 bypassing step 2636. At step 2640, the GCS_Total and the GCP_Total are cleared (set to zero). Returning to decision 2628, if GCP_Total is less than the reset value GCPreset, then decision 2628 branches to "no" branch 2642 bypassing steps 2632 to 2640. At step 2644 the first category is selected. At step 2646, the global category throughput for the category (GCT[category]) is calculated as the global categories sent total for the category (GCS_Total[category]) divided by the global categories present total for the category (GCP_Total[category]) by reading category counters 2648. A determination is made as to whether the global category limit total for the category (GCL_Total[category]) is greater than the reset value for the category (GCPreset[category]) (decision 2650). If GCL_Total[category] is greater than the reset value for the category GCPreset[category], then decision 2650 branches to "yes" branch 2652 whereupon a determination is made as to whether the global category throughput for the category (GCT[category]) is less than the global category limit for the category (GCL[category]) (decision 2654). If GCT[category] is less than GCL[category] then decision 2654 branches to "yes" branch 2656 whereupon, at step 2658, a flag is set indicating that the global category limit has been reached for the category (set GCL_Reached[category] to TRUE). On the other hand, if GCT[category] is not less than GCL[category], then decision 2654 branches to "no" branch 2660 bypassing step 2658. At step 2662, global category present total for the category (GCP_Total[category]) is cleared (set to zero) and the global category sent total for the category (GCS Total [category]) is also cleared (set to zero). Returning to decision 2650, if GCL_Total[category] is not greater than the reset value GCPreset[category] then decision 2650 branches to "no" branch 2664 bypassing steps 2654 through 2662. A determination is made as to whether there are more categories to process (decision 2666). If there are more categories to process, then decision 2666 branches to "yes" branch 2668 looping back to select the next category and process its performance values as described above. This looping continues until there are no more categories to process, at which point decision 2666 branches to "no" branch 2670 whereupon a predefined process is performed to provide a performance response (predefined process 2672, see FIG. 27 and corresponding text for details regarding the performance server providing a performance response to the nodes).

Figure 27:
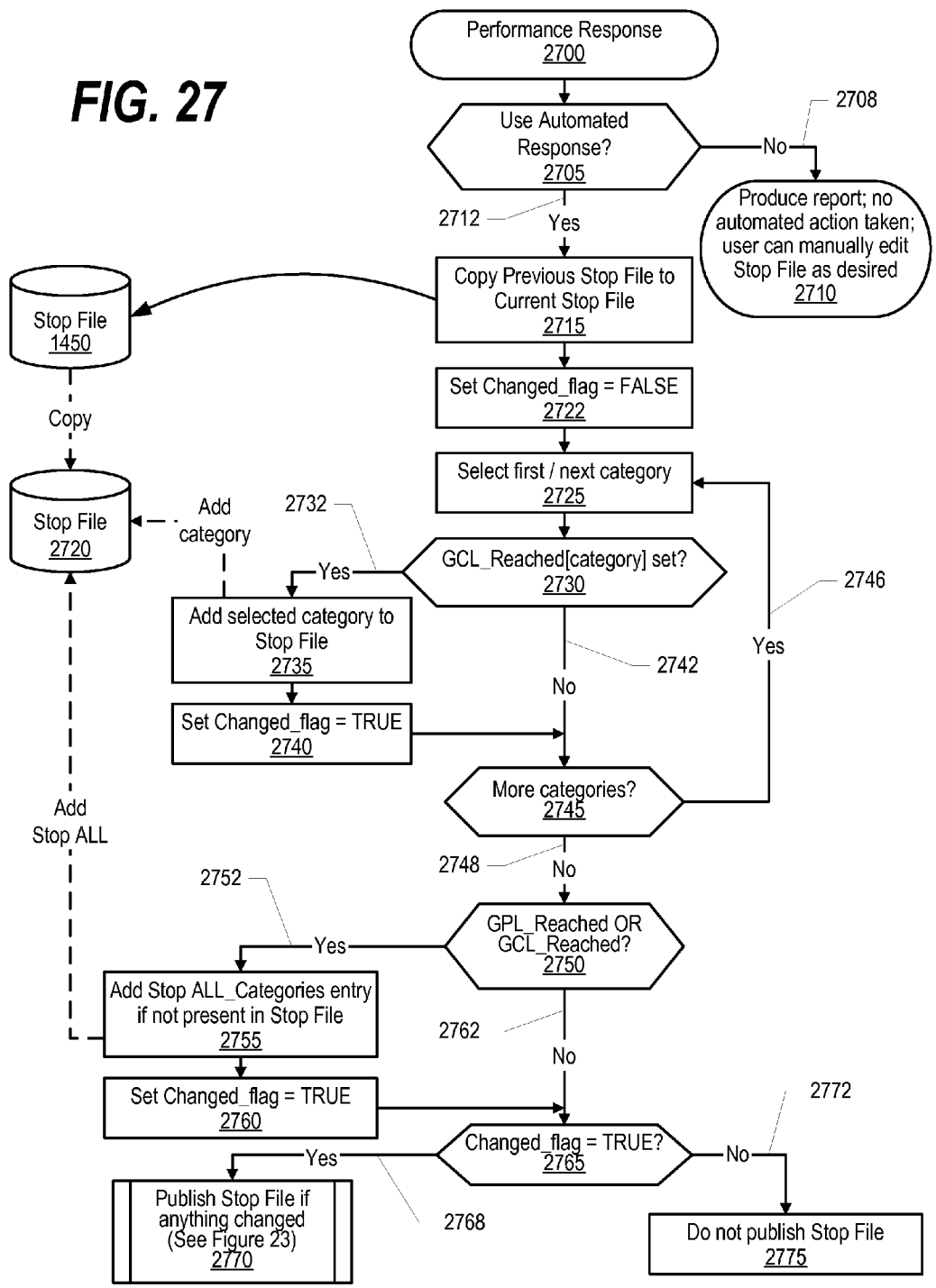
FIG. 27 is a flowchart showing steps taken by the performance server to provide a performance response to the nodes.

FIG. 27 is a flowchart showing steps taken by the performance server to provide a performance response to the nodes. Processing commences at 2700 whereupon a determination is made as to whether automated responses have been requested (decision 2705). If automated responses have not been requested, then decision 2705 branches to "no" branch 2708 whereupon a report is produced at 2710 but no automated action is taken. On the other hand, if automated responses have been requested, then decision 2705 branches to "yes" branch 2712 whereupon, at step 2715 the previous stop file 1450 is copied to create a new (current) stop file 2720. At step 2722, the changed_flag is set to FALSE indicating that, at this point, a new version of the stop file should not be published. This flag can be updated by subsequent steps and, at the end, if the flag is TRUE then the new version of the stop file is published. At step 2725, the first category is selected. A determination is made as to whether the global category limit has been reached for the selected category (GCL_Reached[category] set) (decision 2730). If GCL_Reached[category] is set, then decision 2730 branches to "yes" branch 2732 whereupon, at step 2735 the selected category is added to the new version of stop file 2720 to indicate that coverage of the selected category is saturated and, at step 2740, the changed_flag is set to TRUE indicating that the stop file has been changed. Returning to decision 2730, if GCL_Reached[category] is not set, then decision 2730 branches to "no" branch 2742 bypassing steps 2735 and 2740. A determination is made as to whether there are more categories to process (decision 2745). If there are more categories to process, decision 2745 branches to "yes" branch 2746 which loops back to select and process the next category. This looping continues until there are no more categories to process, at which point decision 2745 branches to "no" branch 2748. A determination is made as to whether either the global packet limit has been reached (GPL_Reached set) or if global category limit has been reached (GCL_Reached set) (decision 2750). If either of these global limits has been set, then decision 2750 branches to "yes" branch 2752 whereupon, at step 2755, an entry is added to the new version of the stop file 2720 indicating that process of all categories has been saturated and should be stopped (STOP ALL_Categories) and, at step 2760, the changed flag is set (changed_flag=TRUE) indicating that the stop file has been changed. On the other hand, if neither GPL_Reached or GCL_Reached, then decision 2750 branches to "no" branch 2762 bypassing steps 2755 and 2760. A determination is made as to whether the changed flag has been set (changed_flag=TRUE) indicating that the stop file has been updated (decision 2765). If the changed flag has been set, then decision 2765 branches to "yes" branch 2768 whereupon, at predefined process 2770, stop file 2720 is published so that the nodes will receive the new (updated) copy of the stop file (see FIG. 23 and corresponding text for details regarding publication of the stop file). On the other hand, if the changed flag is not set, then decision 2765 branches to "no" branch 2772 whereupon, at step 2775, the performance server does not publish a new copy of the stop file because it has not been updated.

Figure 28:
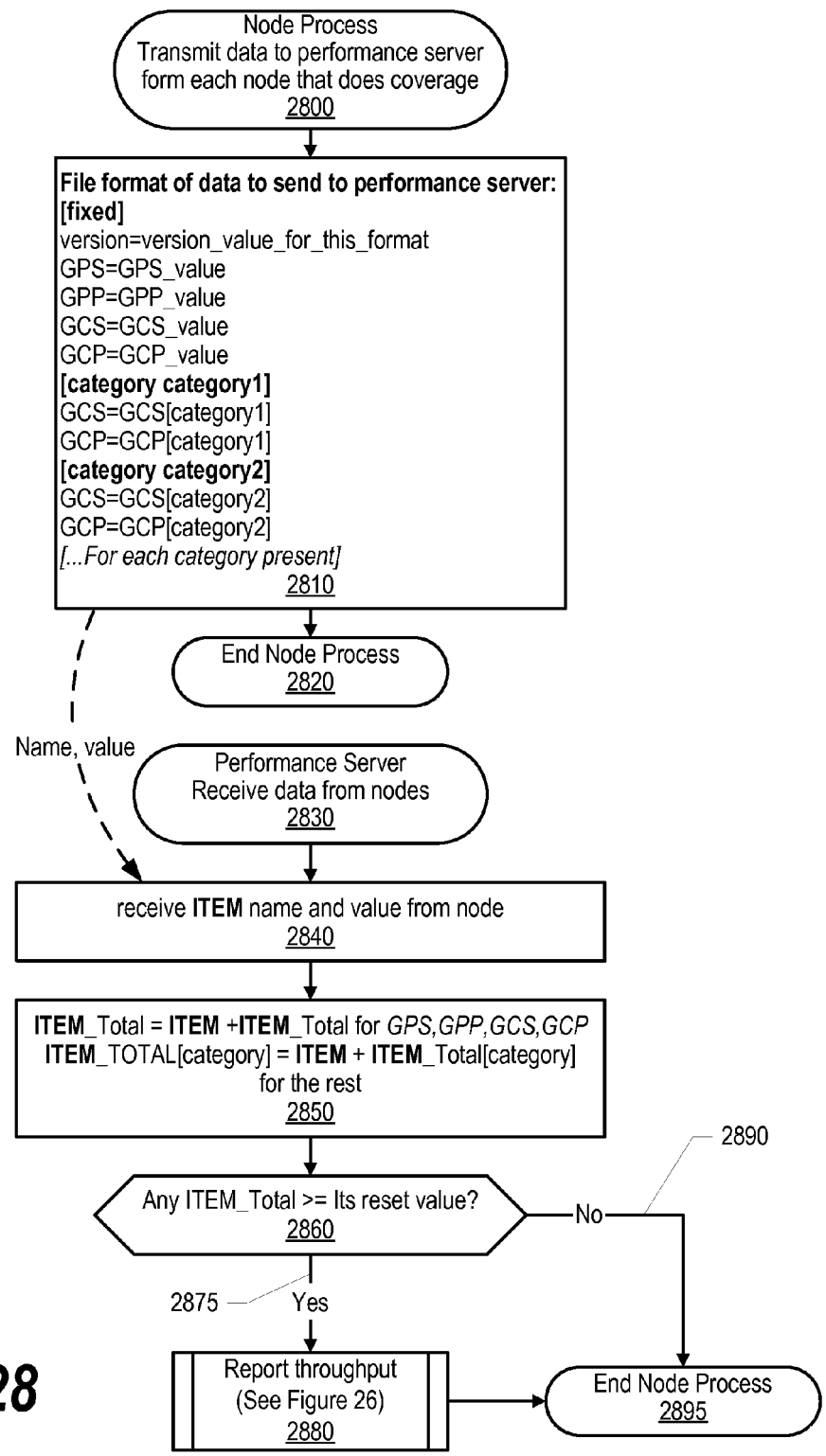
FIG. 28 is a flowchart showing steps performed by the nodes to transmit data to the performance server.

FIG. 28 is a flowchart showing steps performed by the nodes to transmit data to the performance server. Processing performed by the nodes is shown commencing at 2800 whereupon, at step 2810, the various performance values generated while the node was processing the categories and packet are sent to the performance server. These performance values include the Global Packets Sent (GPS) value, the Global Packets Present (GPP) value, the Global Categories Sent (GCS) value, the Global Categories Present (GCP) value, and, for each category present, the Global Categories Sent and Global Categories Present for the respective categories. Node processing thereafter ends at 2820. Performance server processing is shown commencing at 2830 whereupon the performance server receives performance data from the nodes. At step 2840, the performance server receives the various ITEM names (e.g., GPS, GPP, GCS, GCP, GCS[category] and GCP[category] along with the value associated with the ITEM names. At step 2850, the ITEM totals are calculated (e.g., GPS_Total, GPP_Total, GCS_Total, GCP_Total, and, for each category, GCS_Total[category] and GCP[category]). A determination is made as to whether is made as to whether any given ITEM_Total is greater than or equal to its reset value (decision 2860, e.g., whether GPS_Total is greater than its reset value, whether GPP_Total is greater than its reset value, etc.). If any ITEM_Total is greater than its reset value, then decision 2860 branches to "yes" branch 2875 whereupon, at predefined process 2880, the throughput is reported (see FIG. 26 and corresponding text for details regarding the performance server reporting throughput). On the other hand, if no ITEM_Total is greater than its reset value, then decision 2860 branches to "no" branch 2890 bypassing step 2880. Node processing for receiving the performance data thereafter ends at 2895.

One embodiment of the invention is a client application, namely, a set of instructions (program code) or other functional descriptive material in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps. Functional descriptive material is information (instructions or executable code) that imparts functionality to a machine.

Figure 29:
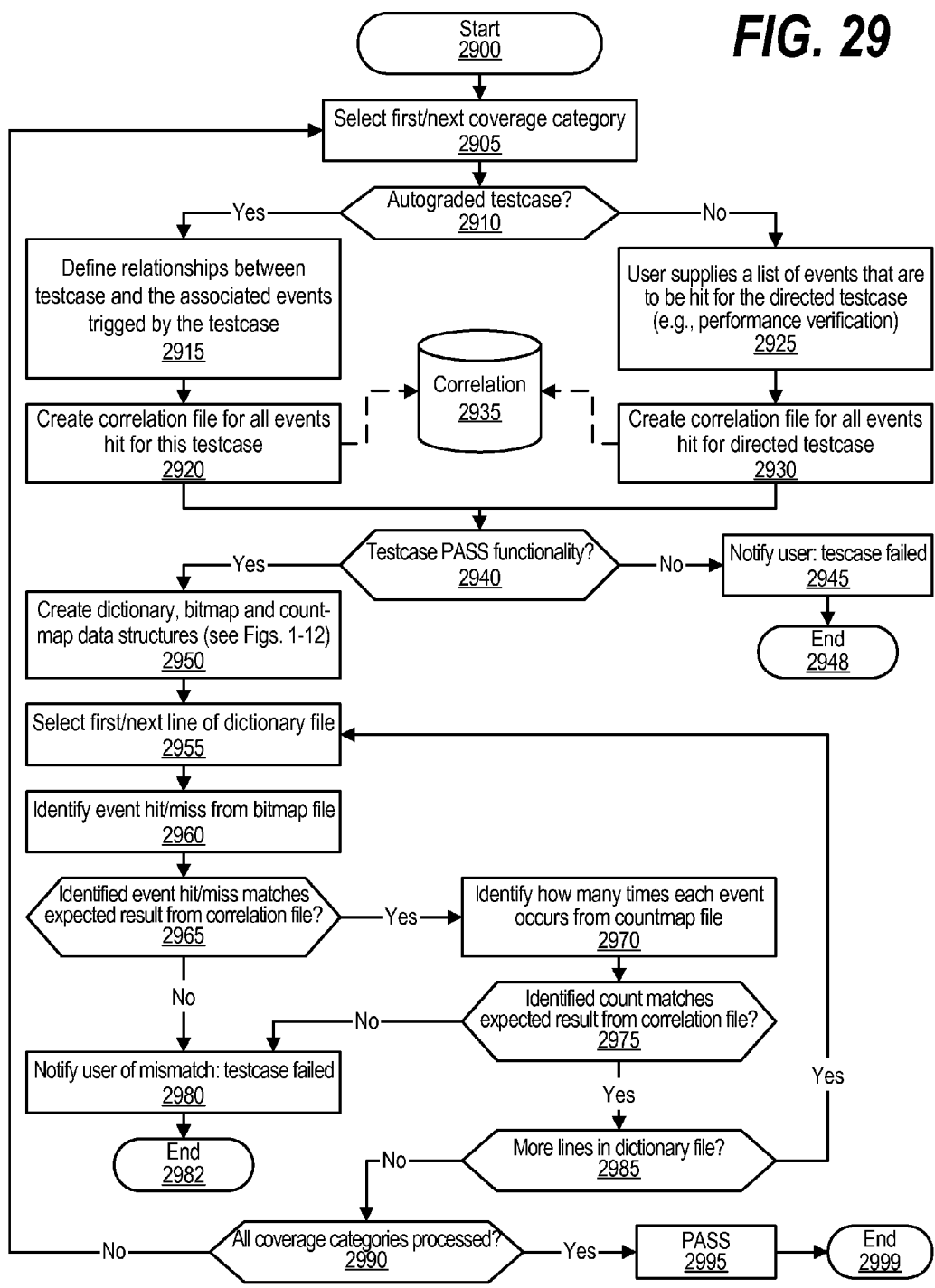
FIG. 29 is a flowchart representation of a process that replays autograded coverage regressions and performance verification with directed test cases.

FIG. 29 is a flowchart representation of a process that replays autograded coverage regressions and performance verification with directed test cases. In one embodiment, a central process accumulates results from all testcases run with the flowchart shown in FIG. 29. This central process reports overall statistics (testcase pass/fail, reason for failure, and precise mismatches, as shown below) back to the user. Processing of FIG. 29 commences at 2900 whereupon, at step 2905, the first test case coverage category is selected. A decision is made as to whether the test case being used is a part of autograded regression suite, as previously described (decision 2910). If the test case is from autograded suite, then decision 2910 branches to the "yes" branch whereupon, at step 2915, the user or a process developed by the user defines relationships between testcase and the associated events trigged by the testcase. At step 2920, correlation file 2935 is created for all test case events hit (triggered) for this test case.

An example of an autograded testcase is shown in chart 704 in FIG. 7. Using the data provided in chart 704 from FIG. 7, correlation files 3075 in FIG. 30 are created. Note that in FIG. 7, chart 704 shows that testcase one triggered events D and E, while testcase two triggered events A, B, and C. Files 3075 in FIG. 30 show correlation files that, in one embodiment, result from the autograded testcases shown in chart 704 in FIG. 30. Testcase_one 3080 is the correlation file resulting from the autograded testcase one in FIG. 7 which indicates which event names 3085 are expected to be triggered. In the example, file 3080 indicates that both events "D" and "E" are expected to be triggered. In one embodiment, correlation file 3080 is silent as to whether other events (e.g., events "A", "B", and "C") are triggered, only that it is expected that events "D" and "E" will be triggered. In an alternative embodiment, the autograding process can indicate which events are not expected to be triggered. In this alternative embodiment, using file 3080, events "A", "B", and "C" would not be expected to be triggered. A further change to file 3080 in the alternative embodiment may include an additional column (e.g., "Hit?") which would be a Boolean field that would indicate which events are expected to be triggered (e.g., a '1' or True in the Hit? field) and which events are not expected to be triggered (e.g., a '0' or False in the Hit? field). Likewise, testcase_two (file 3090) shows event names 3095 that are expected to be triggered when testcase two is processed (e.g., events "A", "B", and "C" are expected to be triggered from the example autograded testcase shown in chart 704 in FIG. 7). The alternative embodiment applies to testcase two as described above for testcase one.

Returning to decision 2910 in FIG. 29, if the test case is not coming from autograded coverage suite, for example, the test case might be used for performance verification purposes, then decision 2910 branches to the "no" branch whereupon, at step 2925, the user (e.g., a performance verification engineer, etc.) supplies a list of test case events that are to be hit (triggered) for the directed test case and, at step 2930, correlation file 2935 is created for all of the events that are to be hit (triggered) for the directed test case. Sample correlation files 3000, discussed below with reference to FIG. 30, show examples of correlation files that could be assembled during performance verification. In addition to indicating which events are expected to be triggered for different testcases, sample correlation files 3000 also indicate the number of times each of the events is expected to be triggered. Returning to FIG. 29, after the correlation file is created and after the test case is executed (as previously described), a decision is made as to whether the executed test case passed functionality (decision 2940). If the test case did not pass functionality, then decision 2940 branches to the "no" branch whereupon, at step 2945, the user is notified that the test case failed and processing ends at 2948.

On the other hand, if the test case executed successfully and passed functionality, then decision 2940 branches to the "yes" branch whereupon, at step 2950, processing creates resultant data structures that include a test case dictionary, bitmap, and countmap. See previous sections, e.g., FIGS. 1-12, for details regarding creation of the test case dictionary, the bitmap, and the countmap. The bitmap indicates which test events were hit (actual test event triggers) when the test case was executed, while the countmap provides a numeric count of how many times each triggered event was triggered (actual trigger counts). For example, the bitmap might indicate that both events "A" and "B" were both triggered, while the countmap would indicate how many times each of the events were triggered (e.g., event "A" might be triggered eight times while event "B" might have only been triggered a single time, etc.).

At step 2955, the first line of the dictionary file is selected. This line from the dictionary and bitmap would indicate actual test event triggers that occurred when the test case was executed. At step 2960, the process identifies actual test event triggers that occurred as indicated in the selected line of the dictionary and bitmap data structures. For example, the first line may indicate that both test events "A" and "B" were triggered. A decision is made as to whether the actual test event triggers identified in the selected line of the dictionary and bitmap match the expected test event triggers recorded in the correlation file (decision 2965). In one embodiment, both "hits" and "misses" are identified in the comparison. Using the example from above, the actual test event triggers may have indicated that both events "A" and "B" occurred, while the expected test event triggers recorded in the correlation file may indicate that events "A" and "C" were expected. Here, there would be two mismatches. First, event "B" occurred when it was not expected to occur, and, second, event "C" was expected to occur but it did not occur. If there are any mismatches, then decision 2965 branches to the "no" branch whereupon, at step 2980 the user is notified that the test case failed because one or more expected test case event triggers did not match one or more actual test case event triggers. In one embodiment, processing ends at 2982, while in another embodiment, all of the lines of the dictionary and bitmap are processed and the user is informed of all mismatches.

If there are no mismatches, then decision 2965 branches to the "yes" branch whereupon, at step 2970, processing identifies the number of time each triggered event was triggered (actual trigger count) from the countmap data structure. A decision is made as to whether the actual trigger counts match the expected trigger counts recorded in the correlation file (decision 2975). For example, event "A" may have actually occurred (actual trigger count) 8 times, however the correlation file indicates that the expected trigger count for event "A" was a different number of times (e.g., 7 times, 9 times, etc.). If the actual trigger count does not match the expected trigger count for one or more events, then decision 2975 branches to the "no" branch whereupon, at step 2980, the user is notified that the test case failed along with the data (e.g., actual trigger count versus expected trigger count for one or more events). In one embodiment, processing then ends at 2982 while, in another embodiment as described above, all entries in the dictionary, bitmap and countmap are processed before terminating in order to inform the user of all mismatches (both event mismatches and trigger count mismatches). On the other hand, if the actual trigger count matches the expected trigger count, then decision 2975 branches to the "yes" branch.

A decision is made as to whether there are more lines in the dictionary and bitmap data structures to process (decision 2985). If there are more lines to process, then decision 2985 branches to the "yes" branch which loops back to select and process the next line from the dictionary and bitmap data structures. This looping continues until there are no more lines in the dictionary and bitmap data structures to process, at which point decision 2985 branches to the "no" branch.

A decision is made as to whether all coverage categories have been processed (decision 2990). If there are more coverage categories to process, then decision 2990 branches to the "no" branch which loops back to select and process the next coverage category as described above. This looping continues until all of the coverage categories have been processed, at which point decision 2990 branches to the "yes" branch and, at step 2995, the user is notified that all of the coverage categories were processed successfully. Processing thereafter ends at 2999.

FIG. 30 is a block diagram of sample correlation files used in conjunction with the processing shown in FIG. 29. FIG. 30 shows two sample correlation files—testcase_one 3010 and testcase_two 3050. Depending on the test case that is executed, different events are triggered and, the events that are triggered, can be triggered a different number of times. Each of the sample correlation files includes event names (3020 and 3060, respectively) along with a field that indicate the number of times the event is expected to be triggered, or hit (3030 and 3070, respectively). Looking at the sample correlation files, it is apparent, for example, that when testcase_one is executed the first event (Core1_A) is expected to be triggered 10 times, while when testcase_two is executed the same first event (Core1_A) is not expected to be triggered at all. One of the events (Core1.C) is expected to be triggered for both testcase_one and testcase_two, however each test case is expected to trigger this event a different number of times. Testcase_one is expected to trigger event Core1.C seven times, while testcase_two is only expected to trigger the same event three times. In one embodiment, a mismatch occurs when (a) an event is triggered that was not expected to be triggered, (b) an event is not triggered that was expected to be triggered, or (c) an event is triggered a different number of times than it was expected to be triggered. When any of these mismatch conditions arise, the user is notified so that appropriate action can be taken regarding the design or the test case.

Figure 31:
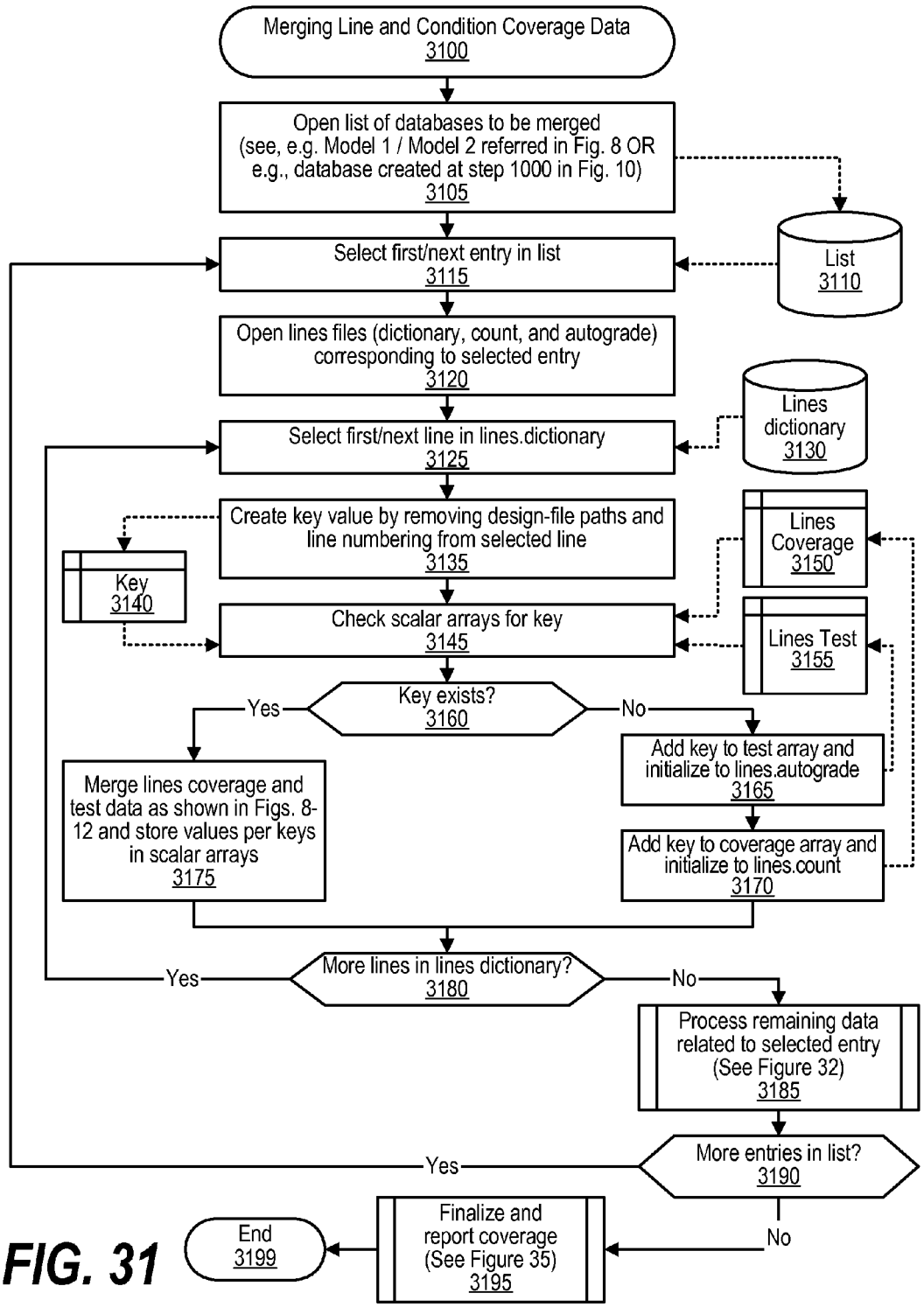
FIG. 31 is a flowchart representation of a process that merges line and coverage data.

FIG. 31 is a flowchart representation of a process that merges line and coverage data. Processing commences at 3100 whereupon, at step 3105, a list of databases to be merged is opened from list data store 3110. The databases contain resultant data structures that resulted from the execution of numerous test cases performed at one or more different computer systems. For an example, see Model 1 and Model 2 shown in FIG. 8 and described above in the description of FIG. 8 as well as the database created at step 1000 of FIG. 10 and described above in the description of FIG. 10. At step 3115, the first entry in list 3110 is selected. At step 3120, the various lines files (dictionary, count, and autograde files) corresponding to the selected entry are opened. As will be appreciated by those skilled in the art, the "line" coverage processed in FIG. 31 is also referred to as "statement" coverage. As used herein, "line" coverage includes "statement" coverage. At step 3125, the first line in the lines dictionary (data store 3130) is selected. A base key value corresponding to the selected line is generated at step 3135 by removing design-file path data as well as by removing any line numbering that may have been included in the lines dictionary file. The base key value is stored in memory area 3140. At step 3145, scalar arrays are searched for the generated base key value. In one embodiment, the scalar arrays include a scalar array used to store lines coverage data (lines coverage scalar array 3150) as well as a scalar array used to store lines test data (lines test scalar array 3155). A decision is made as to whether the generated base key value already exists in the scalar arrays (decision 3160). If the generated base key value does not already exist in the scalar arrays, then decision 3160 branches to the "no" branch whereupon, at step 3165, an entry is added to the lines test scalar array 3155 and initialized to the lines.autograde value (see, e.g., FIG. 11 and corresponding text for example autograde values). Also on the "no" branch, at step 3170, an entry is added to the lines coverage scalar array 3150 and initialized to the lines.count value (see, e.g., FIG. 9 and corresponding text for example count values shown as "merged countmap"). Returning to decision 3160, if the generated base key already exists, then decision 3160 branches to the "yes" branch whereupon, at step 3175, the value, or counter, corresponding to the base key is incremented. In one embodiment, the incrementing is performed by merging the lines coverage and lines test data as shown and described in FIGS. 8-12 with the resulting (merged) values stored as values corresponding to the base key in the respective scalar arrays (lines coverage scalar array 3150 and lines test scalar array 3155). A decision is made as to whether there are more lines to process in the lines dictionary (data store 3130) file (decision 3180). If there are more lines to process in the lines dictionary, then decision 3180 branches to the "yes" branch which loops back to select and process the next line in lines.dictionary as described above. This looping continues until all lines in the lines.dictionary file have been processed, at which point decision 3180 branches to the "no" branch whereupon, at predefined process 3185, remaining data related to the selected entry from list 3110 are processed (see FIG. 32 and corresponding text for processing details). A decision is made as to whether there are additional entries in the list (data store 3110) to process (decision 3190). If there are additional entries in the list to process, then decision 3190 branches to the "yes" branch which loops back to select and process the next entry from list 3110 as described above. This looping continues until there are no further entries in the list to process, at which point decision 3190 branches to the "no" branch whereupon, at predefined process 3195, the merge coverage databases are finalized and coverage is reported (see FIG. 35 and corresponding text for processing details). Processing thereafter ends at 3199.

Figure 32:
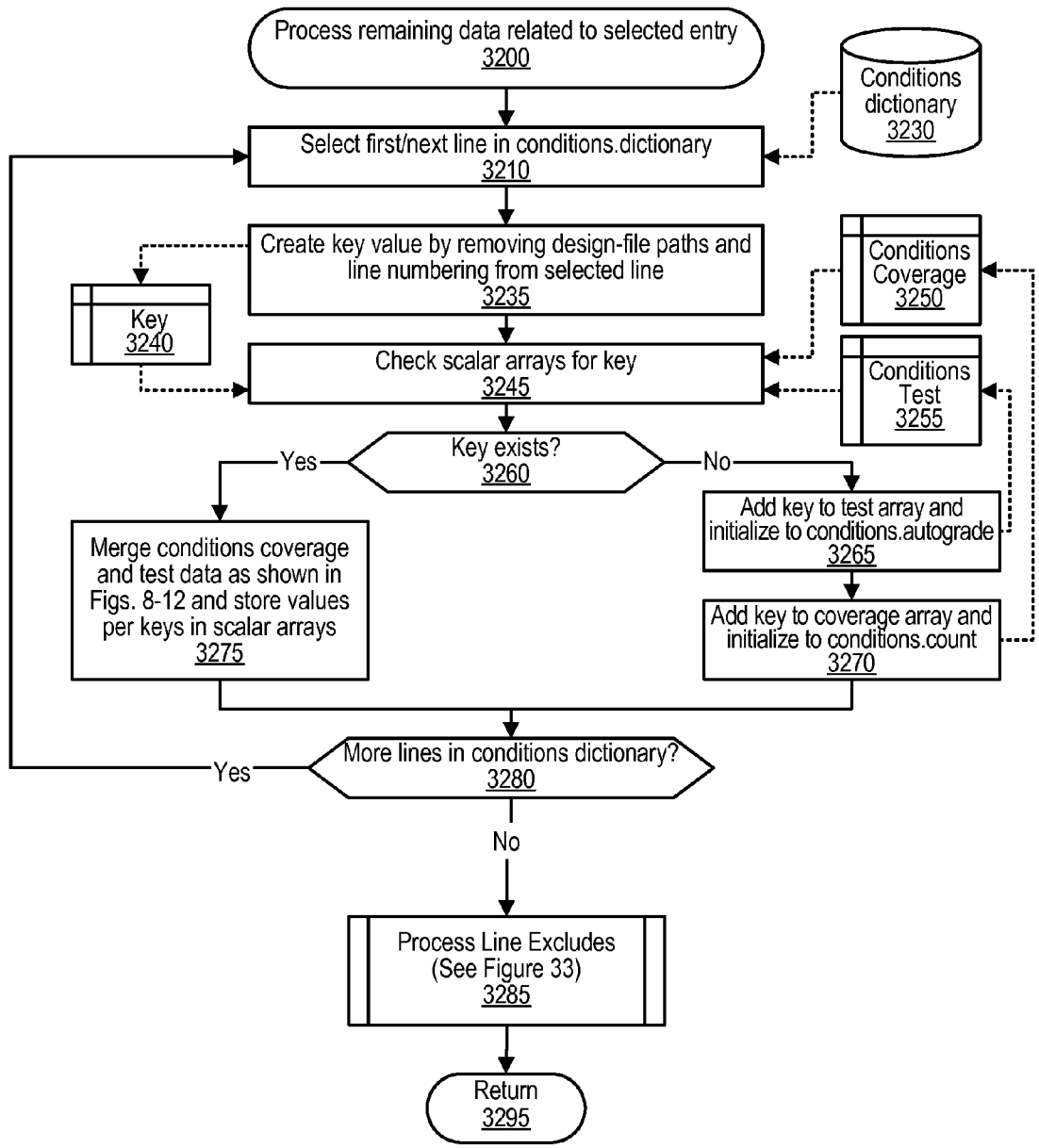
FIG. 32 is a flowchart representation of steps taken to process various data items related to a selected entry from a dictionary file.

FIG. 32 is a flowchart representation of steps taken to process various data items related to a selected entry from a dictionary file. Processing commences at 3200 with the processing shown in FIG. 32 being a continuation of the processing shown in FIG. 31. In FIG. 31, the lines coverage data was processed, while in FIG. 32, the conditions coverage data is processed. As will be appreciated by those skilled in the art, the "conditions" coverage processed in FIG. 32 is also referred to as "expression" coverage. As used herein, "condition" coverage includes "expression" coverage. At step 3210, the first line in the conditions dictionary (data store 3230) is selected. A base key value corresponding to the selected line is generated at step 3235 by removing design-file path data as well as by removing any line numbering that may have been included in the conditions dictionary file. The base key value is stored in memory area 3240. At step 3245, scalar arrays are searched for the generated base key value. In one embodiment, the scalar arrays include a scalar array used to store conditions coverage data (conditions coverage scalar array 3250) as well as a scalar array used to store conditions test data (conditions test scalar array 3255). A decision is made as to whether the generated base key value already exists in the scalar arrays (decision 3260). If the generated base key value does not already exist in the scalar arrays, then decision 3260 branches to the "no" branch whereupon, at step 3265, an entry is added to the conditions test scalar array 3255 and initialized to the conditions.autograde value (see, e.g., FIG. 11 and corresponding text for example autograde values). Also on the "no" branch, at step 3270, an entry is added to the conditions coverage scalar array 3250 and initialized to the conditions.count value (see, e.g., FIG. 9 and corresponding text for example count values shown as "merged countmap"). Returning to decision 3260, if the generated base key already exists, then decision 3260 branches to the "yes" branch whereupon, at step 3275, the value, or counter, corresponding to the base key is incremented. In one embodiment, the incrementing is performed by merging the conditions coverage and conditions test data as shown and described in FIGS. 8-12 with the resulting (merged) values stored as values corresponding to the base key in the respective scalar arrays (conditions coverage scalar array 3250 and conditions test scalar array 3255). A decision is made as to whether there are more lines to process in the conditions dictionary (data store 3230) file (decision 3280). If there are more lines to process in the conditions dictionary, then decision 3280 branches to the "yes" branch which loops back to select and process the next line in conditions.dictionary as described above. This looping continues until all lines in the conditions.dictionary file have been processed, at which point decision 3280 branches to the "no" branch whereupon, at predefined process 3285, line excludes are processed (see FIG. 33 and corresponding text for processing details). Processing then returns to the calling routine (see FIG. 31) at 3295.

Figure 33:
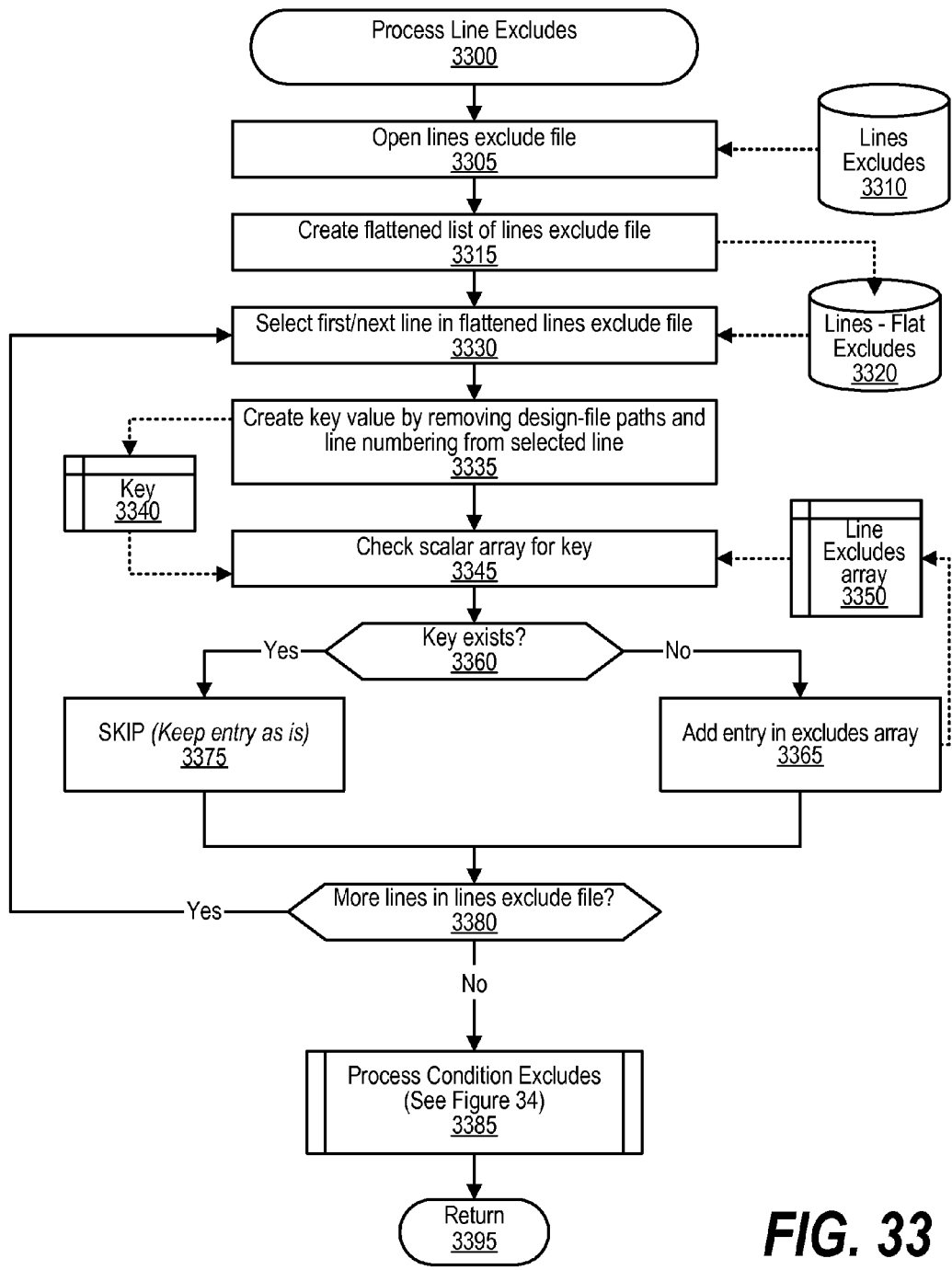
FIG. 33 is a flowchart representation of steps taken to process line excludes that detail data to be excluded from coverage reporting.

FIG. 33 is a flowchart representation of steps taken to process line excludes that detail data to be excluded from coverage reporting. Processing commences at 3300 whereupon, at step 3305, a lines excludes file (data store 3310) is opened. At step 3315, the lines excludes file is flattened to create flat lines excludes data store 3320. At step 3330, the first line from the flattened lines exclude file is selected. At step 3335, an exclude key value is generated by removing extraneous data such as design-file paths and line numbering from the selected line. The generated exclude key value is stored in memory area 3340. At step 3345, an exclude scalar array (line exclude scalar array 3350) is searched for the generated exclude key value. A decision is made as to whether the generated exclude key value is already a key within the scalar array (decision 3360). If the generated exclude key value is not yet a key (the search failed to find the generated exclude key value), then decision 3360 branches to the "no"

branch whereupon, at step 3365, an entry is added to the scalar array (line excludes scalar array 3350) with the entry including the excluded key value as the key. On the other hand, if the generated exclude key value is already a key in the scalar array (the search found the generated exclude key value), then decision 3360 branches to the "yes" branch whereupon, at step 3375, processing skips the selected line and does not change the scalar array (line excludes scalar array 3350). A decision is made as to whether there are more lines in the exclude file (data store 3310) to process (decision 3380). If there are more lines to process, then decision 3380 branches to the "yes" branch which loops back to select the next line in the flattened lines exclude file and the selected line is processed as described above. This looping continues until all of the lines in the lines exclude file have been processed, at which point decision 3380 branches to the "no" branch whereupon, at predefined process 3385, the condition excludes are processed (see FIG. 34 and corresponding text for processing details). Processing then returns to the calling routine (see FIG. 32) at step 3395.

Figure 34:
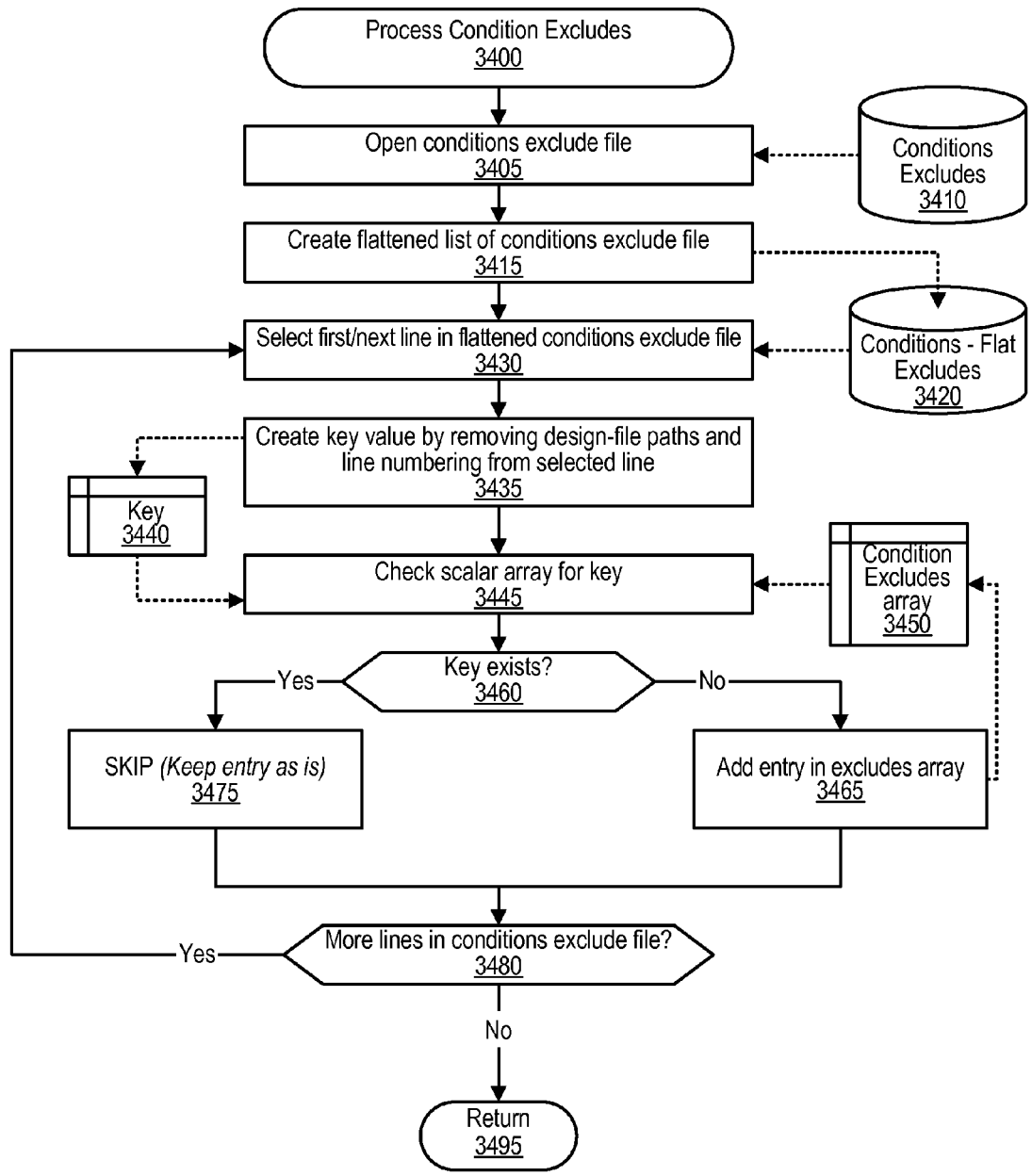
FIG. 34 is a flowchart representation of a steps taken to process condition excludes that detail data to be excluded from reported coverages.

FIG. 34 is a flowchart representation of a steps taken to process condition excludes that detail data to be excluded from reported coverages. Processing commences at 3400 with the processing shown in FIG. 34 being a continuation of the processing shown in FIG. 33. In FIG. 33, the lines excludes data was processed, while in FIG. 34, the conditions excludes data is processed. At step 3405, a conditions excludes file (data store 3410) is opened. At step 3415, the conditions excludes file is flattened to create flat conditions excludes data store 3420. At step 3430, the first line from the flattened conditions exclude file is selected. At step 3435, an exclude key value is generated by removing extraneous data such as design-file paths and line numbering from the selected line. The generated exclude key value is stored in memory area 3440. At step 3445, an exclude scalar array (condition exclude scalar array 3450) is searched for the generated exclude key value. A decision is made as to whether the generated exclude key value is already a key within the scalar array (decision 3460). If the generated exclude key value is not yet a key (the search failed to find the generated exclude key value), then decision 3460 branches to the "no" branch whereupon, at step 3465, an entry is added to the scalar array (condition excludes scalar array 3450) with the entry including the excluded key value as the key. On the other hand, if the generated exclude key value is already a key in the scalar array (the search found the generated exclude key value), then decision 3460 branches to the "yes" branch whereupon, at step 3475, processing skips the selected line and does not change the scalar array (condition excludes scalar array 3450). A decision is made as to whether there are more lines in the exclude file (data store 3410) to process (decision 3480). If there are more lines to process, then decision 3480 branches to the "yes" branch which loops back to select the next line in the flattened conditions exclude file and the selected line is processed as described above. This looping continues until all of the lines in the conditions exclude file have been processed, at which point decision 3480 branches to the "no" branch whereupon processing returns to the calling routine (see FIG. 33) at step 3495.

Figure 35:
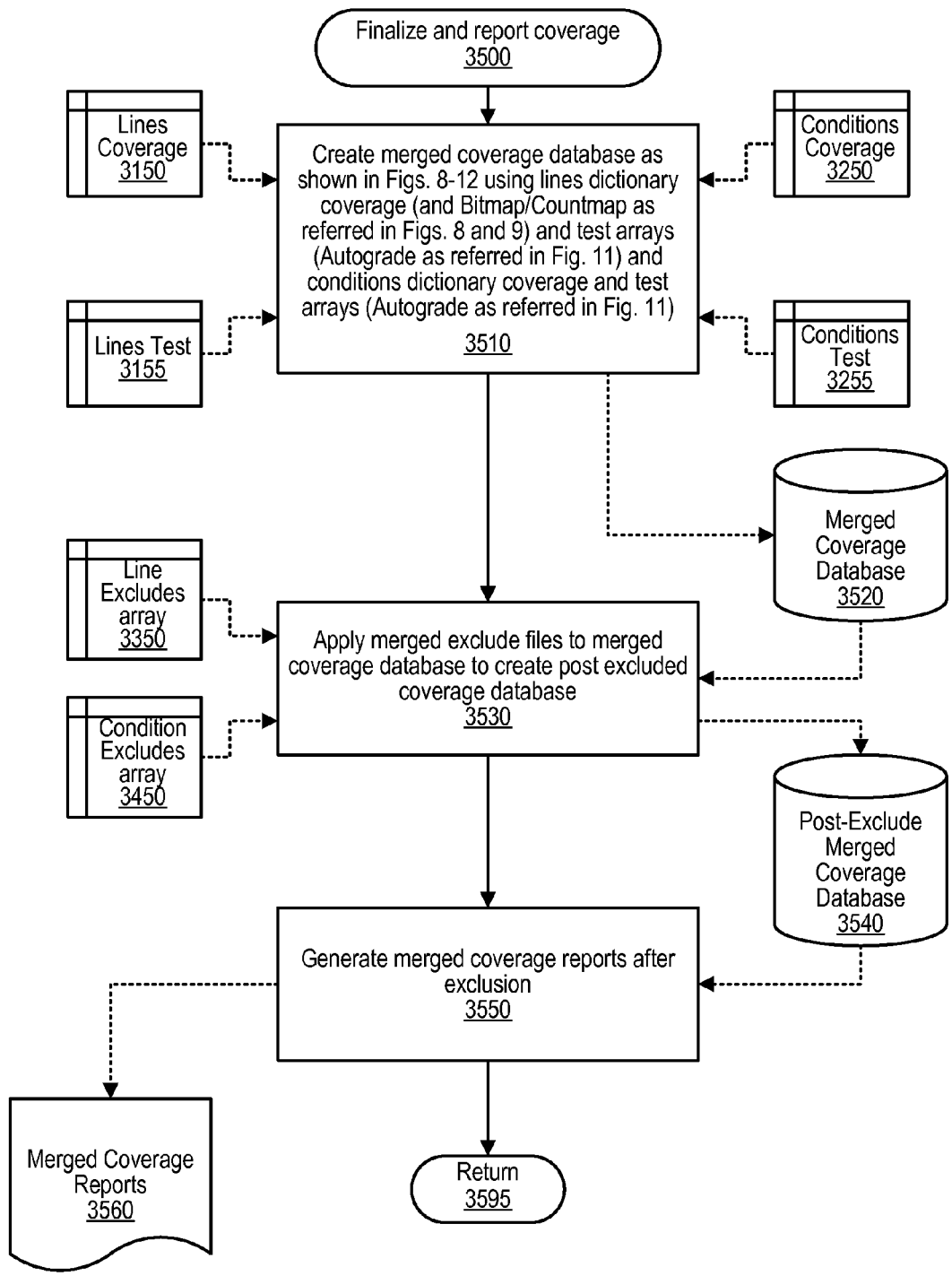
FIG. 35 is a flowchart representation of steps taken to finalize the merged coverage database and apply excludes to create a post-exclude merged coverage database.

FIG. 35 is a flowchart representation of steps taken to finalize the merged coverage database and apply excludes to create a post-exclude merged coverage database. Processing commences at 3500 whereupon, at step 3510, a merged coverage database (data store 3520) is created. In one embodiment, the merged coverage database is created using the process shown in FIGS. 8-12 and as described in corresponding text. This process uses lines dictionary coverage and bitmap/countmap data as referred to in FIGS. 8 and 9 as well as test arrays (autograde data as referred to in FIG. 11) as well as conditions dictionary coverage and test arrays (autograde data as referred to in FIG. 11). At step 3510, the merged coverage database is created by combining the data contained in the various scalar arrays created and updated by the processes shown in FIGS. 31 and 32 (lines coverage scalar array 3150, lines test scalar array 3155, conditions coverage scalar array 3250, and conditions test scalar array 3255). At step 3530, the process applies the exclude key values to merged coverage database 3520 to create a post-exclude merged coverage database (data store 3540). The exclude key values stored in exclude scalar arrays (line excludes scalar array 3350 and condition excludes scalar array 3450) are compared with key values in merged coverage database 3520. The exclude scalar arrays were created by the processes shown in FIGS. 33 and 34. Matching (excluded) values are not included (excluded) from post-exclude merged coverage database 3540. At step 3550, merged coverage reports 3560 are generated from the post-exclude merged coverage database (data store 3540). Processing then returns to the calling routine (see FIG. 31) at 3595.

Although FIGS. 31-35 describe the use of scalar arrays to store and manage line and condition coverage data, these techniques can be extended to other coverage types that use design file paths and/or line numbers. For example, the techniques described in conjunction with FIGS. 31-35 can be utilized when dealing with branch coverage, state machine coverage, and the like. Accordingly, the claims set forth below are not limited to line and condition coverage data and also include these other coverage types.

Accordingly, a computer-implemented method, computer program product, and data processing system for merging test pattern coverage results are disclosed. A first test result vector is obtained, the first test vector corresponding to a first set of test patterns applied to a first design under test, wherein the first test result vector indicates coverage of one or more events triggered by the first set of test patterns. Similarly, a second test result vector is obtained, the second test result vector corresponding to a second set of test patterns applied to a second design under test, wherein the second test result vector indicates coverage of one or more events triggered by the second set of test patterns and wherein the one or more events triggered by the second set of test patterns includes one or more of the one or more events triggered by the first set of test patterns. Coverage data are merged together from at least the first test result vector and the second test result vector to obtain a merged event coverage vector, wherein the merged event coverage vector has a length that is less than the sum of the lengths of the first test result vector and the second test result vector, wherein the merged event coverage vector indicates coverage of events triggered by at least the first set of test patterns and the second set of test patterns, and wherein the merged event coverage vector contains a plurality of entries and each of the plurality of entries is a value representing whether a corresponding event was covered.

Further, a computer-implemented method, computer program product, and information handling system for controlling test packet results that are sent to a coordinating computer system, such as the backend server, that is managing the testing. A node computer system runs a test case that results in one or more test result packets. One or more control data structures are received, via a computer network, from one or more coordinating computer systems. One example of a control data structure is Stop File 1450 which is a category listing of the test categories that are not being requested by the coordinating computer systems which include the backend server and the performance server. Another example of a control data structure is merged bitmap 1550 that is maintained by the backend server. When backend server 112 receives test result packets from nodes, it generates merged bitmap 1550. Periodically, the backend server publishes its copy of the merged bitmap to a shared data area 1425 where it is accessible by the node computer systems. The resulting test result packets are compared to the received data structures, such as the Stop File and the merged bitmap. The comparison reveals whether one or more of the test result packets include results requested by the coordinating computer systems. In the case of the Stop File, the comparison compares the category of the test result packet with the category list (the Stop File) of those categories for which test data is not being requested. In the case of the merged bitmap, the comparison compares test coverage previously received by the backend server from one of the nodes with the test result packet to identify if the test result packet identified a new event that had not previously been discovered by one of the other nodes. One or more of the test result packets are selected in response to the comparison revealing that the selected test result packets include results requested by the coordinating computer systems and the selected results are sent to one of the coordinating computer systems, such as the backend server, with performance data being sent another of the coordinating computer systems, such as the performance server. Unselected test result packets are discarded by the node and not transmitted to one of the coordinating computer systems.

Still further, an approach is provided to efficiently replay results from either autograded coverage regressions or other results, such as from performance verifications using directed test cases. This approach receives a correlation data structure from a memory, the correlation data structure indicating a number of expected test event triggers that correspond to a test case with the test case including a number of test events. The test case is executed using a computer processor. The resulting of the executed test case are one or more resultant data structures that are stored in the memory. The resultant data structures indicate one or more actual test event triggers that occurred during the execution. The expected test event triggers are compared to the actual test event triggers and a trigger mismatch is provided to a user if the expected test event triggers do not match the actual test event triggers. In an enhanced approach, expected and actual trigger counts are computed and compared in order to determine whether the event triggers that occur happen an expected number of times. If the counts do not match, a trigger count mismatch occurs and the user is informed accordingly.

While particular embodiments of the present invention have been shown and described, it will be obvious to those skilled in the art that, based upon the teachings herein, changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an;" the same holds true for the use in the claims of definite articles.

What is claimed is:

1. A computer-implemented method comprising:
    receiving a correlation data structure from a memory, the correlation data structure indicating a plurality of expected test event triggers corresponding to a test case that includes a plurality of test events;
    executing the test case with a computer processor, the executing resulting in a plurality of resultant data structures stored in the memory, wherein the resultant data structures indicate one or more actual test event triggers occurred during the execution;
    generating a base key value corresponding to each of the resultant data structures;
    searching a scalar array for the base key values of the resultant data structures;
    in response to the searching finding a first set of one or more selected base key values:
        incrementing a counter corresponding to each entry of the scalar array corresponding to each of the first set of base key values; and
    in response to the searching failing to find a second set of one or more base key values:
        adding the second set of base key values to the scalar array; and
        initializing a counter corresponding to each of the second set of base key values in the scalar array.

2. The method of claim 1 wherein the generating further comprises:
    removing a design-file path from one or more of the resultant data structures; and
    removing a line number from one or more of the resultant data structures.

3. The method of claim 1 wherein the resultant data structures include a plurality of conditions coverage results.

4. The method of claim 1 wherein the resultant data structures include a plurality of lines coverage results.

5. The method of claim 1 further comprising:
    retrieving a plurality of exclude descriptors;
    generating an exclude key value corresponding to each of the exclude descriptors, wherein the generating of the exclude key values of the exclude descriptors includes removing a design-file path from one or more of the exclude descriptors and further includes removing a line number from one or more of the exclude descriptors;
    searching an exclude scalar array for the exclude key values; and
    in response to the searching failing to find a group of one or more exclude key values:
        adding the group of exclude key values to the exclude scalar array to form an exclude scalar array of unique exclude key entries.

6. The method of claim 5 further comprising:
    retrieving a plurality of scalar arrays, including the scalar array, corresponding to a plurality of executed test cases; and
    creating a merged coverage database by merging the plurality of scalar arrays.

7. The method of claim 6 further comprising:
    comparing the exclude key values from the exclude scalar array to the base key values included in the merged coverage database, the comparing resulting in a set of matching base key values; and forming a post-exclude merged coverage database by excluding each of the matching base key values from the merged coverage database.

8. A computer program product in a computer-readable memory comprising functional descriptive material that, when executed by a computer, directs the computer to perform actions comprising:

receiving a correlation data structure from a memory, the correlation data structure indicating a plurality of expected test event triggers corresponding to a test case that includes a plurality of test events;

executing the test case with a computer processor, the executing resulting in a plurality of resultant data structures stored in the memory, wherein the resultant data structures indicate one or more actual test event triggers occurred during the execution;

generating a base key value corresponding to each of the resultant data structures;

searching a scalar array for the base key values of the resultant data structures;

in response to the searching finding a second set of one or more selected base key values:

incrementing a counter corresponding to each entry of the scalar array corresponding to each of the second set of base key values; and in response to the searching failing to find a first set of one or more base key values:

adding the first set of base key values to the scalar array; and initializing a counter corresponding to each of the first set of base key values in the scalar array.

9. The computer program product of claim 8 wherein the generating further comprises:

removing a design-file path from one or more of the resultant data structures; and removing a line number from one or more of the resultant data structures.

10. The computer program product of claim 8 wherein the resultant data structures include a plurality of conditions coverage results.

11. The computer program product of claim 8 wherein the resultant data structures include a plurality of lines coverage results.

12. The computer program product of claim 8 wherein the functional descriptive material, when executed by the computer, causes the computer to perform additional actions comprising:

retrieving a plurality of exclude descriptors;

generating an exclude key value corresponding to each of the exclude descriptors, wherein the generating of the exclude key values of the exclude descriptors includes removing a design-file path from one or more of the exclude descriptors and further includes removing a line number from one or more of the exclude descriptors;

searching an exclude scalar array for the exclude key values; and in response to the searching failing to find a group of one or more exclude key values:

adding the group of exclude key values to the exclude scalar array to form an exclude scalar array of unique exclude key entries.

13. The computer program product of claim 12 wherein the functional descriptive material, when executed by the computer, causes the computer to perform additional actions comprising:

retrieving a plurality of scalar arrays, including the scalar array, corresponding to a plurality of executed test cases; and creating a merged coverage database by merging the plurality of scalar arrays.

14. The computer program product of claim 13 wherein the functional descriptive material, when executed by the computer, causes the computer to perform additional actions comprising:

comparing the exclude key values from the exclude scalar array to the base key values included in the merged coverage database, the comparing resulting in a set of matching base key values; and forming a post-exclude merged coverage database by excluding each of the matching base key values from the merged coverage database.

15. A data processing system comprising:

one or more processors;

at least one memory associated with the one or more processors; and a set of instructions contained in the at least one memory, wherein the one or more processors executes the set of instructions to perform actions comprising:

receiving a correlation data structure from the memory, the correlation data structure indicating a plurality of expected test event triggers corresponding to a test case that includes a plurality of test events;

executing the test case with a computer processor, the executing resulting in a plurality of resultant data structures stored in the memory, wherein the resultant data structures indicate one or more actual test event triggers that occurred during the execution;

generating a base key value corresponding to each of the resultant data structures;

searching a scalar array for the base key values of the resultant data structures;

in response to the searching finding a second set of one or more selected base key values:

incrementing a counter corresponding to each entry of the scalar array corresponding to each of the second set of base key values; and in response to the searching failing to find a first set of one or more base key values:

adding the first set of base key values to the scalar array; and initializing a counter corresponding to each of the first set of base key values in the scalar array.

16. The data processing system of claim 15 wherein the generating further comprises:

removing a design-file path from one or more of the resultant data structures; and removing a line number from one or more of the resultant data structures.

17. The data processing system of claim 15 wherein the resultant data structures include a plurality of conditions coverage results and a plurality of lines coverage results.

18. The data processing system of claim 15 wherein the one or more processors executes the set of instructions to perform additional actions comprising:

retrieving a plurality of exclude descriptors;

generating an exclude key value corresponding to each of the exclude descriptors, wherein the generating of the exclude key values of the exclude descriptors includes removing a design-file path from one or more of the exclude descriptors and further includes removing a line number from one or more of the exclude descriptors;

searching an exclude scalar array for the exclude key values; and in response to the searching failing to find a group of one or more exclude key values:

adding the group of exclude key values to the exclude scalar array to form an exclude scalar array of unique exclude key entries.

19. The data processing system of claim 18 wherein the one or more processors executes the set of instructions to perform additional actions comprising:

retrieving a plurality of scalar arrays, including the scalar array, corresponding to a plurality of executed test cases; and creating a merged coverage database by merging the plurality of scalar arrays.

20. The data processing system of claim 19 wherein the one or more processors executes the set of instructions to perform additional actions comprising:

comparing the exclude key values from the exclude scalar array to the base key values included in the merged coverage database, the comparing resulting in a set of matching base key values; and forming a post-exclude merged coverage database by excluding each of the matching base key values from the merged coverage database.

\* \* \* \* \*